(12) United States Patent
Derbyshire

(10) Patent No.: US 9,570,792 B1
(45) Date of Patent: Feb. 14, 2017

(54) RF SPLITTER/COMBINER SYSTEM AND METHOD

(71) Applicant: BBTLine, LLC, Kirkland, WA (US)

(72) Inventor: Mark Thomas Derbyshire, Kirkland, WA (US)

(73) Assignee: BBTLINE, LLC, Kirkland, WA (US)

( * ) Notice: Subject to any disclaimer, the term of this patent is extended or adjusted under 35 U.S.C. 154(b) by 0 days.

(21) Appl. No.: 15/145,890

(22) Filed: May 4, 2016

(51) Int. Cl.
*H01P 5/12* (2006.01)
*H03H 2/00* (2006.01)
*H03H 7/01* (2006.01)
*H03H 7/38* (2006.01)

(52) U.S. Cl.
CPC ............ *H01P 5/12* (2013.01); *H03H 2/005* (2013.01); *H03H 7/0115* (2013.01); *H03H 7/383* (2013.01)

(58) Field of Classification Search
CPC ............... H01P 5/12; H01P 5/16; H01P 5/18; H01P 3/081
USPC .................................. 333/100, 125, 128, 136
See application file for complete search history.

(56) References Cited

U.S. PATENT DOCUMENTS

| | | | | |
|---|---|---|---|---|
| 4,901,042 A * | 2/1990 | Terakawa | ............... | H03H 7/48 333/127 |
| 6,822,531 B2 * | 11/2004 | Carlson | ............... | H01P 5/04 333/101 |
| 7,526,263 B2 * | 4/2009 | Niiranen | ............... | H01P 1/2053 455/130 |
| 8,937,517 B2 * | 1/2015 | Huang | ............... | H01P 5/16 333/126 |
| 9,019,041 B2 * | 4/2015 | Tsai | ............... | H01P 5/16 333/136 |
| 9,406,992 B2 * | 8/2016 | Goritz | ............... | H01P 5/085 |

OTHER PUBLICATIONS

S. Banu, et al., "Implementation and Performance Analysis of N-Way Wilkinson Power Divider," Consumer Electronics Times, vol. 1, Apr. 1, 2012, pp. 23-26, www.cet-journal.org.
Marki Microwave, "Wilkinson Power Divider PD-OR510", info@markimicrowave.com, Nov. 13, 2012, pp. 1-2.
(Continued)

*Primary Examiner* — Dean Takaoka
*Assistant Examiner* — Alan Wong
(74) *Attorney, Agent, or Firm* — Kevin M. Klughart; Carstens & Cahoon, LLP

(57) ABSTRACT

A system/method describing a physically compact broadband radio frequency (RF) splitter/combiner is disclosed. The system and method provide an alternative to traditional broadband Wilkinson-style RF power splitter/combiners while reducing the overall size of the power divider/combiner to a significantly smaller form factor. The system and method utilize a serpentine impedance network (SIN) that incorporates a mirrored series of positive serpentine node (PSN) traces and negative serpentine node (NSN) traces. The PSN and NSN are coupled together within each isolated and mirrored SIN section with paired coupling traces (PCTs) located between the PSN and NSN traces that serve as both power transformers for the system and as an aid to impedance matching between the RF input port (RIP) and RF output ports (ROPs). The system is electrically symmetric and provides for power splitting and/or combining functionality between the RIP and ROPs.

20 Claims, 104 Drawing Sheets

(56) References Cited

OTHER PUBLICATIONS

Marki Microwave, "Wideband Wilkinson Power Diviser PD-0126," info@markimicrowave.com, Jun. 5, 2015, pp. 1-2.
Marki Microwave, "Wilkinson Power Divider PD-0535SM", info@markimicrowave.com, Nov. 13, 2012, pp. 1-2.
Mini-Circuits, "Power Splitter/Combiner ZB2PD_63+," DC Pass, www.minicircuits.com, pp. 1-3.
Pozar, David M., "Microwave Engineering, Second Edition," 1998, pp. ix-xvi and 351-421, John Wiley & Sons, Inc.
Wilkinson, Ernest J., "An N-Way Hybrid Power Divider," IRE Transactions on Microwave Theory and Techniques, Jan. 1960, pp. 116-118.

* cited by examiner

Wilkinson 2-Way RF Splitter/Combiner
Amplitude Balance vs. Frequency

*Prior Art*

Mini-CircuitsZB2PD-63+ RF Splitter/Combiner
Performance Characteristics
Electrical Specifications at 25°C

PD-0R510

| Parameter | Frequency (MHz) | Min. | Typ. | Max. | Unit |
|---|---|---|---|---|---|
| Frequency | | 600 | | 6000 | MHz |
| Insertion Loss (above theoretical 3.0 dB) | 600-1600 | — | 0.3 | 0.5 | dB |
|  | 1600-2700 | — | 0.4 | 0.8 |  |
|  | 2700-3600 | — | 0.5 | 0.8 |  |
|  | 3600-6000 | — | 0.8 | 1.2 |  |
| Isolation | 600-1600 | 16 | 19 | — | dB |
|  | 1600-2700 | 16 | 19 | — |  |
|  | 2700-3600 | 17 | 21 | — |  |
|  | 3600-6000 | 12 | 15 | — |  |
| Phase Unbalance | 600-1600 | — | 1.5 | 4 | Degree |
|  | 1600-2700 | — | 2.4 | 5 |  |
|  | 2700-3600 | — | 2.6 | 7 |  |
|  | 3600-6000 | — | 4.6 | 9 |  |
| Amplitude Unbalance | 600-1600 | — | 0.1 | 0.2 | dB |
|  | 1600-2700 | — | 0.1 | 0.2 |  |
|  | 2700-3600 | — | 0.1 | 0.3 |  |
|  | 3600-6000 | — | 0.2 | 0.4 |  |
| VSWR (Port S) | 600-1600 | — | 1.33 | 1.5 | :1 |
|  | 1600-2700 | — | 1.39 | 1.5 |  |
|  | 2700-3600 | — | 1.48 | 1.65 |  |
|  | 3600-6000 | — | 1.72 | 2.0 |  |
| VSWR (Port 1-2) | 600-1600 | — | 1.23 | 1.4 | :1 |
|  | 1600-2700 | — | 1.26 | 1.5 |  |
|  | 2700-3600 | — | 1.48 | 1.8 |  |
|  | 3600-6000 | — | 1.53 | 1.8 |  |

*Prior Art*

FIG. 13

Mini-CircuitsZB2PD-63+ RF Splitter/Combiner Performance Characteristics

Typical Performance Data

| Frequency (MHz) | Total Loss¹ (dB) S-1 | Total Loss¹ (dB) S-2 | Amplitude Unbalance (dB) | Isolation (dB) | Phase Unbalance (deg.) | VSWR S | VSWR 1 | VSWR 2 |
|---|---|---|---|---|---|---|---|---|
| 600.00 | 3.11 | 3.12 | 0.01 | 26.85 | 0.12 | 1.13 | 1.07 | 1.12 |
| 700.00 | 3.13 | 3.13 | 0.01 | 21.82 | 0.14 | 1.07 | 1.09 | 1.07 |
| 1200.00 | 3.17 | 3.18 | 0.01 | 23.85 | 0.26 | 1.12 | 1.07 | 1.11 |
| 1600.00 | 3.23 | 3.24 | 0.01 | 26.05 | 0.37 | 1.14 | 1.21 | 1.13 |
| 1800.00 | 3.22 | 3.23 | 0.01 | 29.26 | 0.43 | 1.09 | 1.12 | 1.08 |
| 2700.00 | 3.32 | 3.30 | 0.02 | 22.99 | 0.77 | 1.15 | 1.19 | 1.17 |
| 3000.00 | 3.35 | 3.32 | 0.03 | 36.64 | 0.74 | 1.21 | 1.23 | 1.26 |
| 3600.00 | 3.36 | 3.35 | 0.02 | 26.45 | 0.71 | 1.15 | 1.09 | 1.16 |
| 3700.00 | 3.37 | 3.36 | 0.01 | 25.29 | 0.70 | 1.12 | 1.03 | 1.13 |
| 3900.00 | 3.36 | 3.37 | 0.00 | 25.45 | 0.72 | 1.11 | 1.02 | 1.12 |
| 5000.00 | 3.69 | 3.66 | 0.02 | 32.45 | 1.33 | 1.35 | 1.37 | 1.35 |
| 5800.00 | 3.74 | 3.63 | 0.10 | 19.25 | 1.82 | 1.35 | 1.43 | 1.34 |
| 6000.00 | 3.68 | 3.53 | 0.15 | 16.13 | 1.64 | 1.45 | 1.33 | 1.45 |

1. Total Loss = Insertion Loss + 3dB splitter loss.

*Prior Art*

FIG. 19

Marki PD-0R510 RF Splitter/Combiner Performance Characteristics

Electrical Specifications – Specifications guaranteed from –55 to +100°C, measured in a 50Ω system.

| Parameter[1] | Frequency Range (GHz) | Min | Typ | Max |
|---|---|---|---|---|
| Nominal Power Splitting (dB) | 0.5 to 10 | | 3 | |
| Nominal Phase Shift (Degrees) | 0.5 to 10 | | 0 | |
| Amplitude Balance (dB) | 0.5 to 10 | | ±0.1 | ±0.5 |
| Phase Balance (Degrees) | 0.5 to 10 | | ±1 | ±5 |
| Excess Insertion Loss (dB)[2] | 0.5 to 10 | | 0.9 | 1.8 |
| VSWR | 1 to 9 | | 1.2 | 1.5 |
| | 0.5 to 1 & 9 to 10 | | 1.6 | |
| Isolation (dB) | 1 to 10 | 15 | 22 | |
| | 0.5 to 1 | 10 | 15 | |
| Power (W) | | | | 1 |
| Weight (g) | | | 60 | |

[1]Specifications guaranteed when operated in a 50Ω system.
[2]Excess Insertion Loss = (Common Port to Output Port Insertion Loss) – 3 dB.

| Model Number | Description |
|---|---|
| PD-0R510 | 0.5 – 10 GHz Power Divider with SMA connectors[1] |

[1]Default is SMA female connectors. Consult factory for other connector options.

*Prior Art*

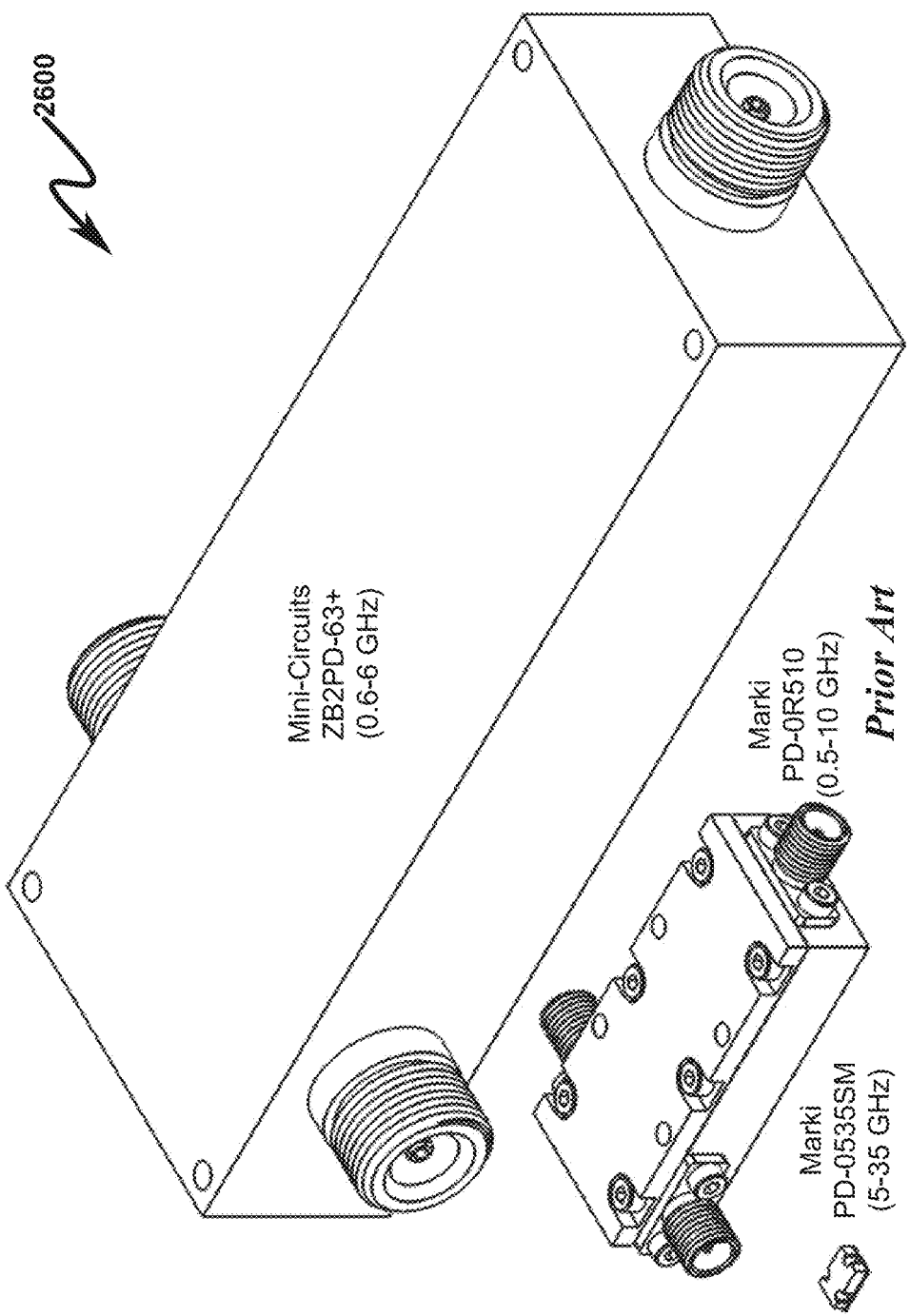
FIG. 26 *Prior Art*

FIG. 27

Marki PD-0535SM RF Splitter/Combiner Performance Characteristics

Electrical Specifications – Specifications guaranteed from -55 to +100°C, measured in a 50Ω system.

| Parameter[1] | Frequency Range (GHz) | Min | Typ | Max |
|---|---|---|---|---|
| Nominal Power Splitting (dB) | 5 to 35 | | 3 | |
| Nominal Phase Shift (Degrees) | | | 0 | |
| Amplitude Balance (dB) | | | ±0.25 | |
| Phase Balance (Degrees) | | | ±3 | |
| Excess Insertion Loss (dB)[2] | | | 1.5 | 3 |
| VSWR | | | 1.5 | |
| Isolation (dB) | | | 18 | |
| Power (W) | | | | 1 |

[1] Specifications guaranteed when operated in a 50Ω system.
[2] Excess Insertion Loss = (Common Port to Output Port Insertion Loss) – 3 dB.

| Model Number | Description |
|---|---|
| PD-0535SM | 5 - 35 GHz Power Divider, Surface Mount |

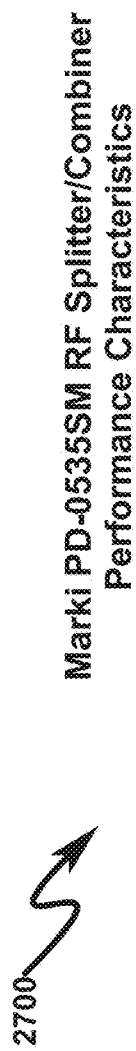

2700

*Prior Art*

4300

5200

5600

8400

9500

RF SPLITTER/COMBINER SYSTEM AND METHOD

CROSS REFERENCE TO RELATED APPLICATIONS

Not Applicable

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention relates to the implementation of radio frequency (RF) power splitters and/or combiners. Without limitation of invention scope, the present invention provides a physically compact alternative to conventional broadband (500 MHz-6000 MHz) Wilkinson-style power divider systems and methods.

PRIOR ART AND BACKGROUND OF THE INVENTION

Wilkinson Power Divider (0100)-(0400)

In the field of microwave engineering and circuit design, the Wilkinson Power Divider is a specific class of power divider circuit that can achieve isolation between the output ports while maintaining a matched condition on all ports. The Wilkinson design can also be used as a power combiner because it is made up of passive components and hence reciprocal. First published by Ernest J. Wilkinson in 1960 (see E. J. Wilkinson, "An N-way Power Divider", IRE Trans. on Microwave Theory and Techniques, vol. 8, p. 116-118, January 1960, doi: 10.1109/TMTT.1960.1124668), this circuit finds wide use in radio frequency communication systems utilizing multiple channels since the high degree of isolation between the output ports prevents crosstalk between the individual channels.

Wilkinson discusses the motivation for the power divider concept he discloses as follows:

The problem of dividing up an input signal into a number of equiphase equiamplitude output signals is familiar one to RF engineers, particularly those working in the field of phased arrays. It is often desired that the equiphase equiamplitude condition be obtained in a manner which is fundamentally independent of frequency, and, in addition, that a fairly high degree of isolation exist between output terminals over some specified frequency band. Two of the more commonly used power dividers are illustrated in FIG. 1 (0100) and FIG. 2 (0200). In FIG. 1 (0100), a corporate feed structure of T junctions provides the symmetry necessary to preserve the equiphase equiamplitude condition independent of frequency. In FIG. 2 (0200), circular symmetry is employed where all the output terminals are connected to the common center conductor of a coaxial line, and the combined load is matched by means of a quarter-wave transformer. To provide isolation between output termainsl, the T junctions of FIG. 1 (0100) may be replaced by hybrid junctions. In addition to the cost and complexity of providing a number of separate, yet identical, hybrids, the corporate feed structure has the limitation of providing only a binary number of outputs. If nine outputs were required, for example, a 16-to-1 power divider would have to be used with 7/16 of the power output being dissipated in matched loads. FIG. 2 (0200), on the other hand, because of the circular symmetry, provides any number of outputs. It has, however, the serious disadvantage of having no isolation between outputs, as the output terminals are badly mismatched because all loads appear in parallel across any given output terminal. (FIG. 1. (0100) and FIG. 2 (0200) are reproduced from this prior art reference)

As generally depicted in FIG. 3 (0300)-FIG. 4 (0400), a typical Wilkinson power divider uses quarter wave transformers, which can be easily fabricated as quarter wave lines on printed circuit boards (PCBs) or printed wiring boards (PWBs). It is also possible to use other forms of transmission line (e.g. coaxial cable) or lumped circuit elements (inductors and capacitors) (see OVERVIEW AND ESSENTIALS OF THE WILKINSON DIVIDER SPLITTER COMBINER, www.Radio-electronics.com).

The scattering parameters (s-parameters) for the common case of a 2-way equal-split Wilkinson power divider at the design frequency is given by (see D. M. Pozar, MICROWAVE ENGINEERING, Third Edition, John Wiley & Sons: New York, 2005):

$$[S] = -\frac{j}{\sqrt{2}} \begin{bmatrix} 0 & 1 & 1 \\ 1 & 0 & 0 \\ 1 & 0 & 0 \end{bmatrix}$$

Inspection of the S-parameter matrix reveals that the network is reciprocal ($S_{ij}=S_{ji}$), that the terminals are matched ($S_{11}$, $S_{22}$, $S_{33}=0$), that the output terminals are isolated ($S_{23}$, $S_{32}=0$), and that equal power division is achieved ($S_{21}=S_{31}$). The non-unitary matrix results from the fact that the network is lossy. An ideal Wilkinson divider would yield:

$$S_{21} = S_{31} = -3 \text{ dB} = 10\log_{10}\left(\frac{1}{2}\right).$$

Network theorem governs that a divider cannot satisfy all three conditions (being matched, reciprocal and loss-less) at the same time. The Wilkinson divider satisfies the first two (matched and reciprocal), and cannot satisfy the last one (being loss-less). Hence, there is some loss occurring in the network.

No loss occurs when the signals at ports 2 and 3 are in phase and have equal magnitude. However, some modification can be done to achieve unequal power division at the output ports. By cascading, the input power might be divided to any n-number of outputs.

Wilkinson Power Divider Performance (0500)-(0900)

As an aid to understanding the operation of a typical Wilkinson power divider, the performance graphs of FIG. 5 (0500)-FIG. 9 (0900) are provide as exemplary performance parameters. As can be seen from FIG. 5 (0500), a typical performance of a broadband power divider/combiner ranges from approximately 500 MHz to over 6000 MHz (the limiting use upper frequency may depend on desired transfer and isolation characteristics). This is a common frequency range for a wide variety of RF communications in which this type of equipment is utilized. As such, these performance characteristics should be met for any RF power divider/combiner that is to be considered "broadband" within this application context. It should be noted, however, that these performance graphs come with the caveat that the form factor of the Wilkinson power divider providing this response is quite large. In many circumstances a performance characteristic from approximately 500 MHz to approximately 6000 MHz is all that is needed but in a reduced form factor as compared to traditional Wilkinson power dividers.

Conventional Wilkinson Power Dividers (1000)-(1600)

A typical commercially available broadband (600 MHz-6000 MHz) Wilkinson power divider may be generally illustrated in the Mini-Circuits (P.O. Box 350166, Brooklyn, N.Y. 11235-0003, tel: (718) 934-4500, www.minicircuits.com) model ZB2PD-63+ device depicted in FIG. 10 (1000)-FIG. 16 (1600). However, it should be noted that this device has a significant footprint (greater than 10 cubic inches with connectors) and the sizing of this component (in conjunction with its use of standard N-type connectors) makes it unsuitable for many compact installations requiring RF power splitting and/or combining.

Compact Wilkinson Power Divider (1700)-(2400)

Some manufacturers have reduced the form factor of the Wilkinson power divider as generally depicted in the Marki Microwave (215 Vineyard Court, Morgan Hill, Calif. 95037, Tel: 408.778.4200, fax: 408.778.4300, www.markimicrowave.com) model PD-OR510 device depicted in FIG. 17 (1700)-FIG. 24 (2400). While this device remains a broadband device operable from 600 MHz to 6000 MHz, it still retains a relatively large form factor, consuming in excess of 1 cubic inches with connectors. This large form factor makes it unsuitable for many applications including portable/mobile devices.

Surface Mount Wilkinson Power Dividers (2500)-(3200)

Some manufacturers have recently provided small form factor surface mount Wilkinson power dividers as generally depicted in the Marki Microwave (215 Vineyard Court, Morgan Hill, Calif. 95037, Tel: 408.778.4200, fax: 408.778.4300, www.markimicrowave.com) model PD-0535SM device depicted in FIG. 25 (2500)-FIG. 32 (3200). However, it should be noted that this device is not a broadband power divider and only has useful performance above 5 GHz. The lack of low frequency RF performance makes this device unsuitable for many applications despite its small form factor.

Deficiencies in the Prior Art

While the prior art as detailed above can theoretically be used to form RF power dividers/combiners, it suffers from the following deficiencies:
  Prior art RF power dividers/combiner systems and methods having broadband transfer characteristics exhibit large volumetric footprints.
  Prior art RF power dividers/combiner systems and methods having small volumetric footprints exhibit poor broadband performance.
To date the prior art has not fully addressed these deficiencies by providing a system/method providing for both broadband performance and low volumetric footprint.

Objectives of the Invention

Accordingly, the objectives of the present invention are (among others) to circumvent the deficiencies in the prior art and affect the following objectives:
  (1) provide for a system and method that provides for broadband (500 MHZ-6000 MHz) RF splitter/combiner performance; and
  (2) provide for a system and method that provides for a minimal volumetric footprint.
While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

The present invention pertains to a system, method, and product-by-process wherein a passive network is used to perform RF power splitting/combining functions. This passive network is formed on signal routing substrate (SRS) having a conducting bottom reference plane (BRP) and conducting signal traces on a top signal plane (TSP). The TSP incorporates a serpentine impedance network (SIN) that includes a mirrored pair of serpentine traces (first serpentine trace (FST) and second serpentine trace (SST)) that are mirrored about a common reference plane. The serpentine traces each comprise a series of positive serpentine nodes (PSN) and negative serpentine nodes (NSN). The NSN of the serpentine traces are electrically connected together with a bridge passive component (BPC). The NSN of the serpentine traces are each individually coupled to the BRP using a passive component. Impedance matching of the SIN is accomplished using a series of paired coupling traces (PCT) placed between each PSN and NSN and sized to achieve a simultaneous impedance match and equal power division among the FST and SST.

The unique construction of the SIN on the SRS in conjunction with proper selection of trace widths, PCT sizes, and passive components provides for an equally split power division while simultaneously providing for isolation and other features normally associated with a Wilkinson splitter/combiner but at a greatly reduced form factor.

BRIEF DESCRIPTION OF THE DRAWINGS

For a fuller understanding of the advantages provided by the invention, reference should be made to the following detailed description together with the accompanying drawings wherein:

FIG. 13 illustrates a table of performance characteristics for a prior art Mini-Circuits model ZB2PD-63+ broadband Wilkinson power divider;

FIG. 19 illustrates a table of performance characteristics for a prior art Marki model PD-0R510 broadband Wilkinson power divider;

FIG. 26 illustrates a size and bandwidth comparison between the prior art Mini-Circuits model ZB2PD-63+, Marki model PD-0R510, and Marki model PD-0535SM Wilkinson power dividers;

FIG. 27 illustrates a table of performance characteristics for a prior art Marki model PD-0535SM Wilkinson power divider;

DESCRIPTION OF THE PRESENTLY PREFERRED EXEMPLARY EMBODIMENTS

Figure 1:
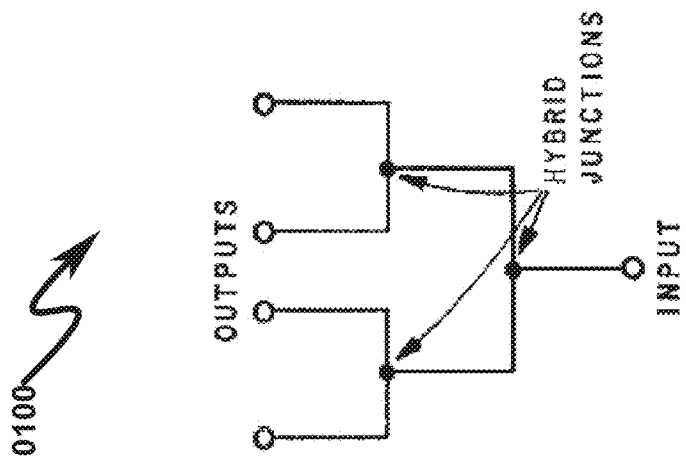
FIG. 1 illustrates a corporate feed structure power divider of T junctions providing symmetry necessary to preserve equiphase equiamplitude conditions independent of frequency.
Figure 2:
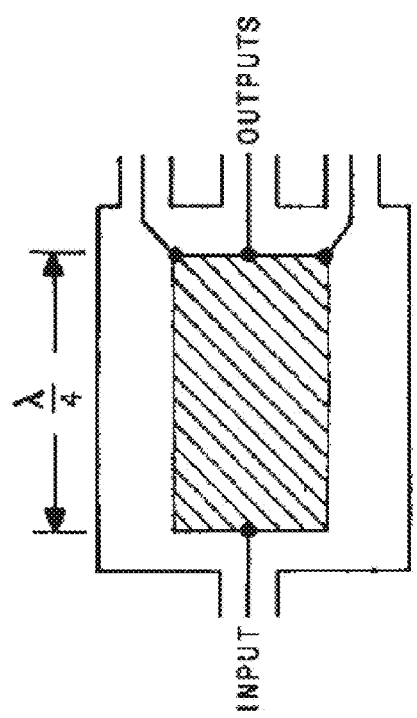
FIG. 2 illustrates the use of circular symmetry in a power divider where all the output terminals are connected to the common center conductor of a coaxial line.
Figure 3:
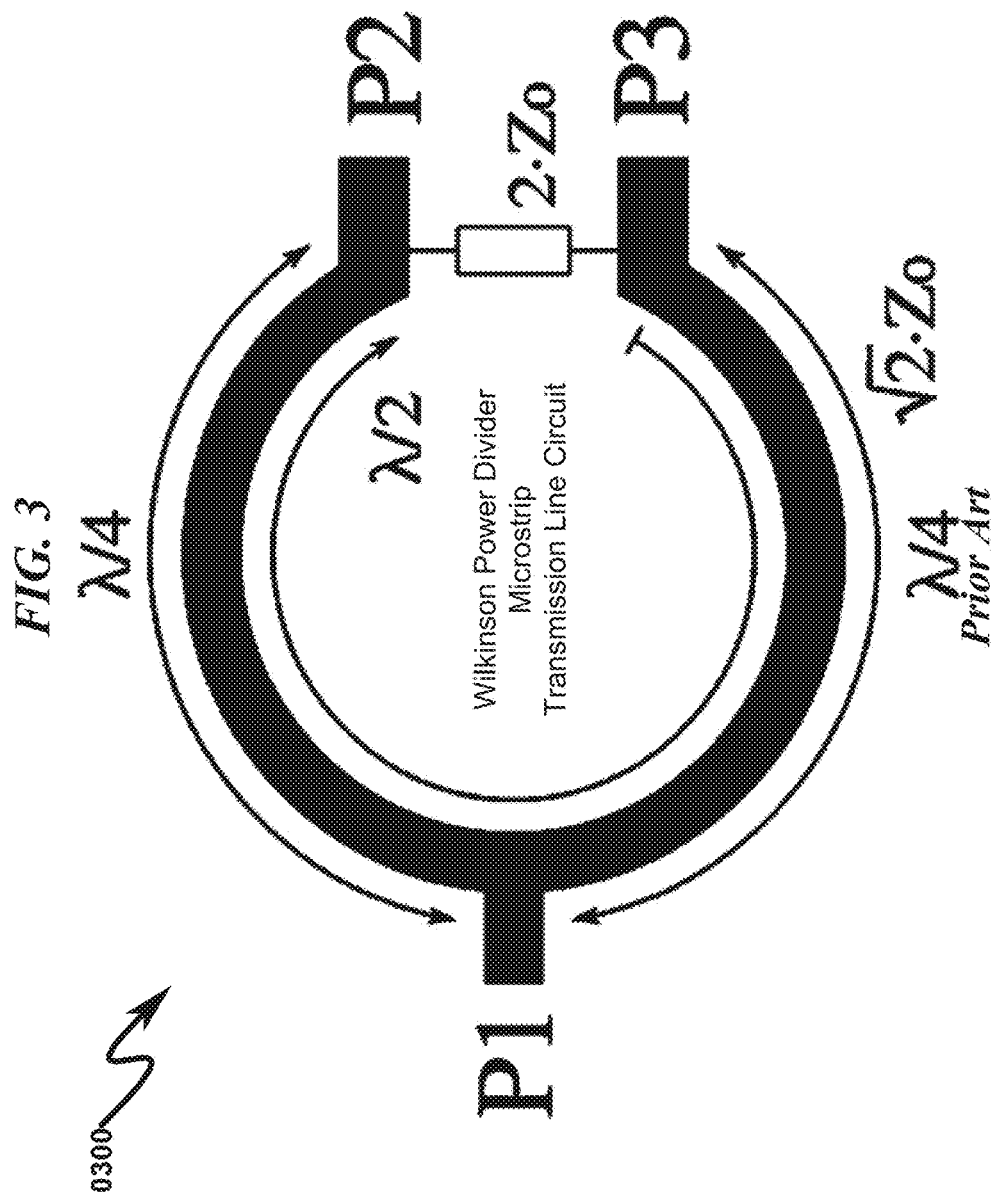
FIG. 3 illustrates an equal-split prior art Wilkinson power divider circuit in microstrip form.
Figure 4:
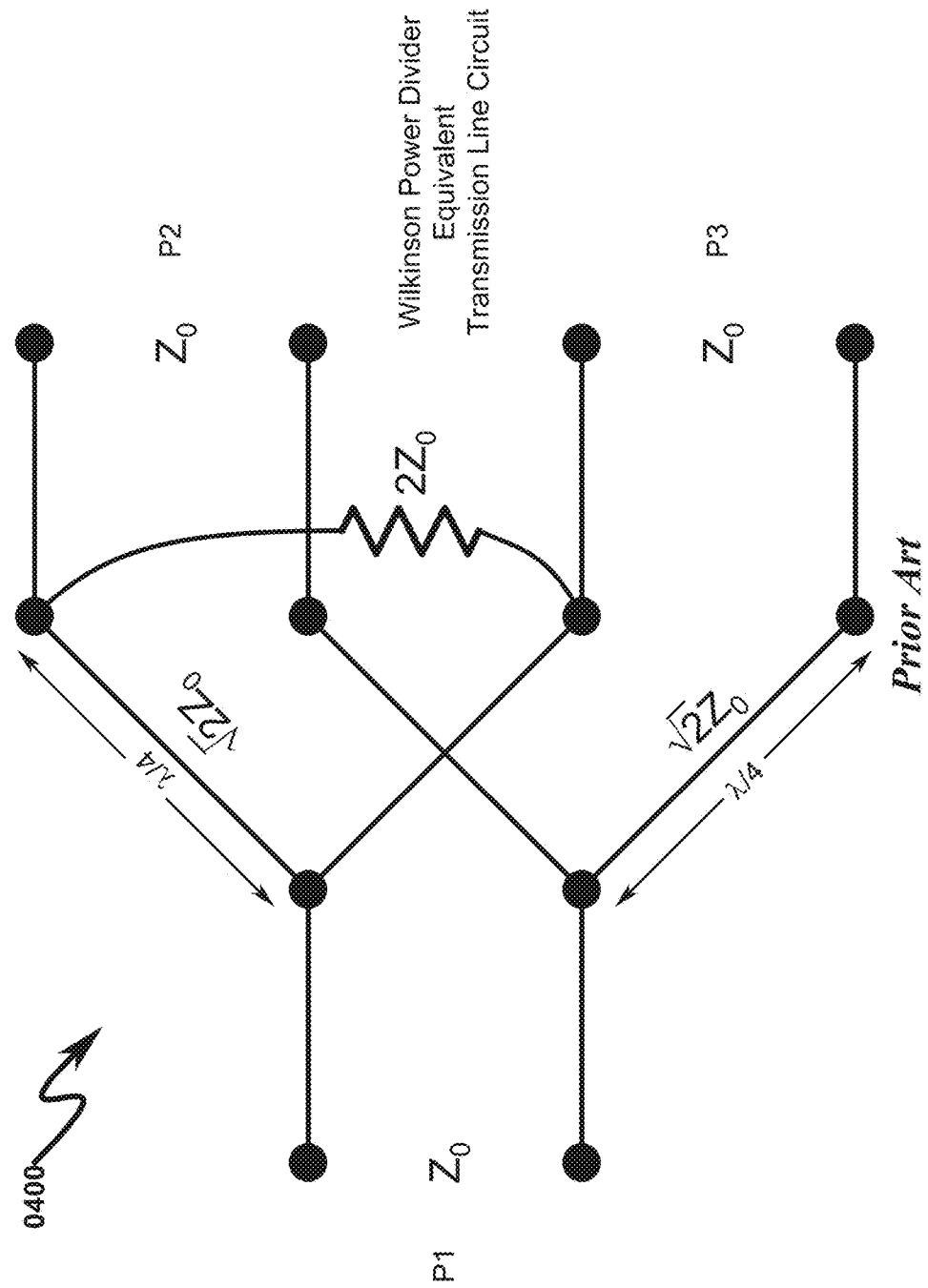
FIG. 4 illustrates the equivalent transmission line circuit for a prior art Wilkinson power divider.
Figure 5:
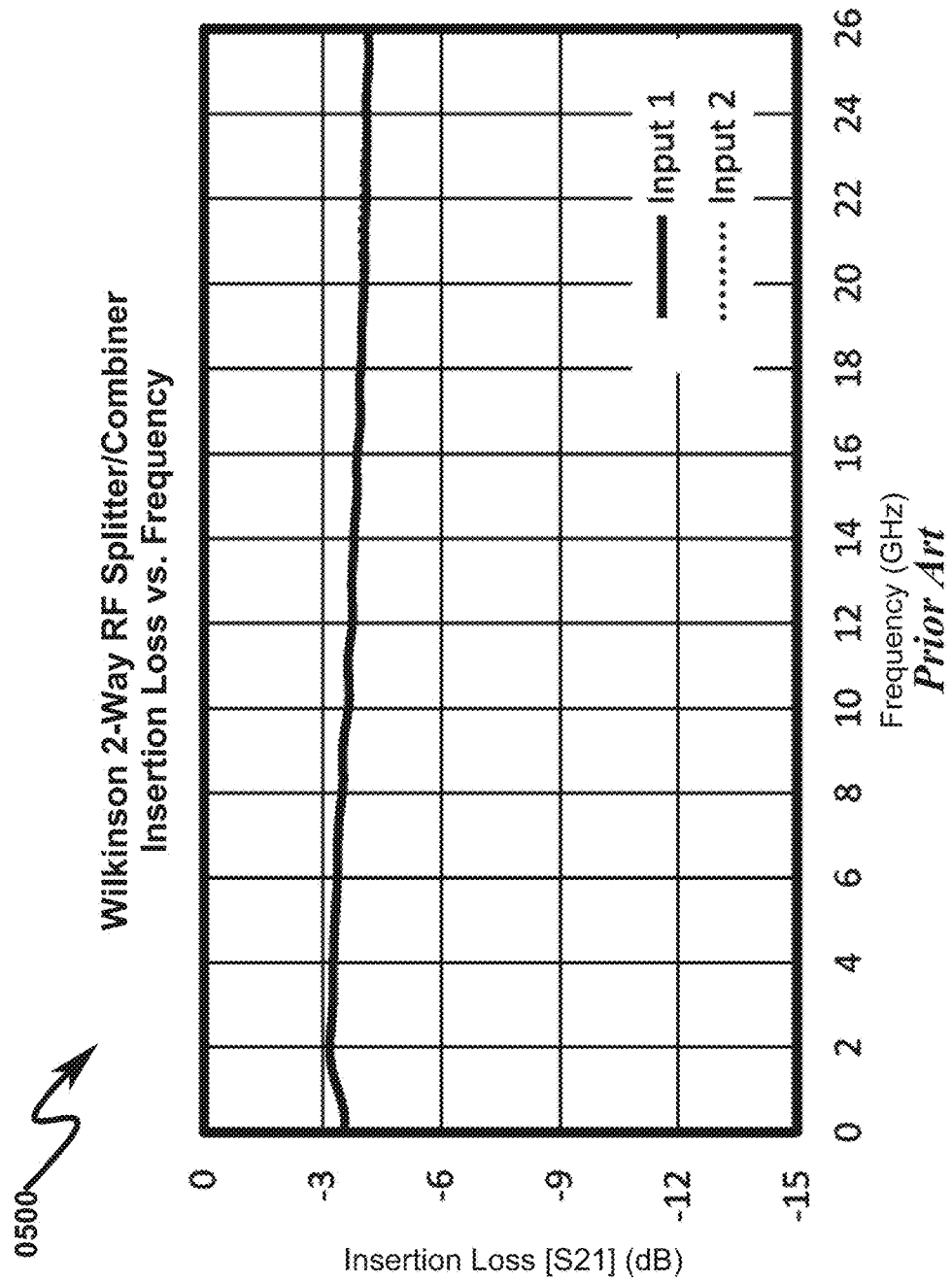
FIG. 5 illustrates a graph of insertion loss vs. frequency for a typical prior art broadband Wilkinson power divider.
Figure 6:
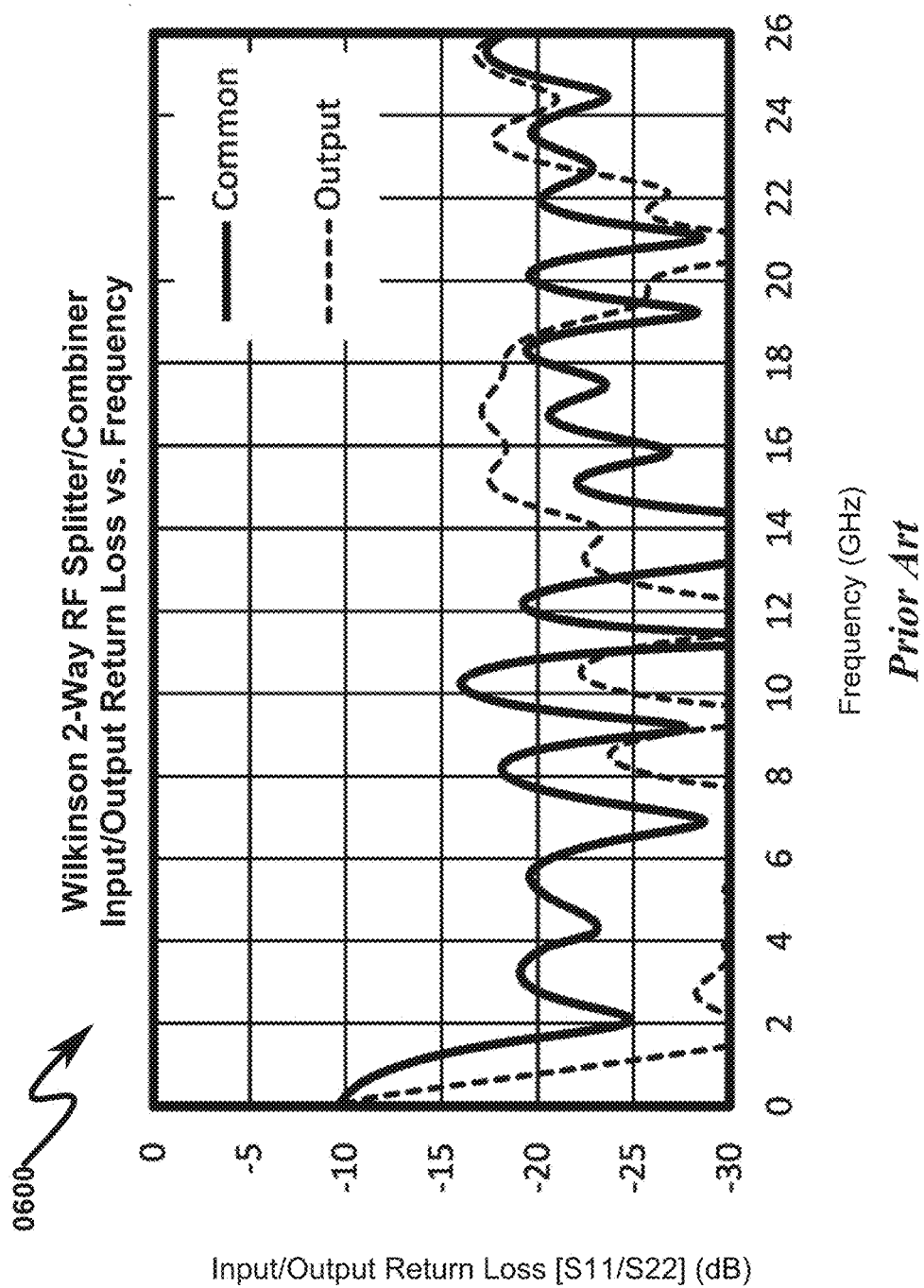
FIG. 6 illustrates a graph of input/output return loss vs. frequency for a typical prior art broadband Wilkinson power divider.
Figure 7:
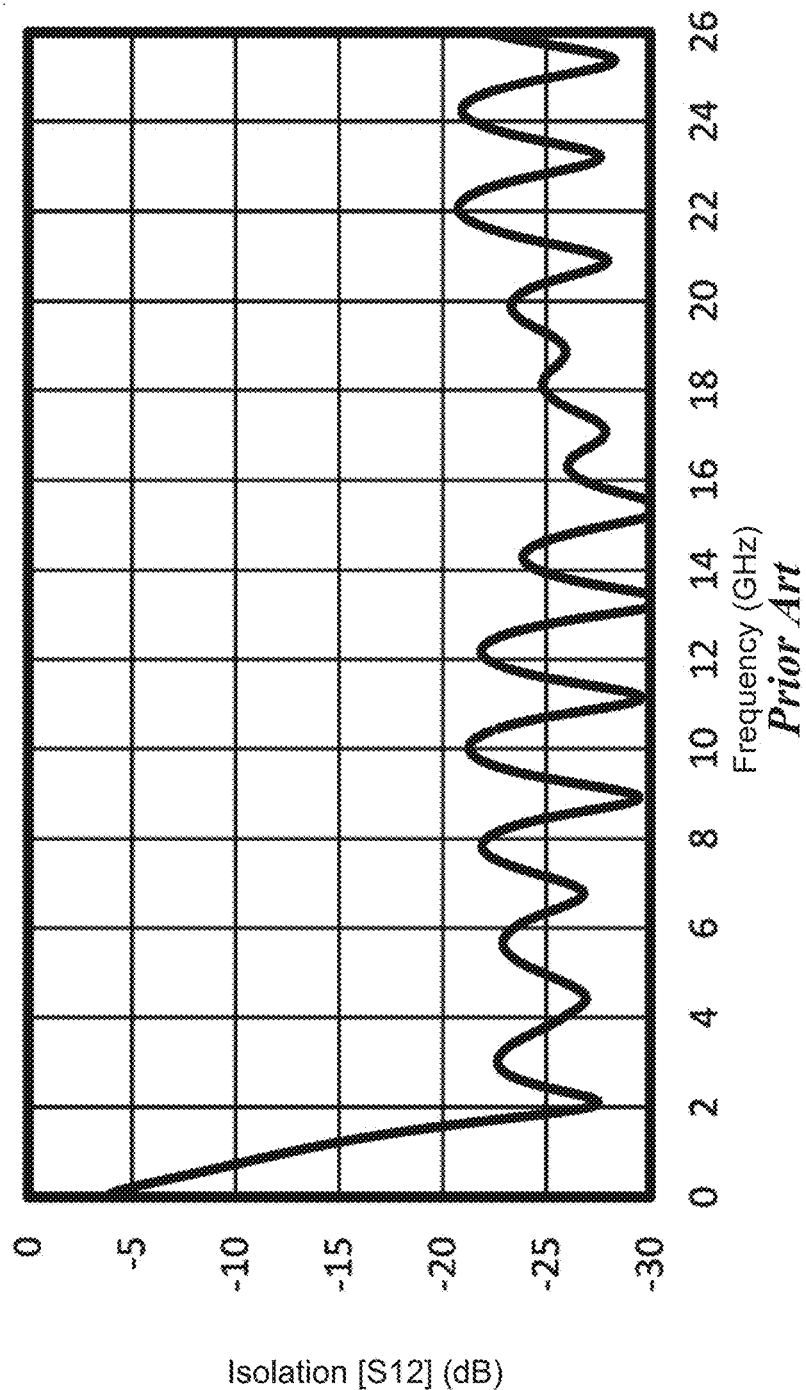
FIG. 7 illustrates a graph of isolation vs. frequency for a typical prior art broadband Wilkinson power divider.
Figure 8:
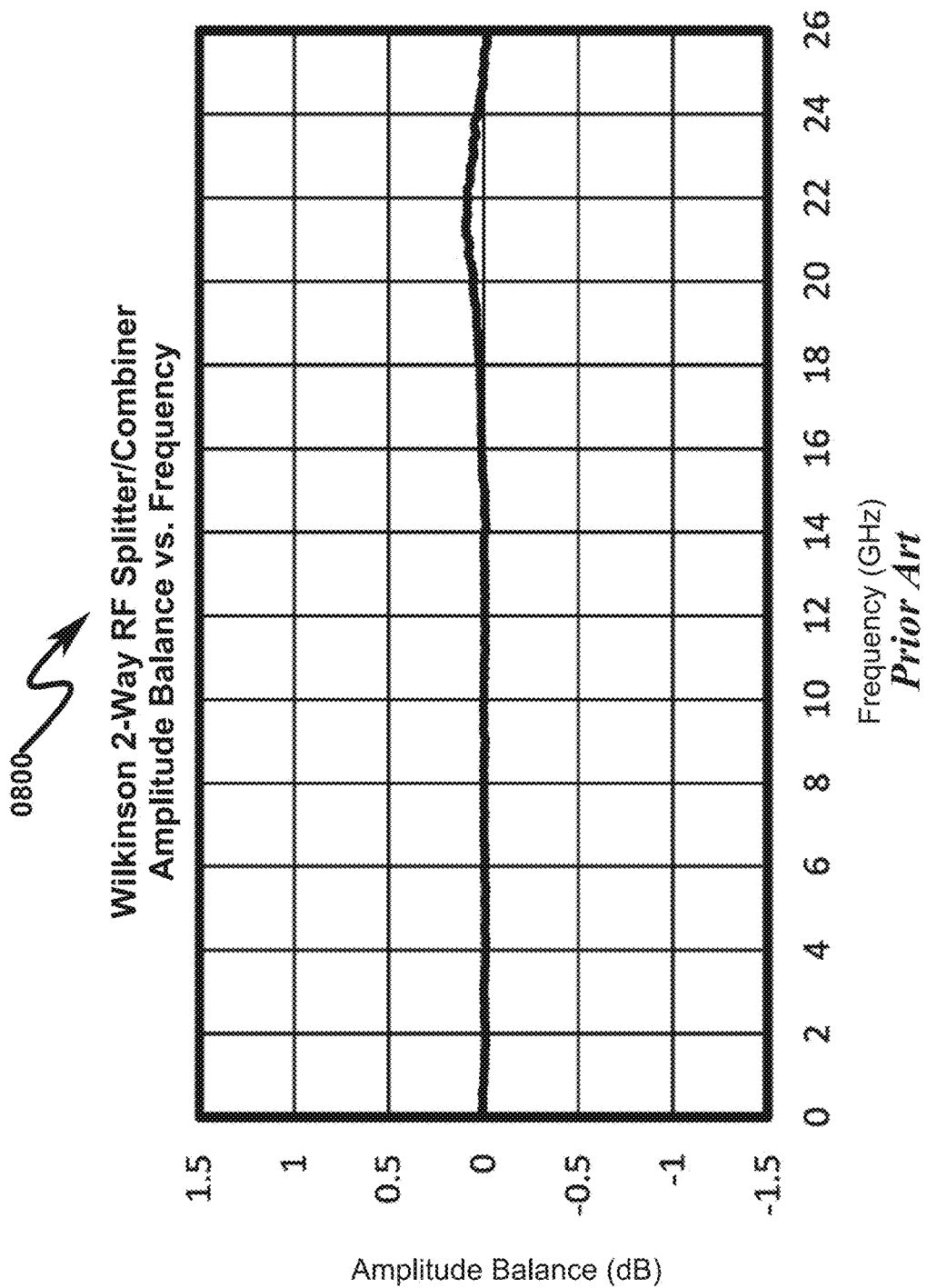
FIG. 8 illustrates a graph of amplitude balance vs. frequency for a typical prior art broadband Wilkinson power divider.
Figure 9:
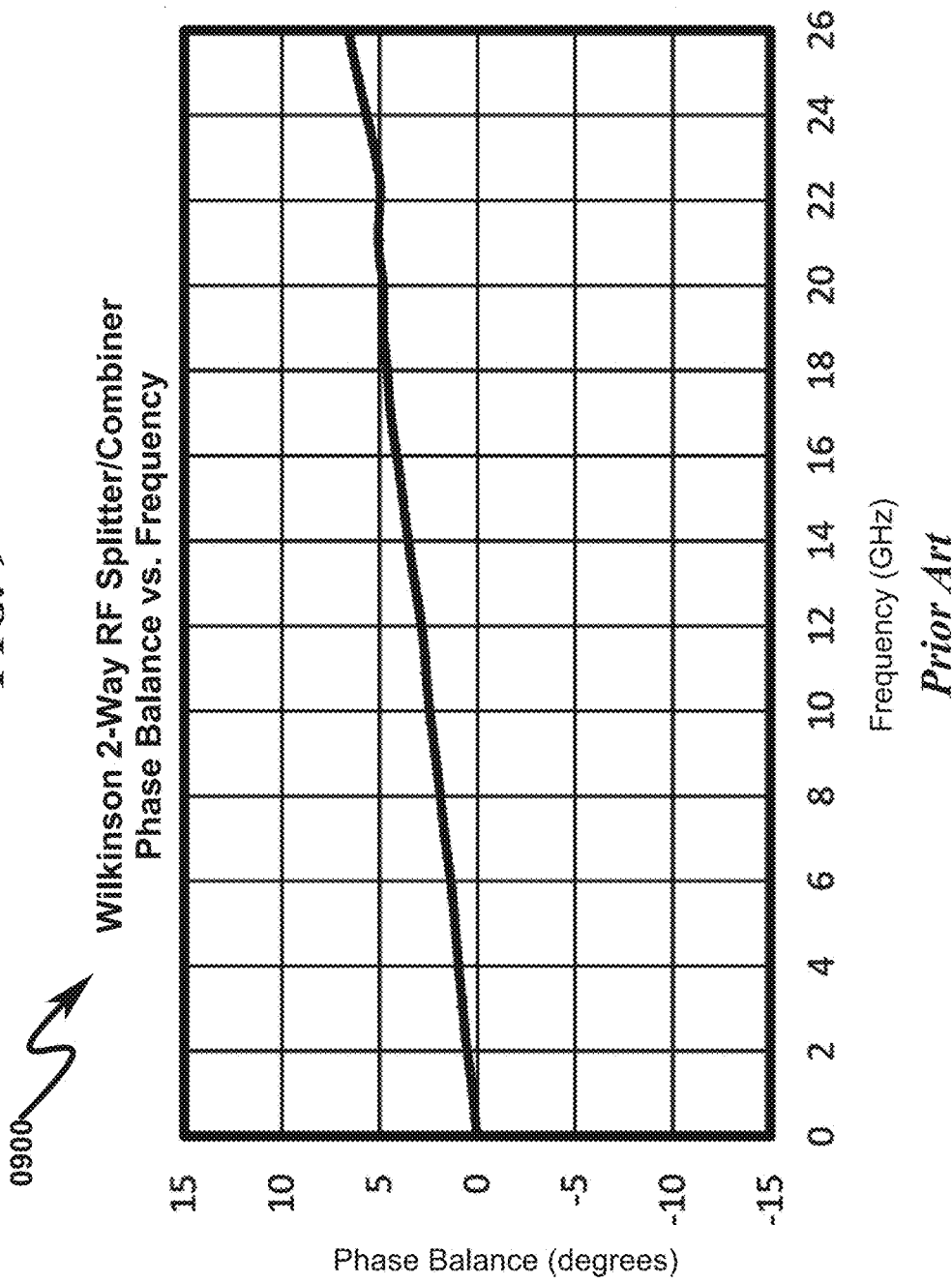
FIG. 9 illustrates a graph of phase balance vs. frequency for a typical prior art broadband Wilkinson power divider.
Figure 10:
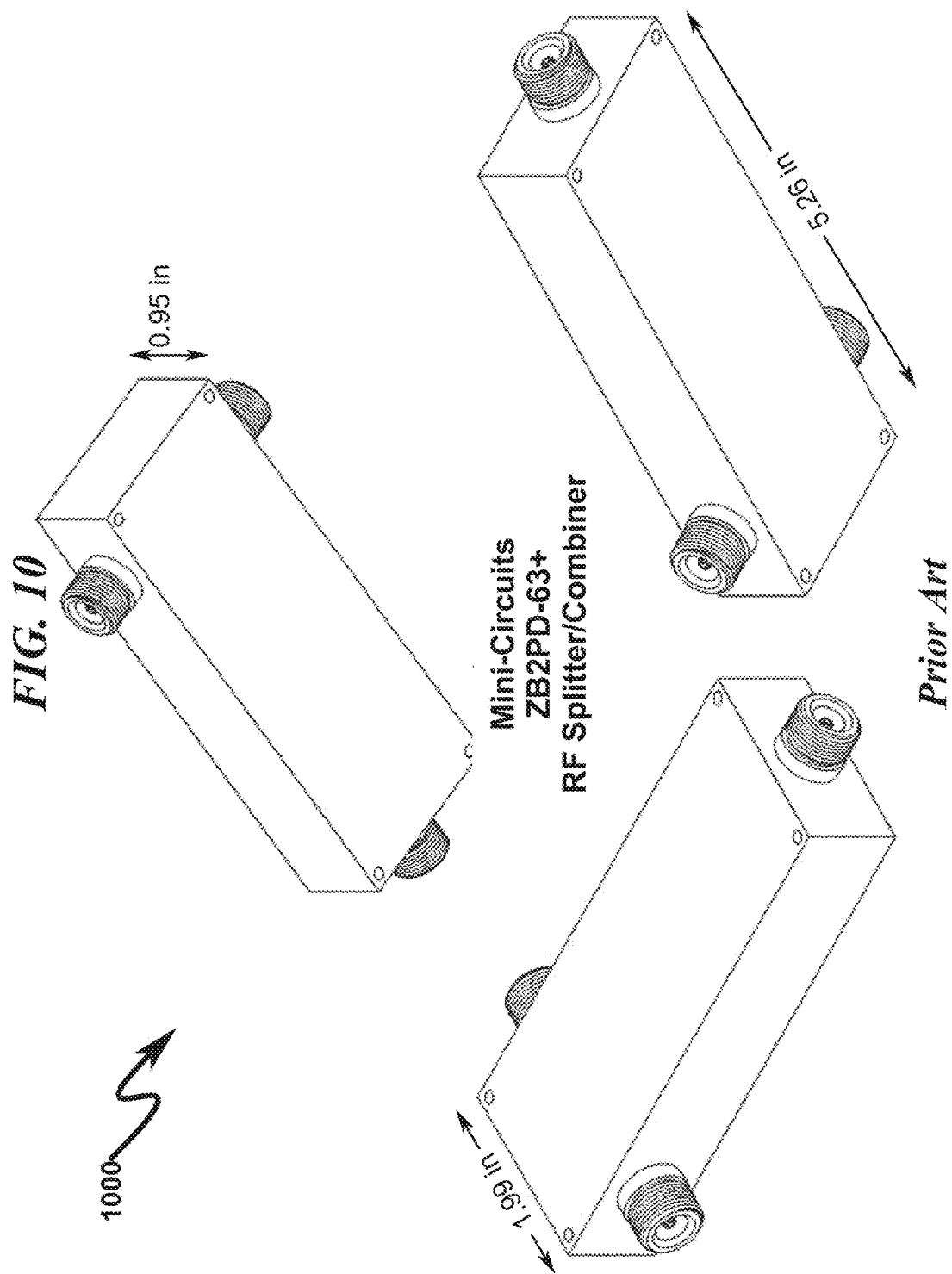
FIG. 10 illustrates perspective views of a prior art Mini-Circuits model ZB2PD-63+ broadband Wilkinson power divider.
Figure 11:
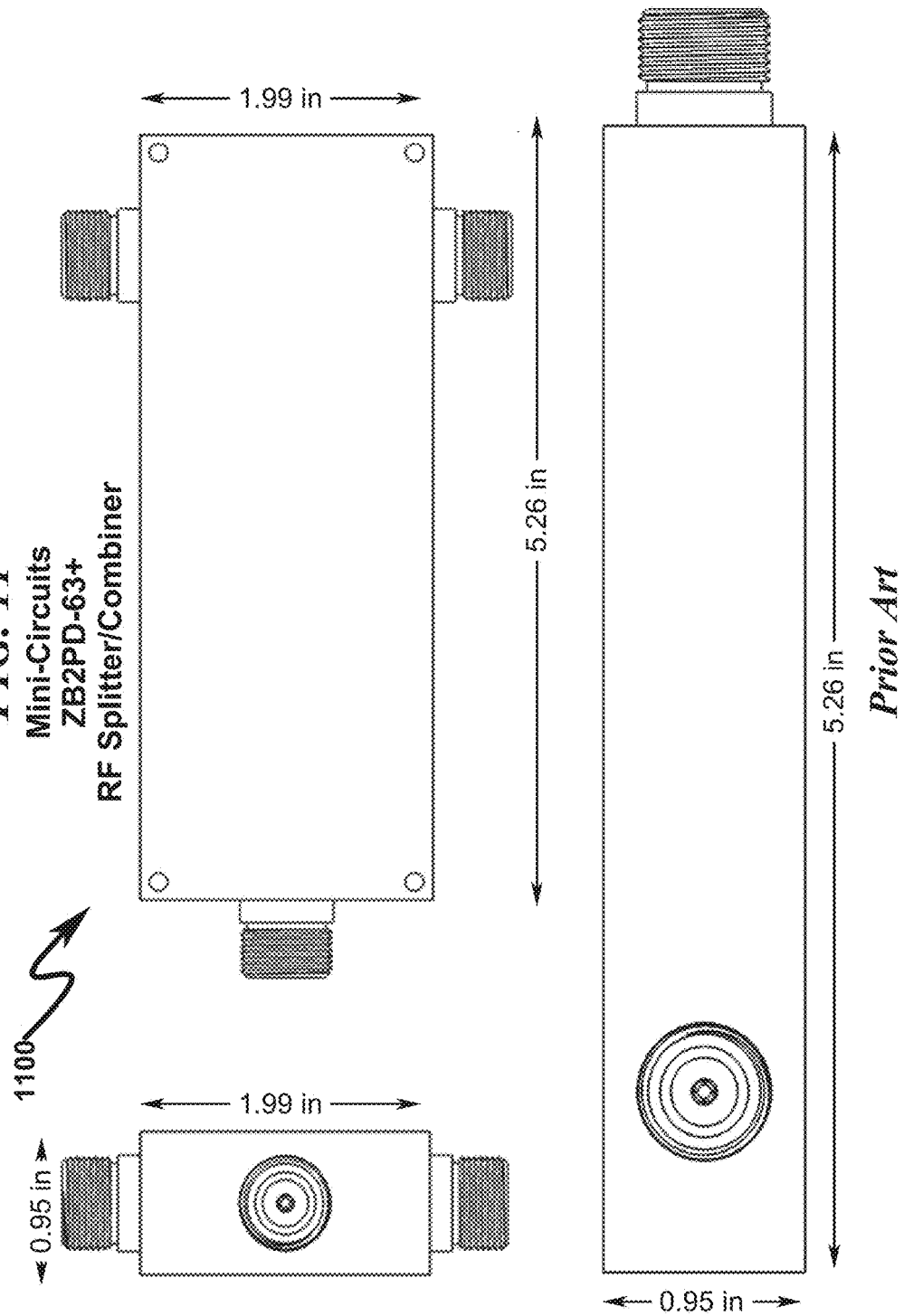
FIG. 11 illustrates top, front, and side views of a prior art Mini-Circuits model ZB2PD-63+ broadband Wilkinson power divider.
Figure 12:
FIG. 12 illustrates a table of performance characteristics for a prior art Mini-Circuits model ZB2PD-63+ broadband Wilkinson power divider.
Figure 14:
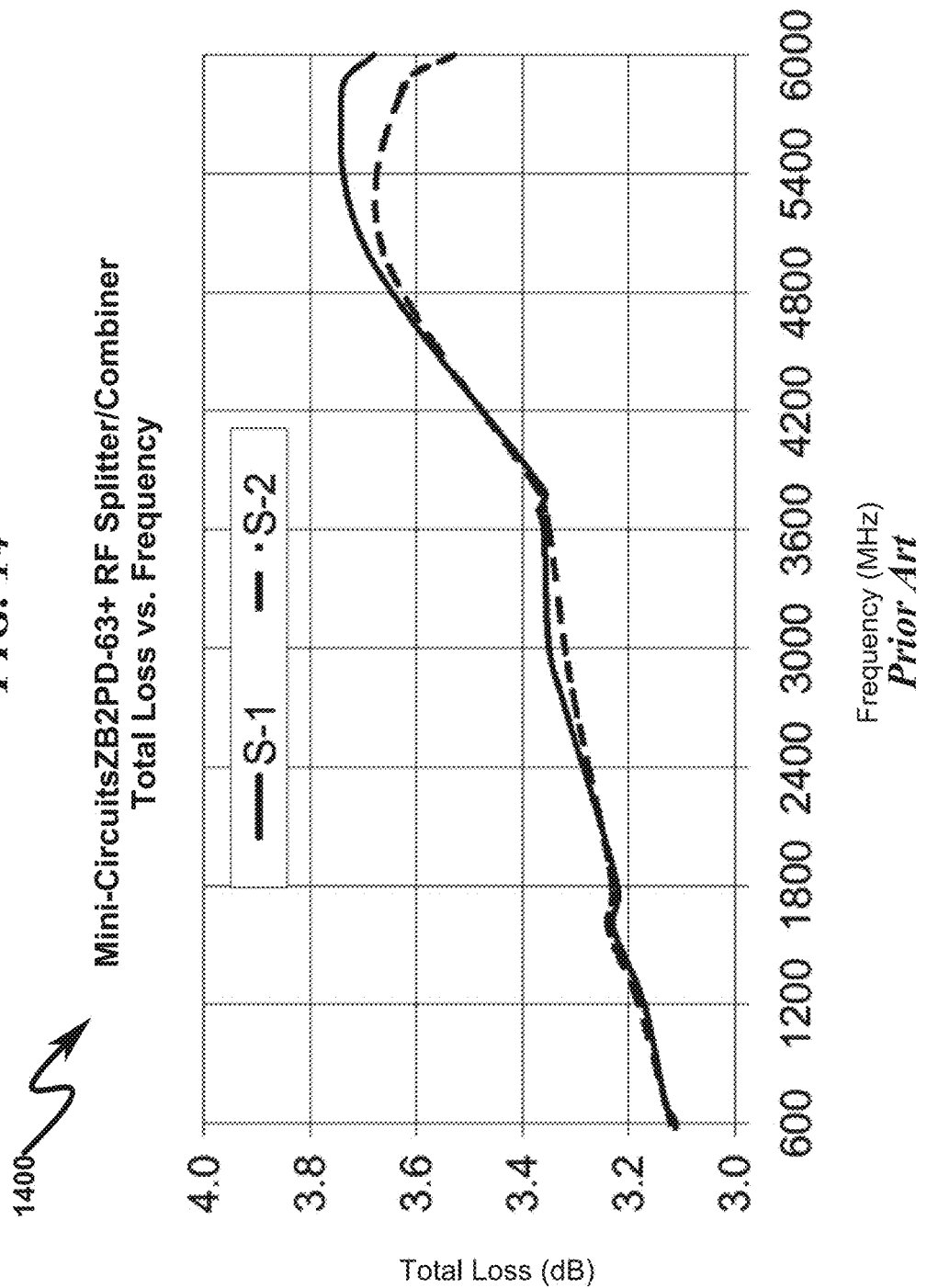
FIG. 14 illustrates a graph of total loss vs. frequency for a prior art Mini-Circuits model ZB2PD-63+ broadband Wilkinson power divider.
Figure 15:
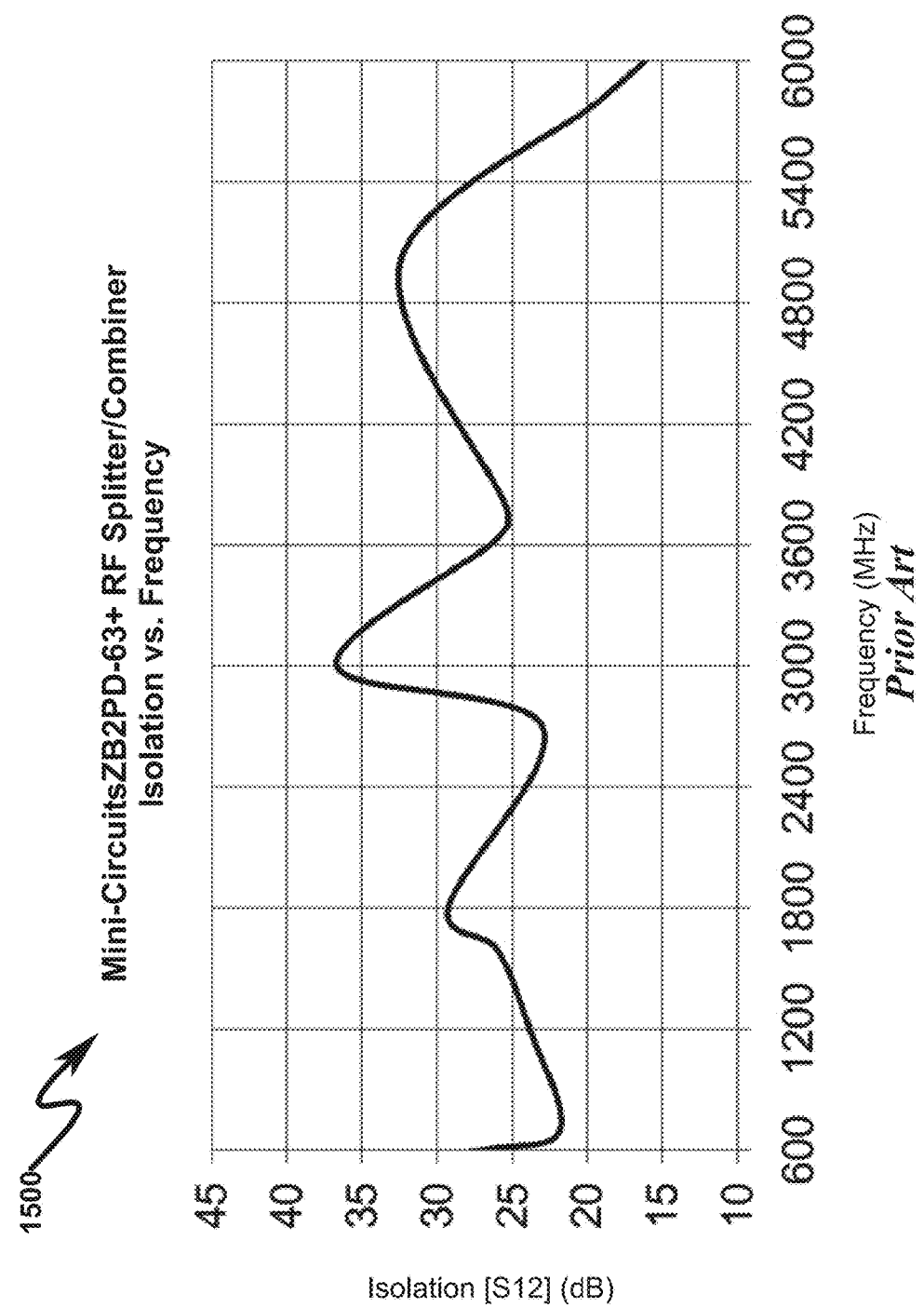
FIG. 15 illustrates a graph of isolation vs. frequency for a prior art Mini-Circuits model ZB2PD-63+ broadband Wilkinson power divider.
Figure 16:
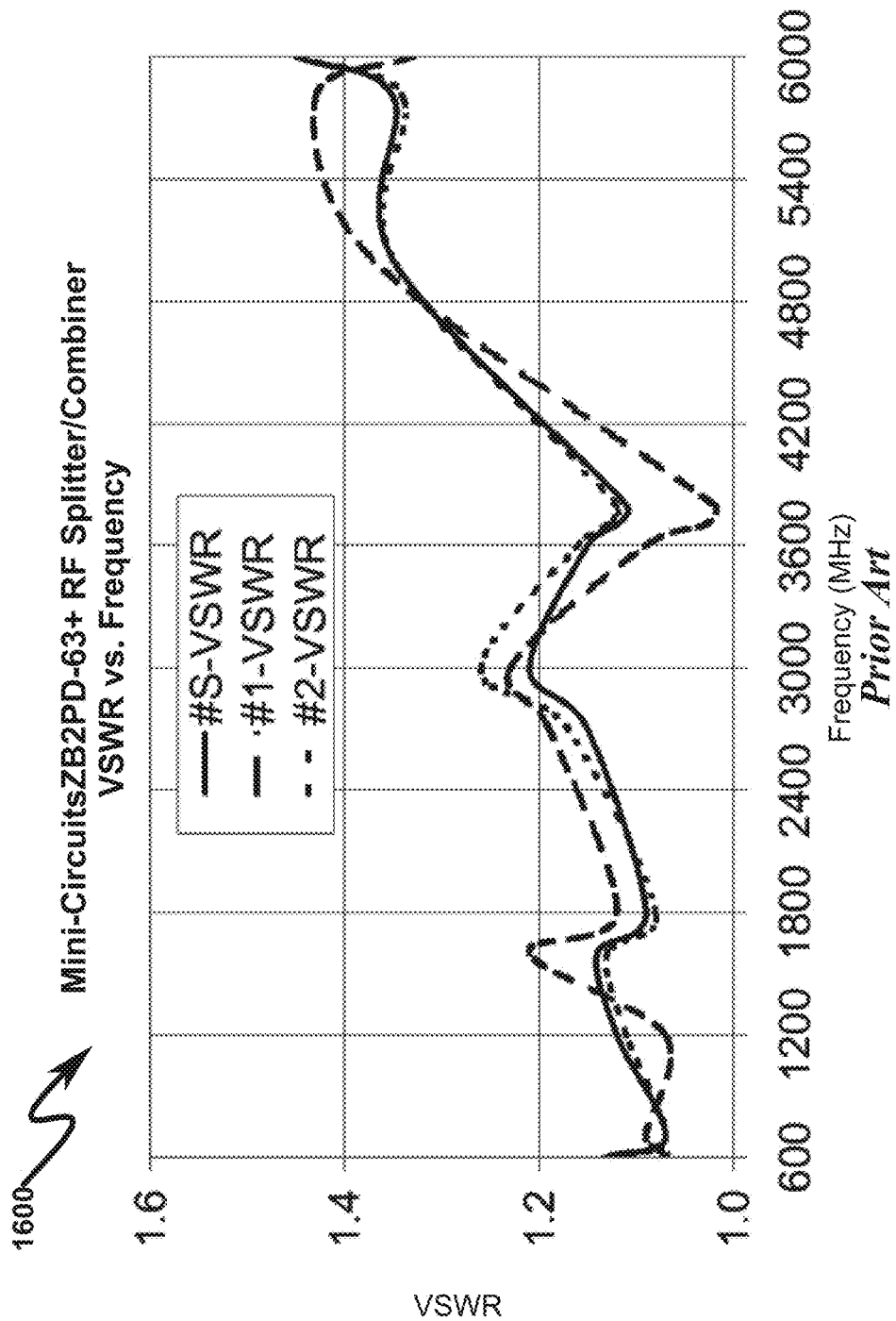
FIG. 16 illustrates a graph of VSWR vs. frequency for a prior art Mini-Circuits model ZB2PD-63+ broadband Wilkinson power divider.
Figure 17:
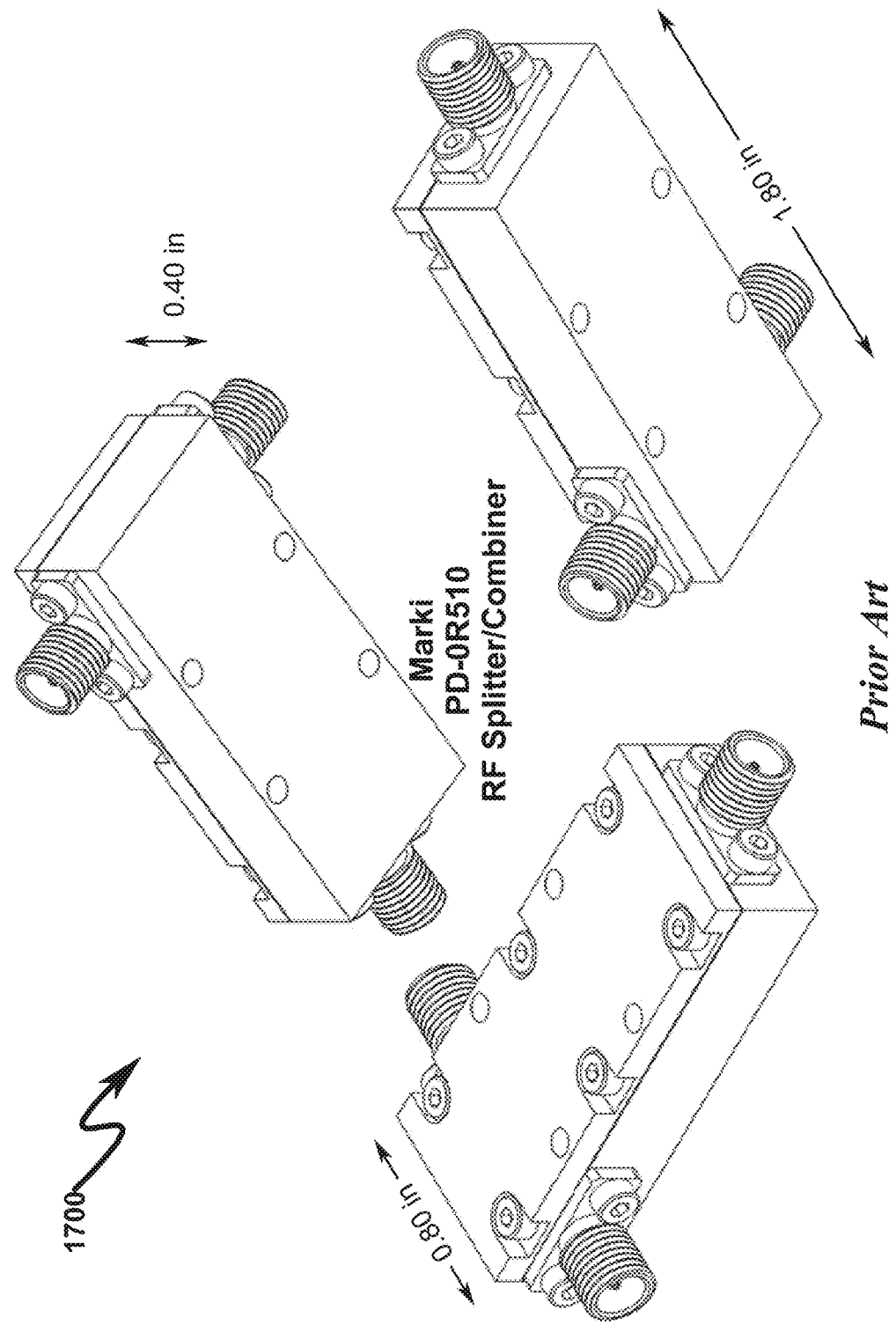
FIG. 17 illustrates perspective views of a prior art Marki model PD-0R510 broadband Wilkinson power divider.
Figure 18:
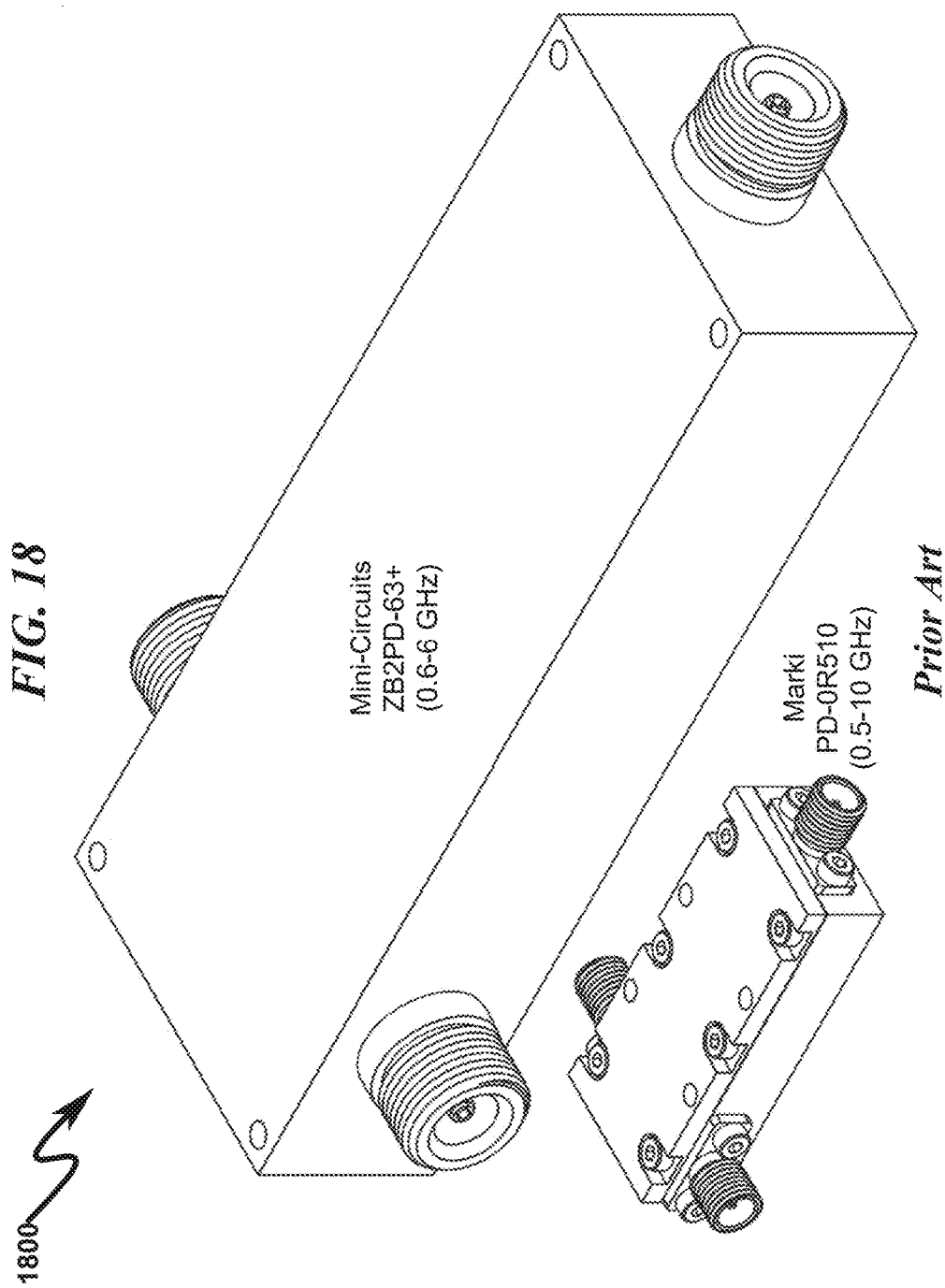
FIG. 18 illustrates a size comparison between the prior art Mini-Circuits model ZB2PD-63+ and Marki model PD-0R510 broadband Wilkinson power dividers.
Figure 20:
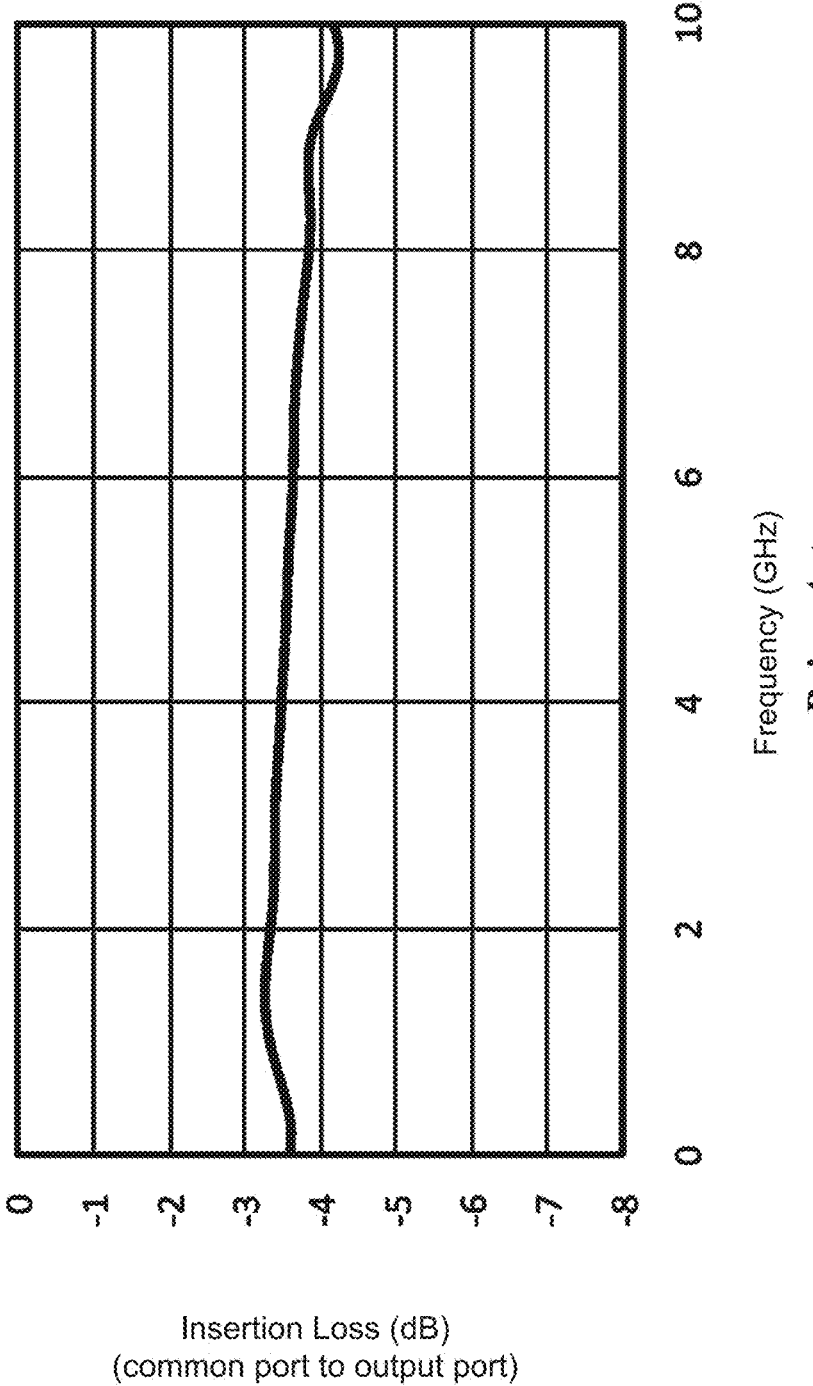
FIG. 20 illustrates a graph of insertion loss vs. frequency for a prior art Marki model PD-0R510 broadband Wilkinson power divider.
Figure 21:
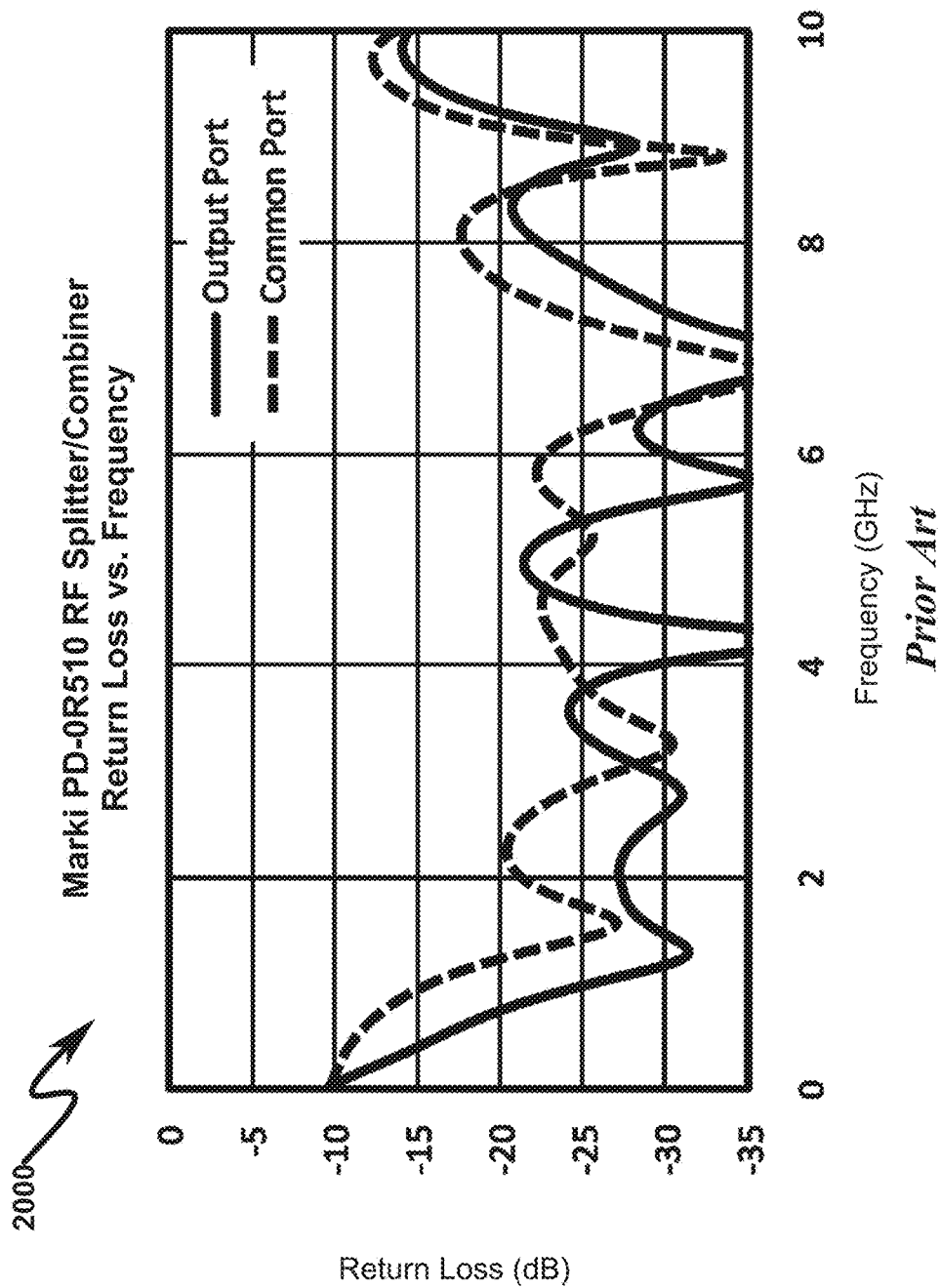
FIG. 21 illustrates a graph of return loss vs. frequency for a prior art Marki model PD-0R510 broadband Wilkinson power divider.
Figure 22:
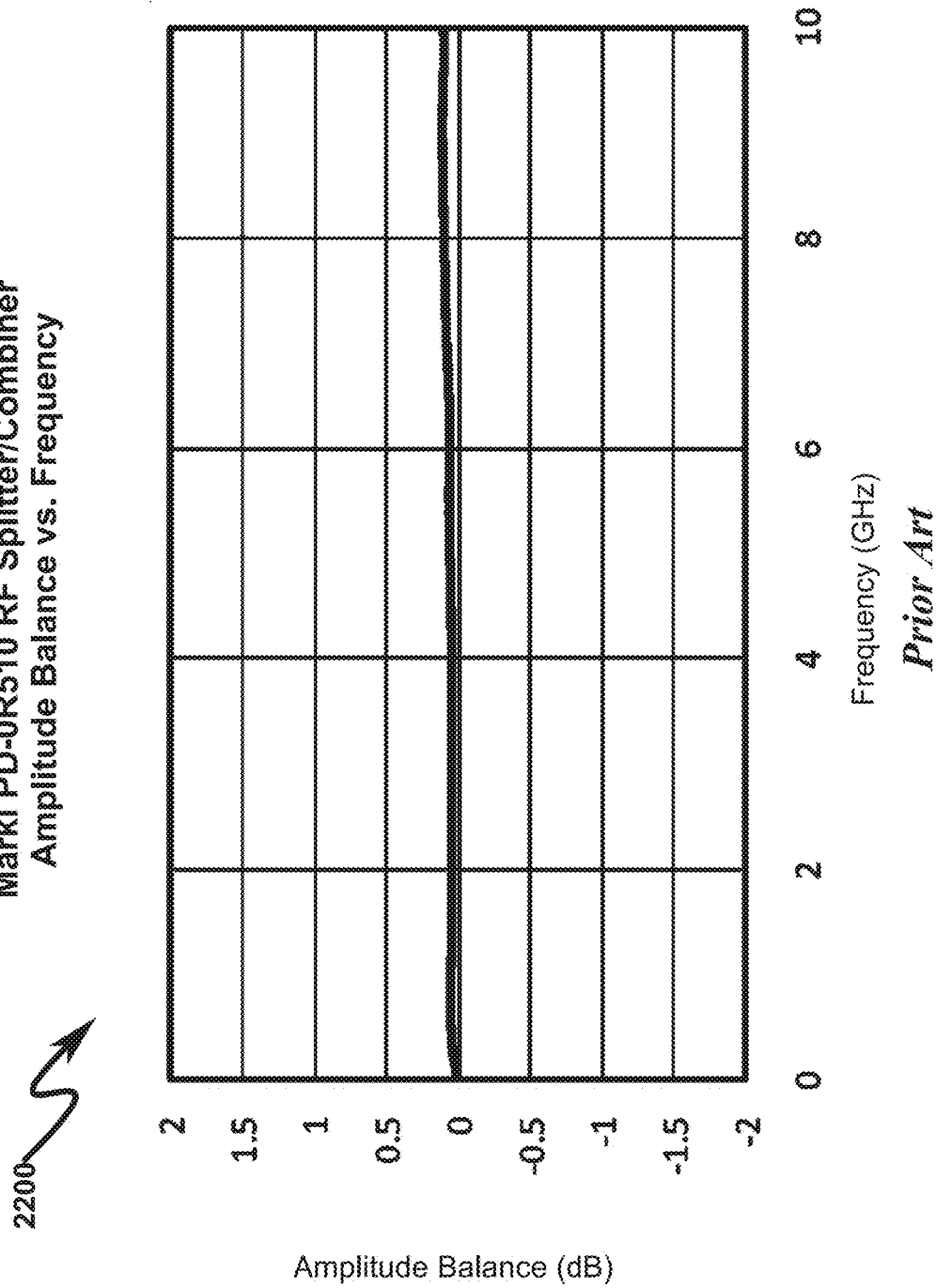
FIG. 22 illustrates a graph of amplitude balance vs. frequency for a prior art Marki model PD-0R510 broadband Wilkinson power divider.
Figure 23:
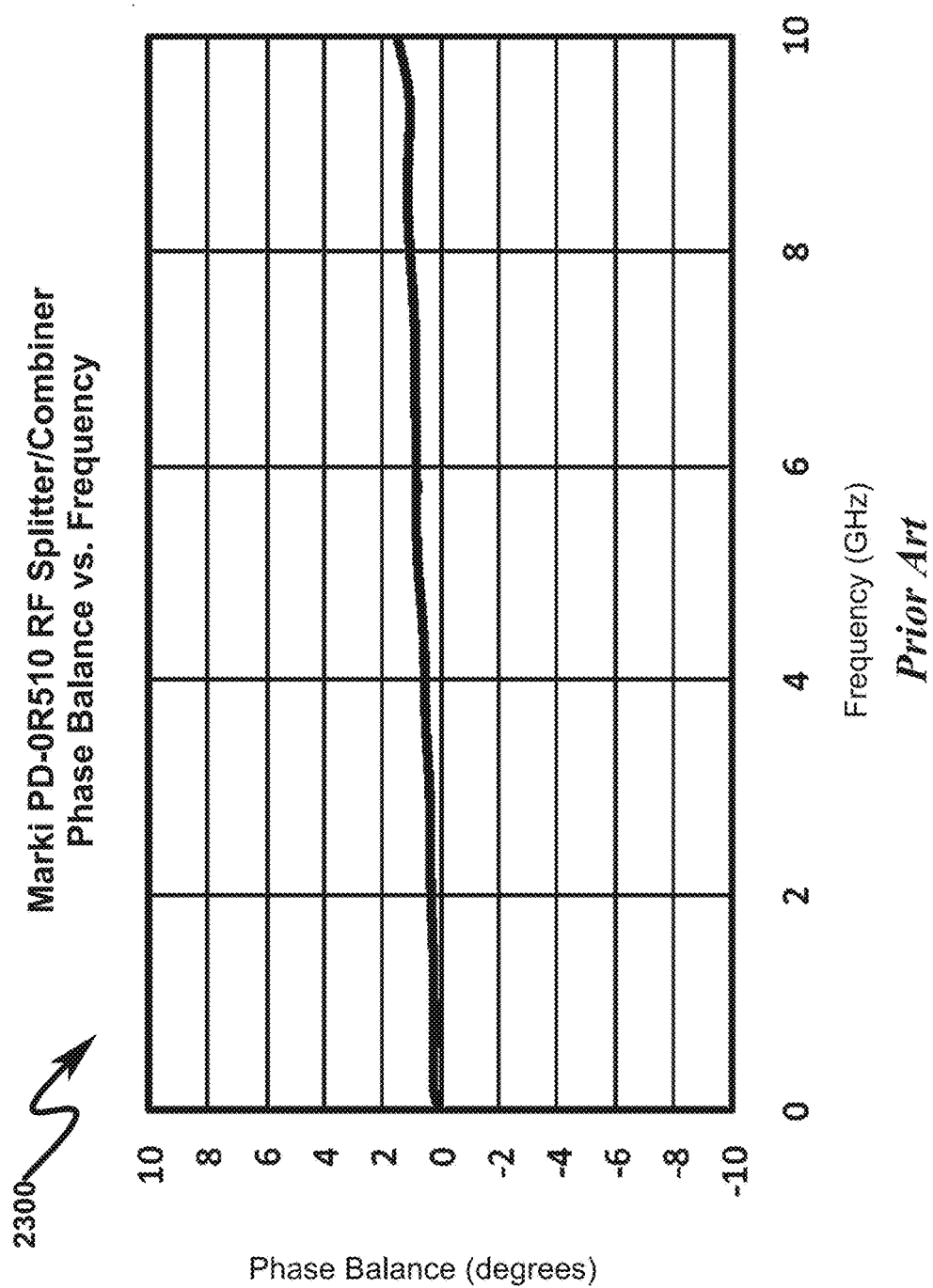
FIG. 23 illustrates a graph of phase balance vs. frequency for a prior art Marki model PD-0R510 broadband Wilkinson power divider.
Figure 24:
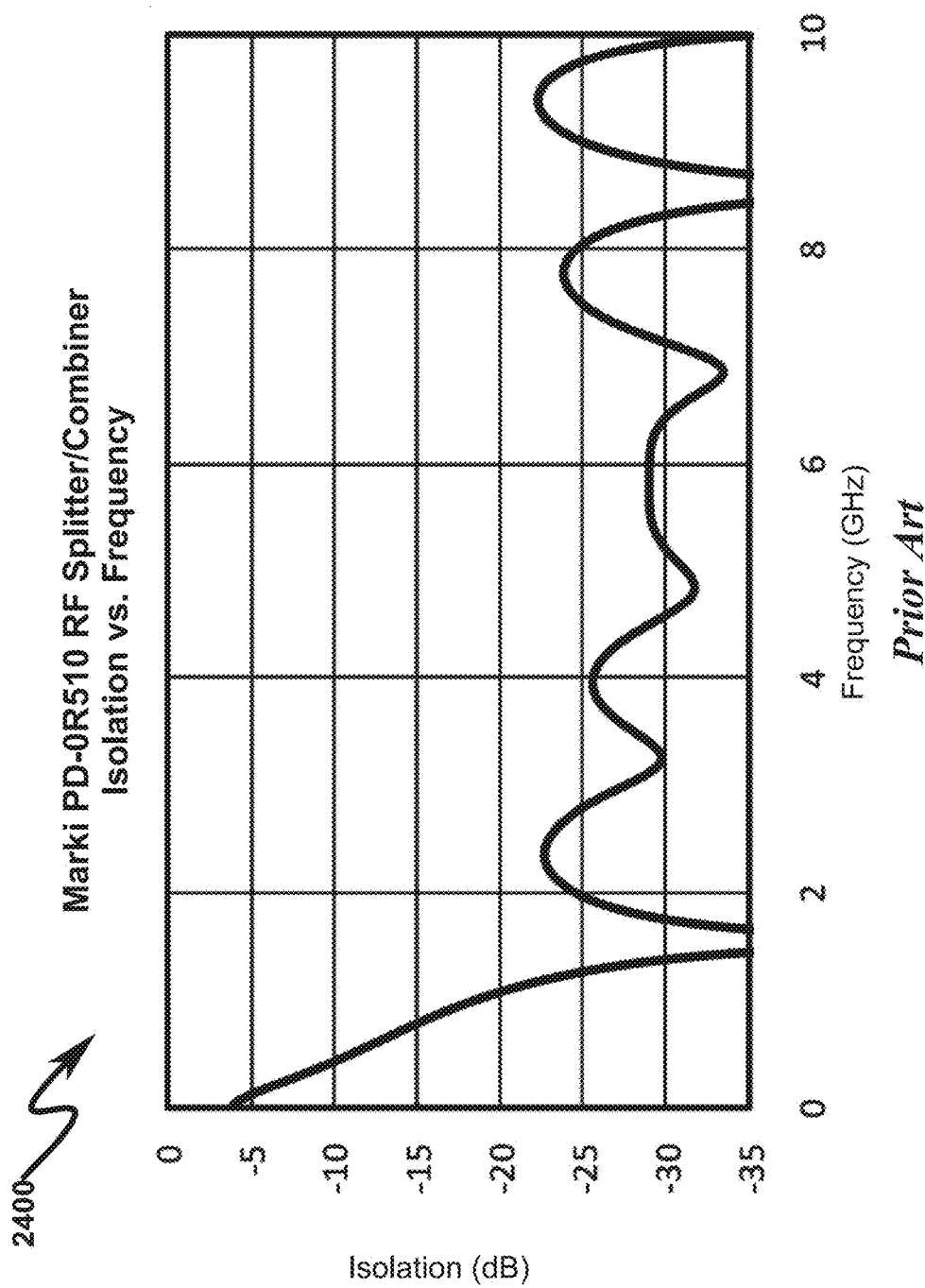
FIG. 24 illustrates a graph of isolation vs. frequency for a prior art Marki model PD-0R510 broadband Wilkinson power divider.
Figure 25:
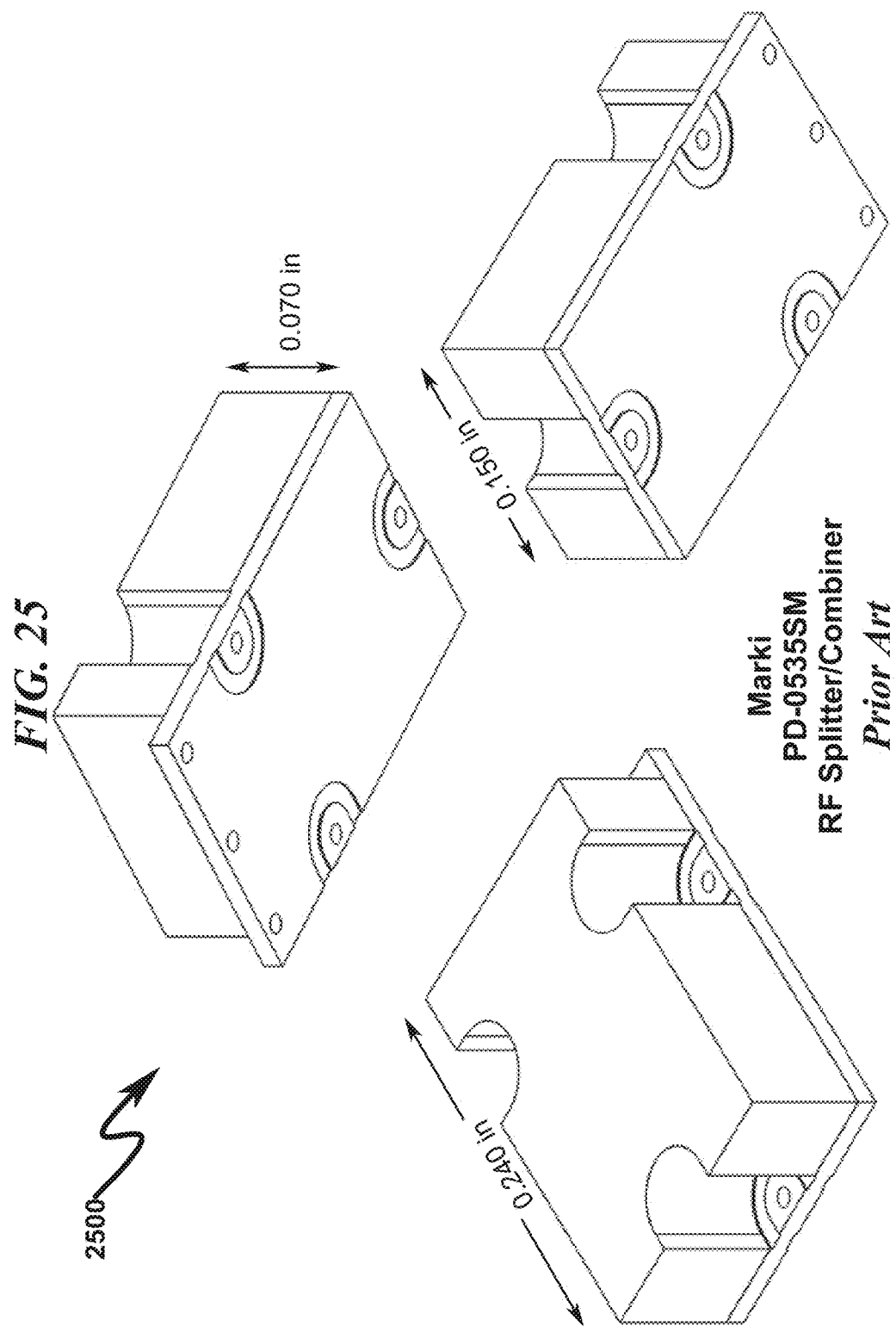
FIG. 25 illustrates perspective views of a prior art Marki model PD-0535SM Wilkinson power divider.
Figure 28:
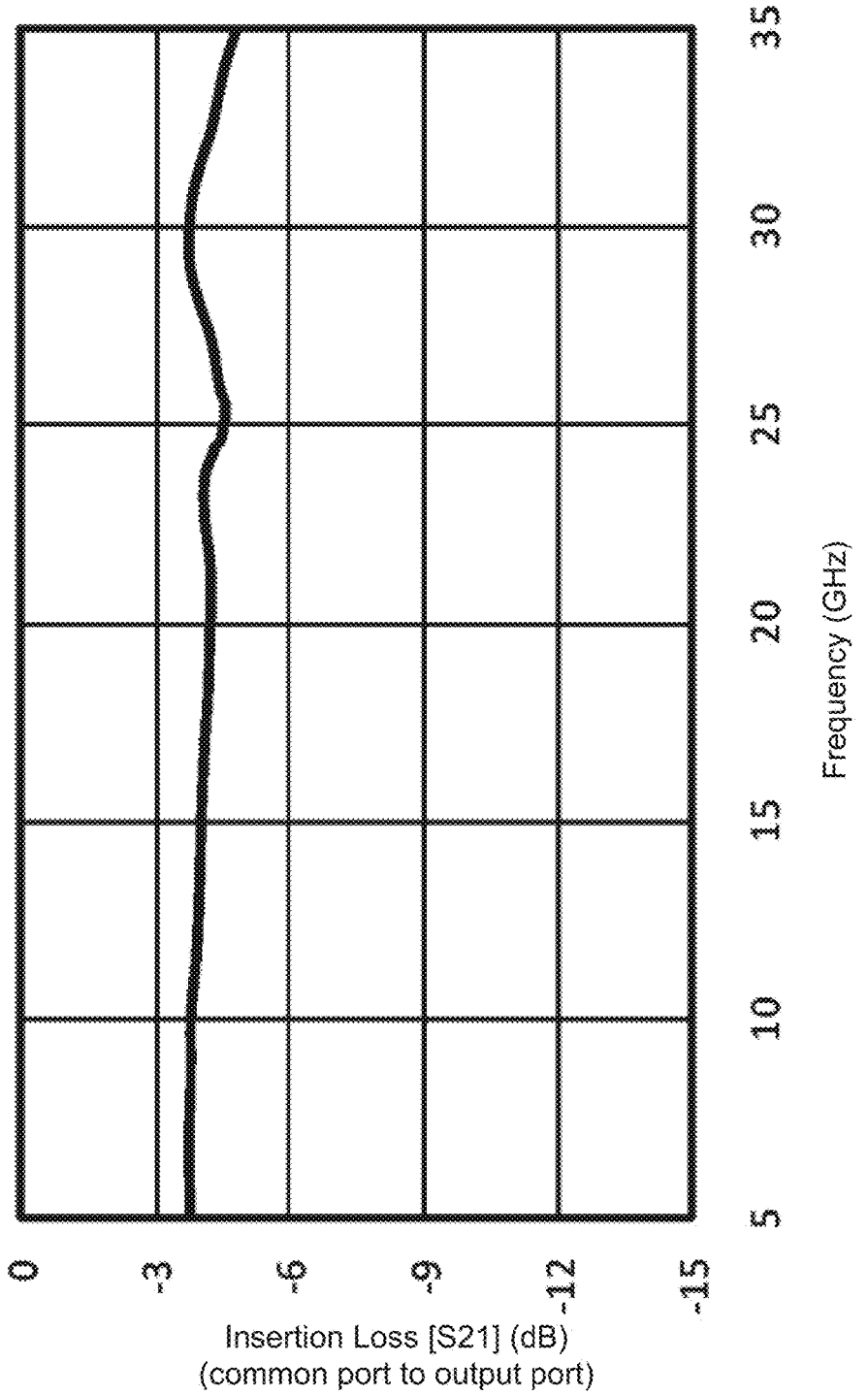
FIG. 28 illustrates a graph of insertion loss vs. frequency for a prior art Marki model PD-0535SM Wilkinson power divider.
Figure 29:
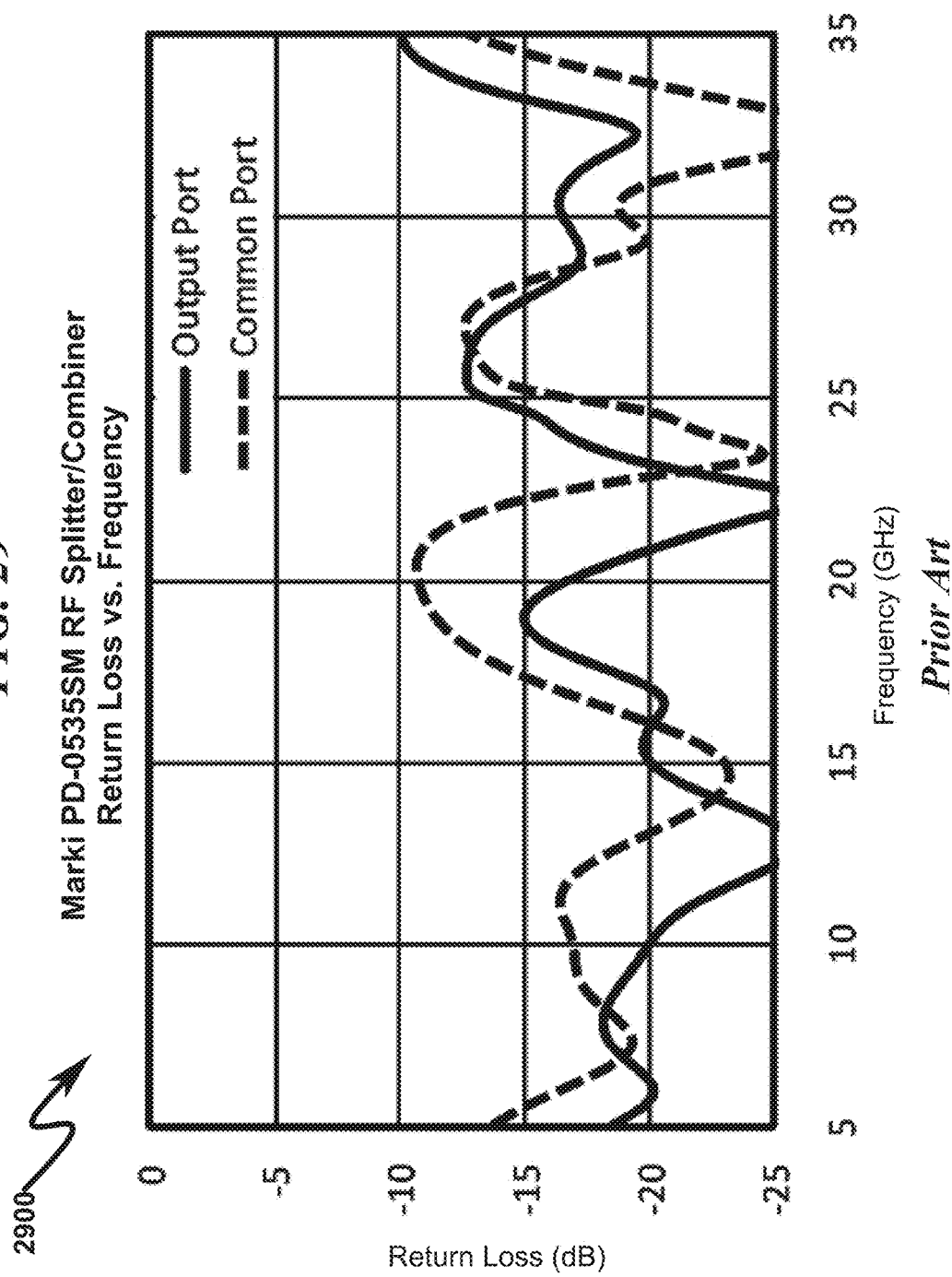
FIG. 29 illustrates a graph of return loss vs. frequency for a prior art Marki model PD-0535SM Wilkinson power divider.
Figure 30:
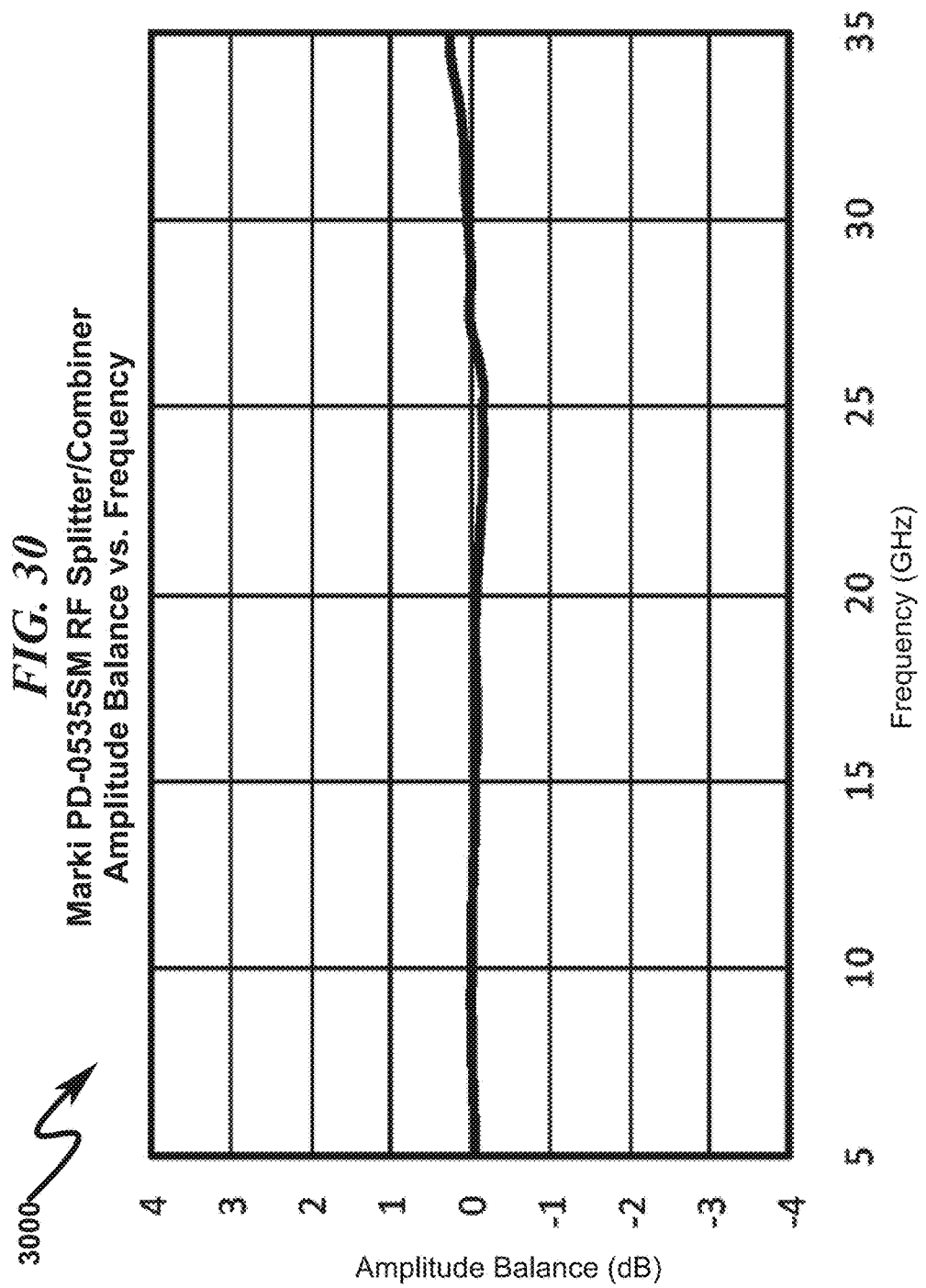
FIG. 30 illustrates a graph of amplitude balance vs. frequency for a prior art Marki model PD-0535SM Wilkinson power divider.
Figure 31:
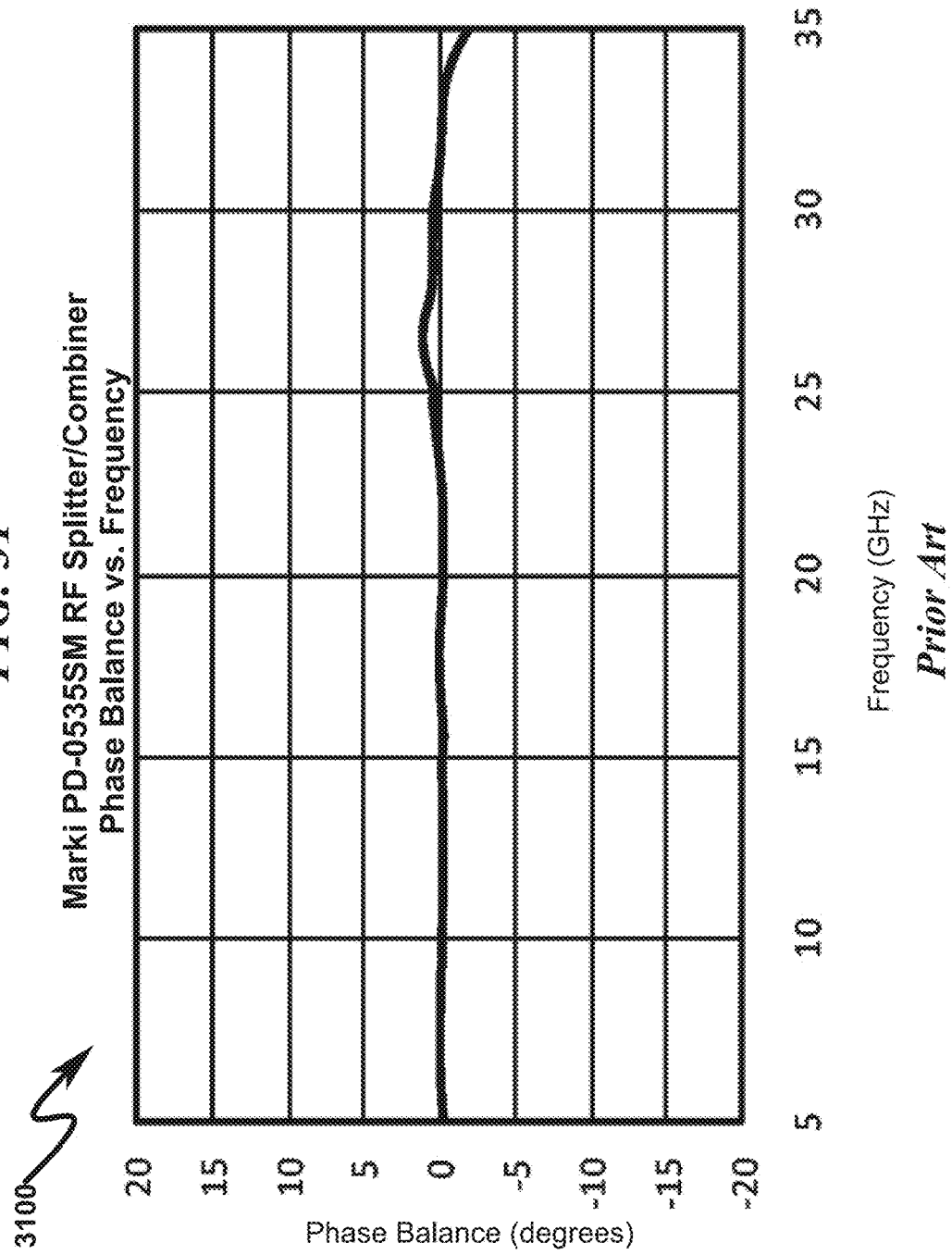
FIG. 31 illustrates a graph of phase balance vs. frequency for a prior art Marki model PD-0535SM Wilkinson power divider.
Figure 32:
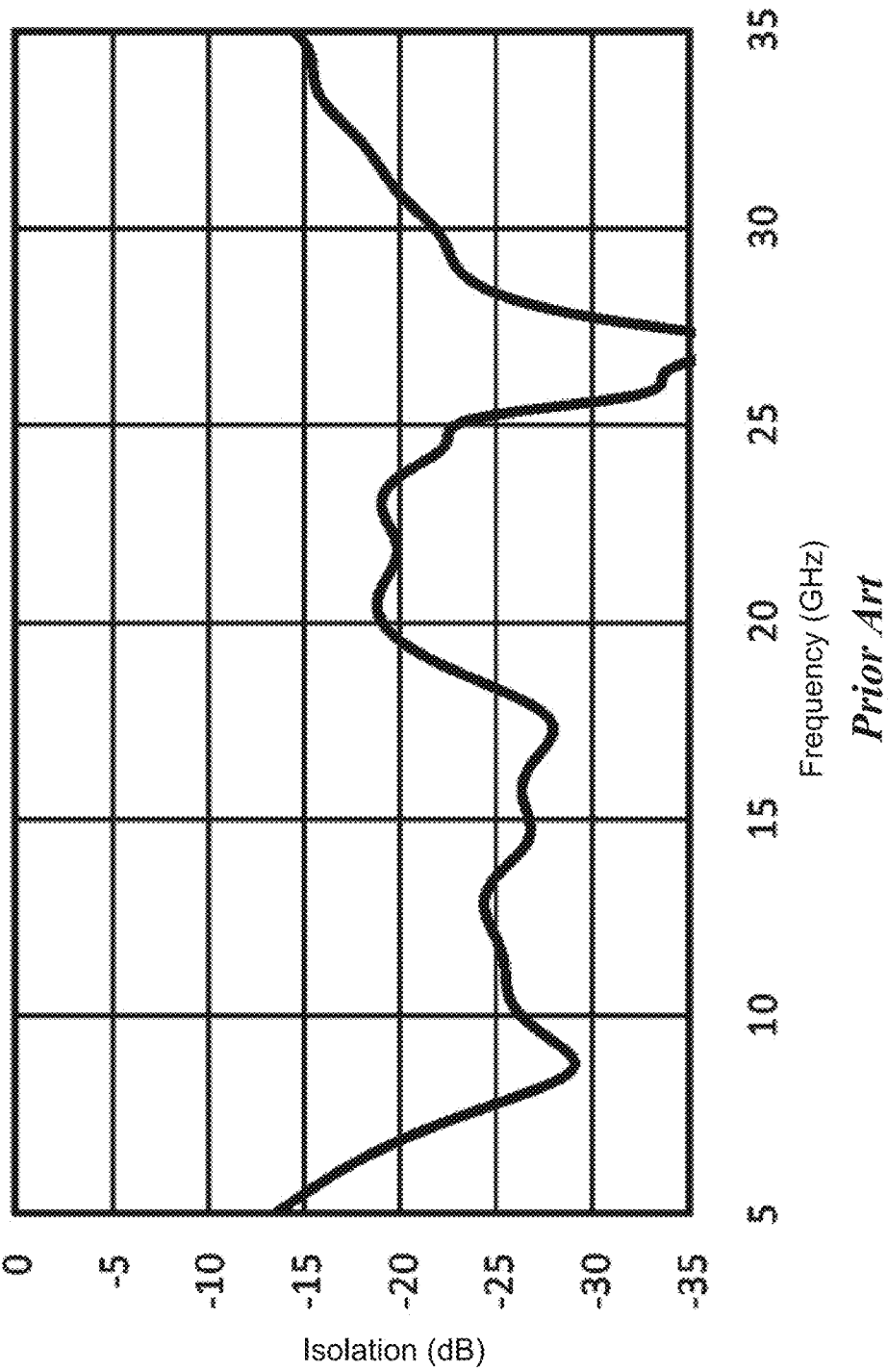
FIG. 32 illustrates a graph of isolation vs. frequency for a prior art Marki model PD-0R510 PD-0535SM power divider.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a RF SPLITTER/COMBINER SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Port Count Not Limitive

The present invention as depicted herein depicts RF splitter/combiner configurations adapted to 2-way splitter/combiners and 4-way splitter/combiners. One skilled in the art will recognize that power division may occur in additional power-of two configurations by nesting the RF splitter/combiner configurations depicted herein.

Substrate Not Limitive

While the teachings of the present invention may be optimally implemented using a PCB substrate of varying types, the present invention does not limit the invention to PCB substrates but may in some circumstances also be fabricated using integrated circuit (IC) or monolithic microwave integrated circuit (MMIC) manufacturing techniques.

With respect to PCB fabrication, the present invention specifically anticipates the use of a substrate selected from a group consisting of: FR-4 fiberglass resin (glass-reinforced epoxy laminate printed circuit board (PCB)); ROGERS CORPORATION model RT/DUROID® 5870 brand glass microfiber reinforced PTFE composite laminate; ROGERS CORPORATION model RT/DUROID® 5880 brand glass microfiber reinforced PTFE composite laminate; ROGERS CORPORATION model RT/DUROID® 6002 brand glass microfiber reinforced PTFE composite laminate; ROGERS CORPORATION model RT/DUROID® 6006 brand glass microfiber reinforced PTFE composite laminate; ROGERS CORPORATION model RT/DUROID® 6010 brand glass microfiber reinforced PTFE composite laminate; ROGERS CORPORATION series RO3000® model RO3003 brand PTFE/ceramic laminate; ROGERS CORPORATION series RO3000® model RO3006 brand PTFE/ceramic laminate; ROGERS CORPORATION series RO3000® model RO3010 brand PTFE/ceramic laminate; ROGERS CORPORATION model RO3203 brand woven glass laminate; ROGERS CORPORATION series RO3000® model RO3210 brand woven glass laminate; and polytetrafluoroethylene (PTFE).

PCB trace material may be any conducting material but copper is preferred and may in some circumstances be plated with silver and/or gold.

Impedance Match Not Limitive

While the present invention specifically anticipates that impedance matching may be implemented using the present invention using 50 ohm matching and 75 ohm matching networks, the present invention makes no limitation on the exact value of the impedance match target for a particular application of the present invention.

Input/Output Not Limitive

The present invention describes a RF splitter/combiner that incorporates passive components in its construction. As such, the device presented may be configured as a RF splitter having one RF input and two or more RF outputs or as a RF combiner having two or more RF inputs and one RF combined output. The present invention makes no limitation on whether the claimed device may be used as a RF power splitter and/or a RF power combiner. Thus, the terms INPUT and OUTPUT and their relative number must be determined by the application context in which the device is utilized and as such should be given their broadest reasonable definition within the scope of the claimed invention.

Connectorized/Surface Mount Construction Not Limitive

The present invention provides for a RF splitter/combiner that may be used in both connectorized assembly forms as well as surface-mount configurations. This feature distinguishes the present invention from the prior art which is configured for either one or the other of these form factors. Thus, the present invention while depicted in surface mount form may take on a connectorized form factor in some preferred embodiments.

Exemplary Construction (3300)-(4000)

Figure 33:
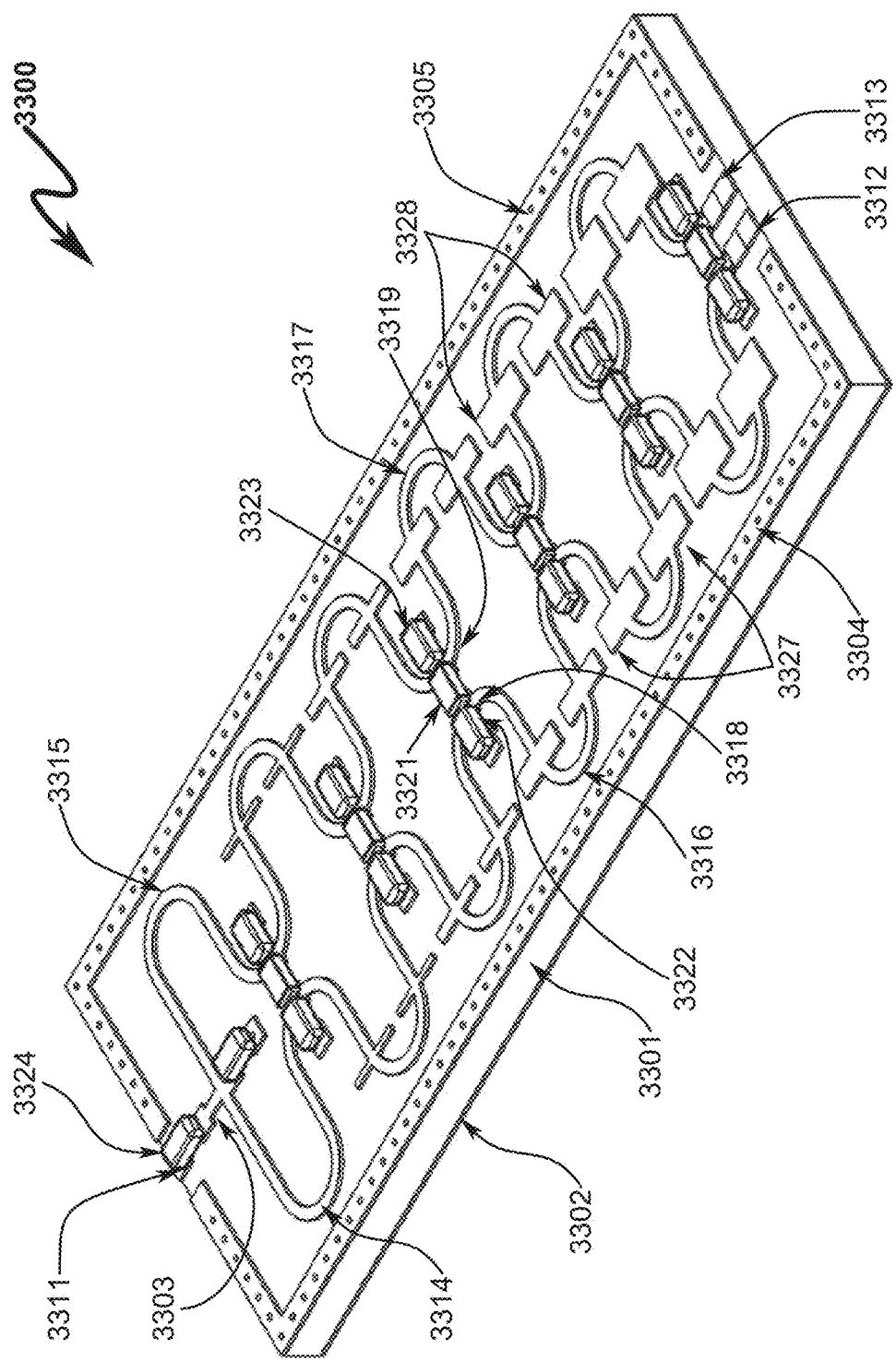
FIG. 33 illustrates a top right front perspective view of a preferred exemplary invention embodiment implemented as a 2-way RF splitter/combiner.
Figure 34:
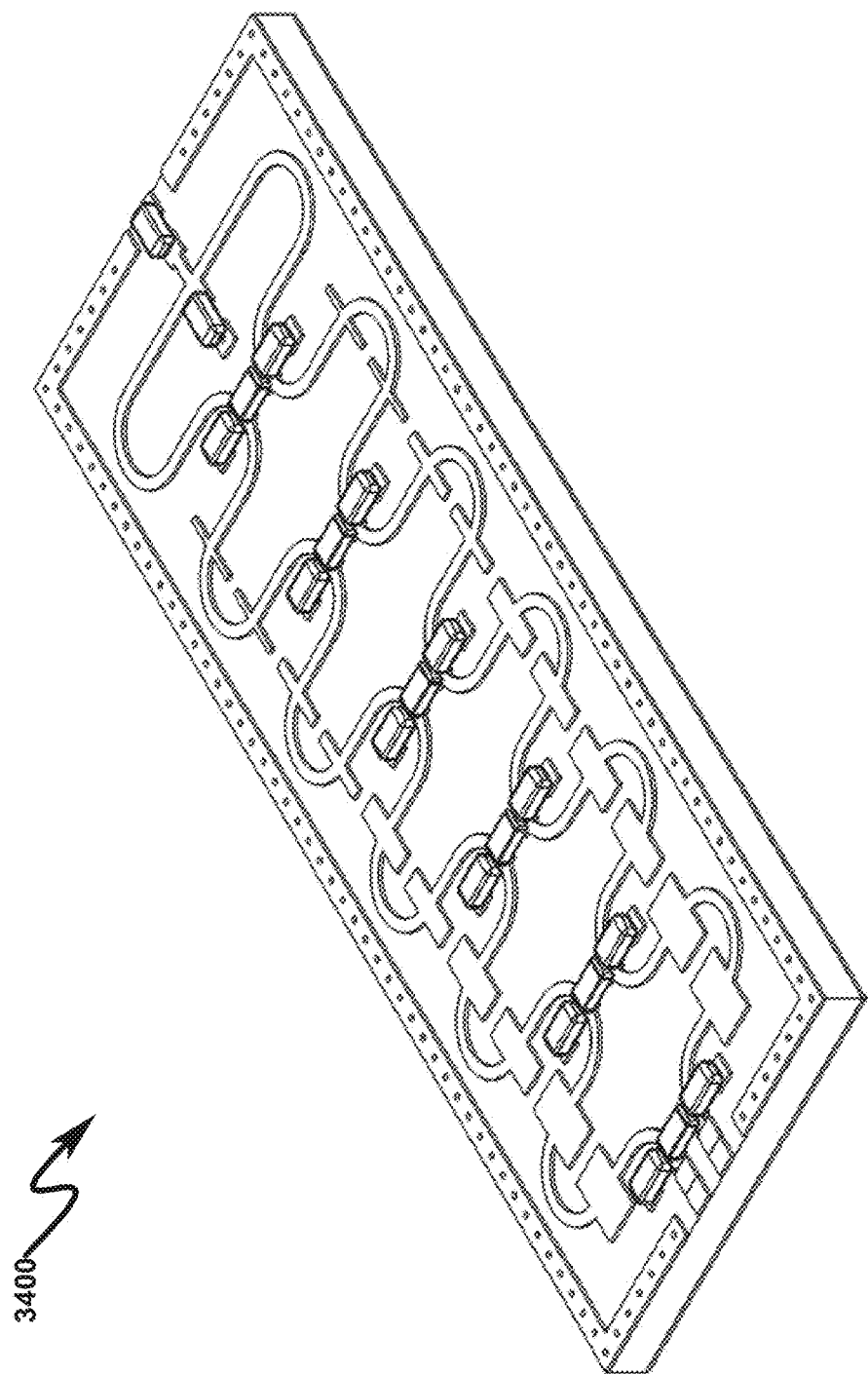
FIG. 34 illustrates a top right rear perspective view of a preferred exemplary invention embodiment implemented as a 2-way RF splitter/combiner.
Figure 35:
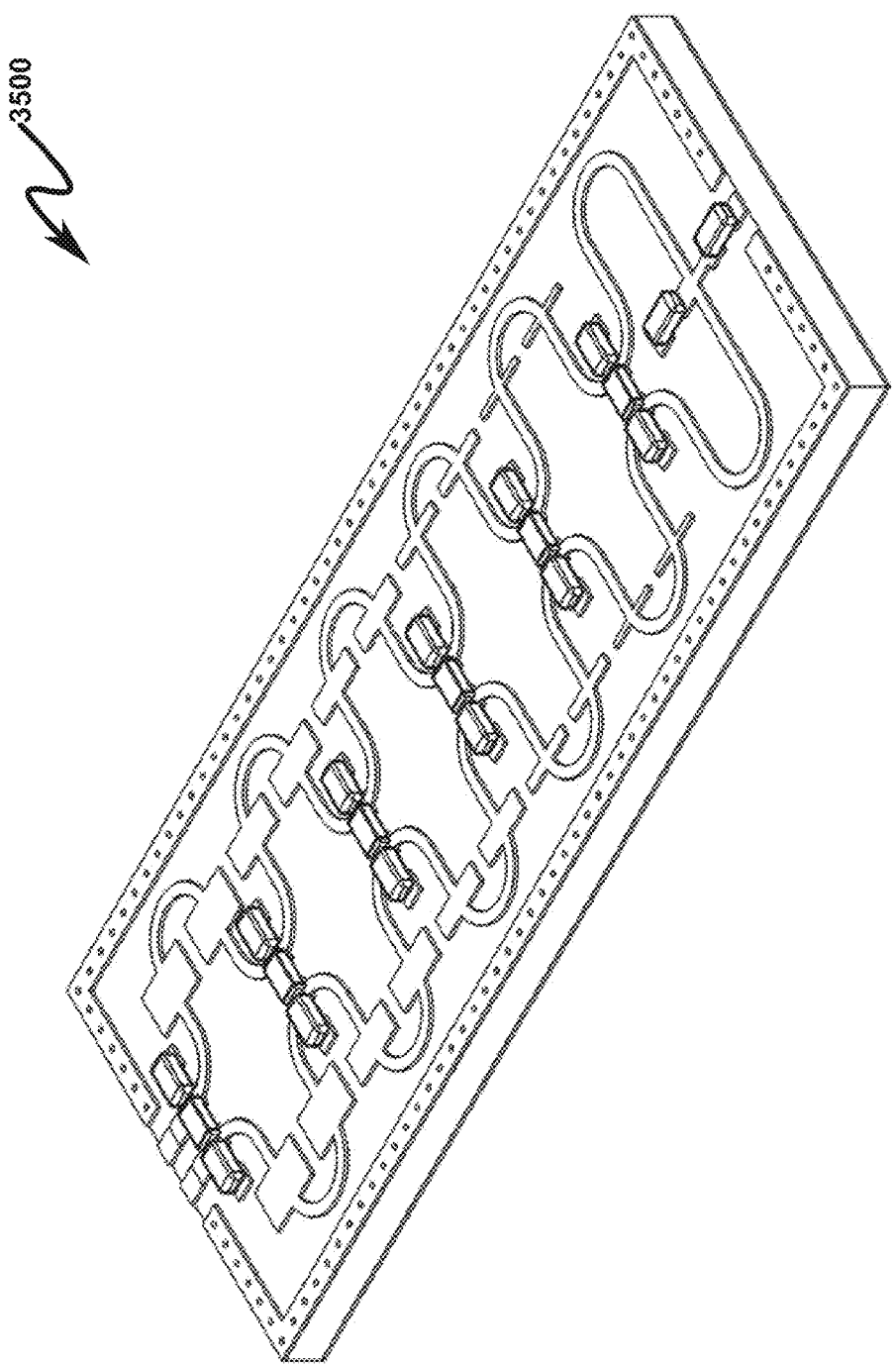
FIG. 35 illustrates a top left rear perspective view of a preferred exemplary invention embodiment implemented as a 2-way RF splitter/combiner.
Figure 36:
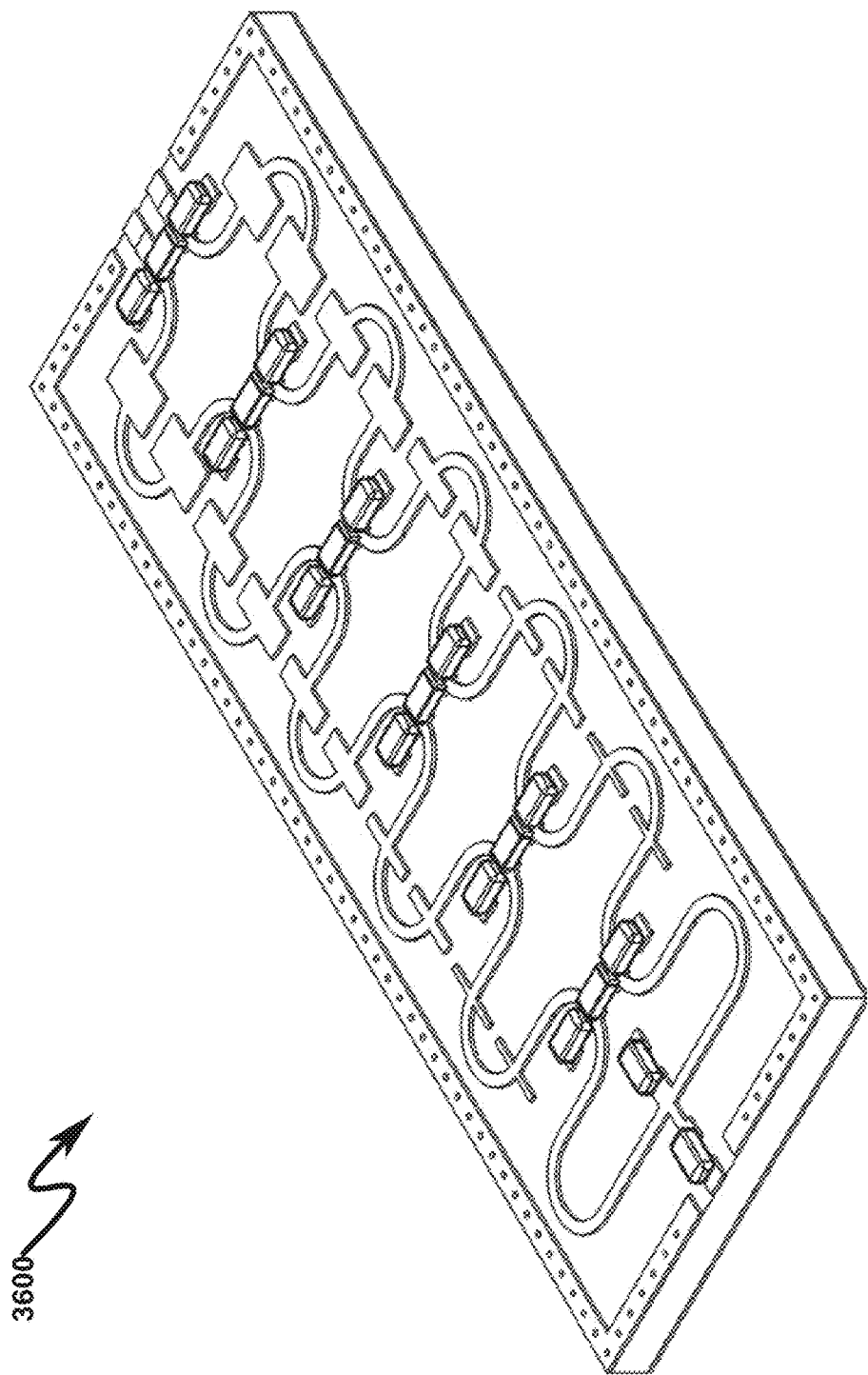
FIG. 36 illustrates a top left front perspective view of a preferred exemplary invention embodiment implemented as a 2-way RF splitter/combiner.
Figure 37:
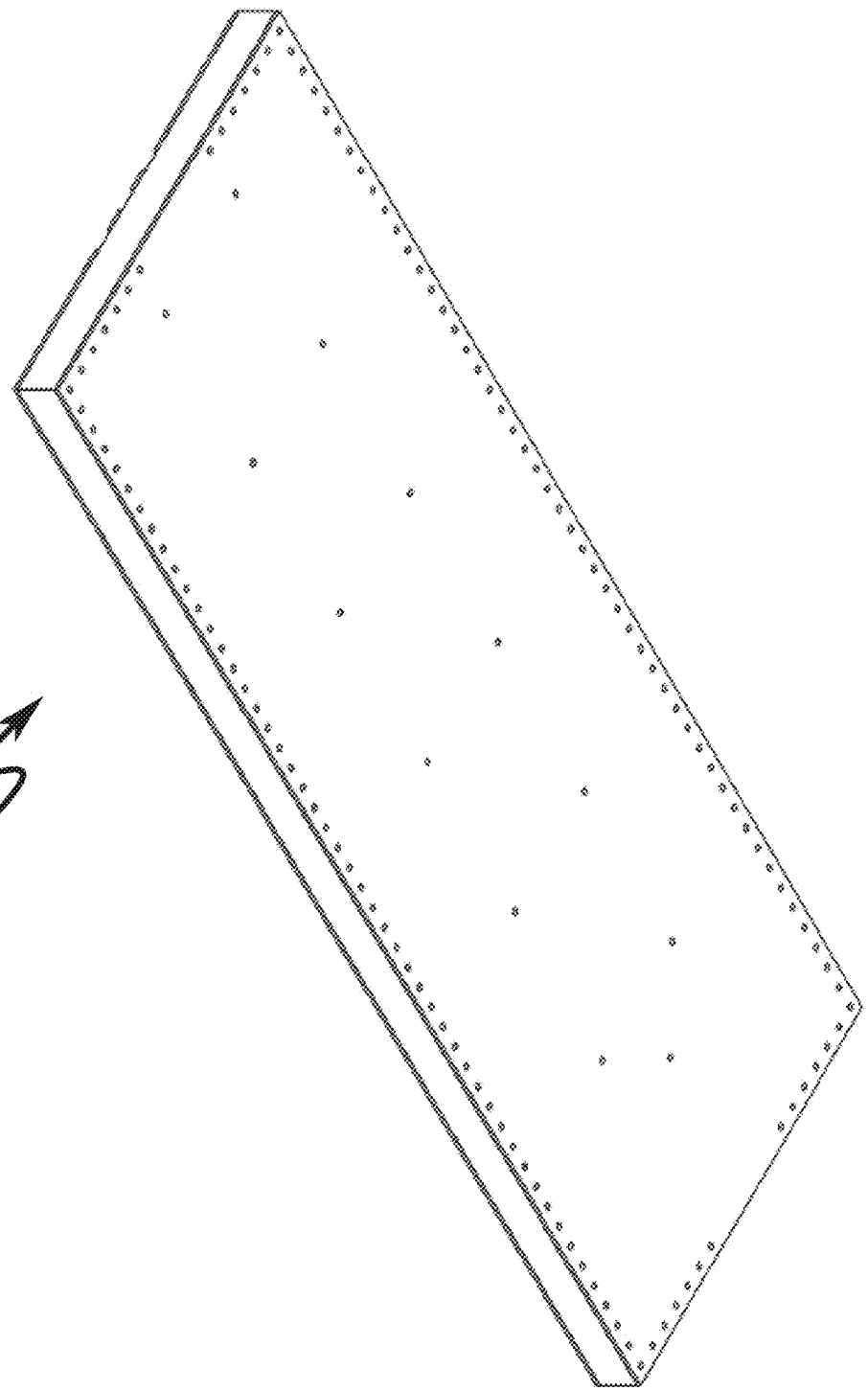
FIG. 37 illustrates a bottom right front perspective view of a preferred exemplary invention embodiment implemented as a 2-way RF splitter/combiner.
Figure 38:
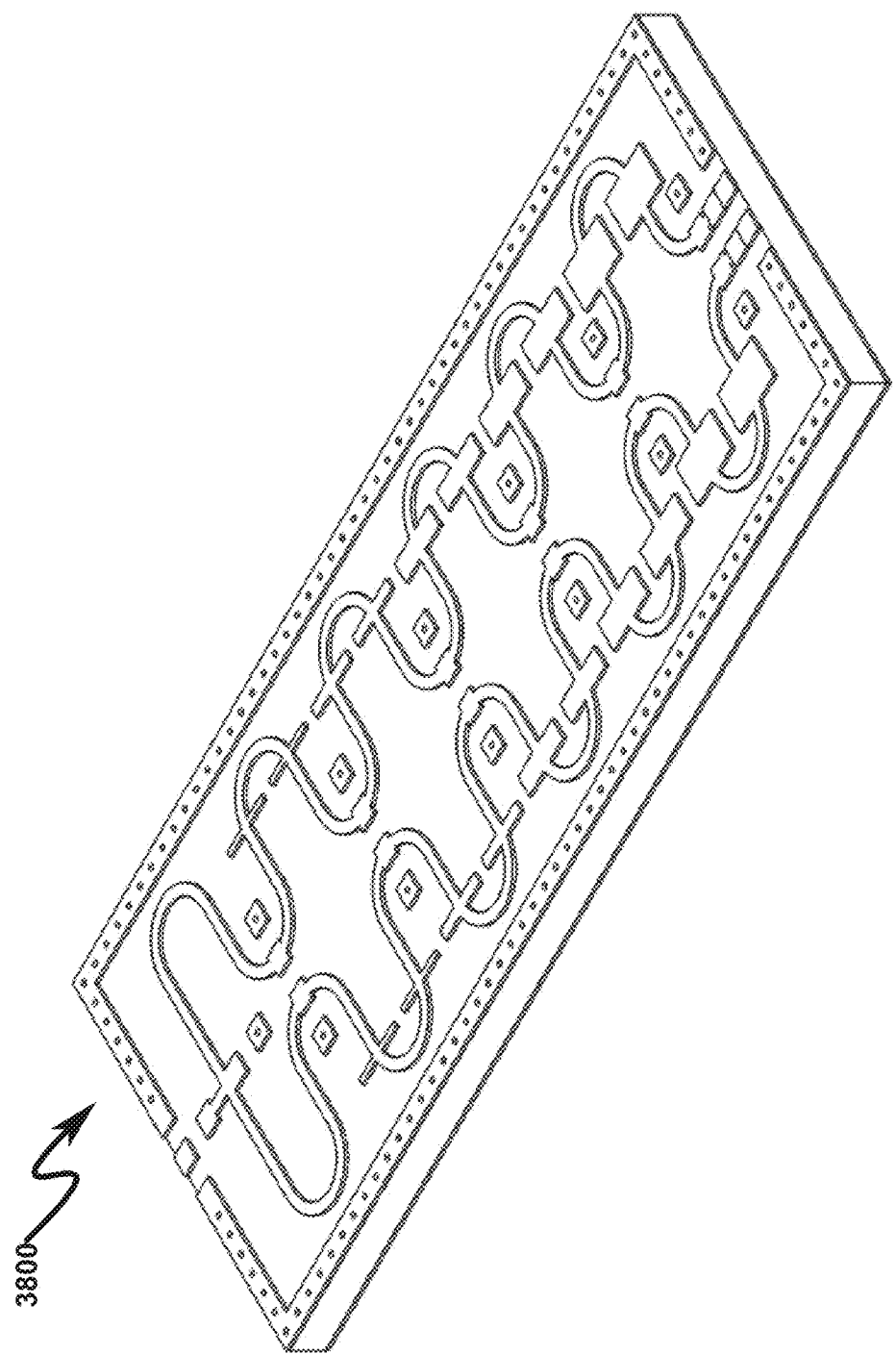
FIG. 38 illustrates a top view of a preferred exemplary invention embodiment implemented as a 2-way RF splitter/combiner.
Figure 40:
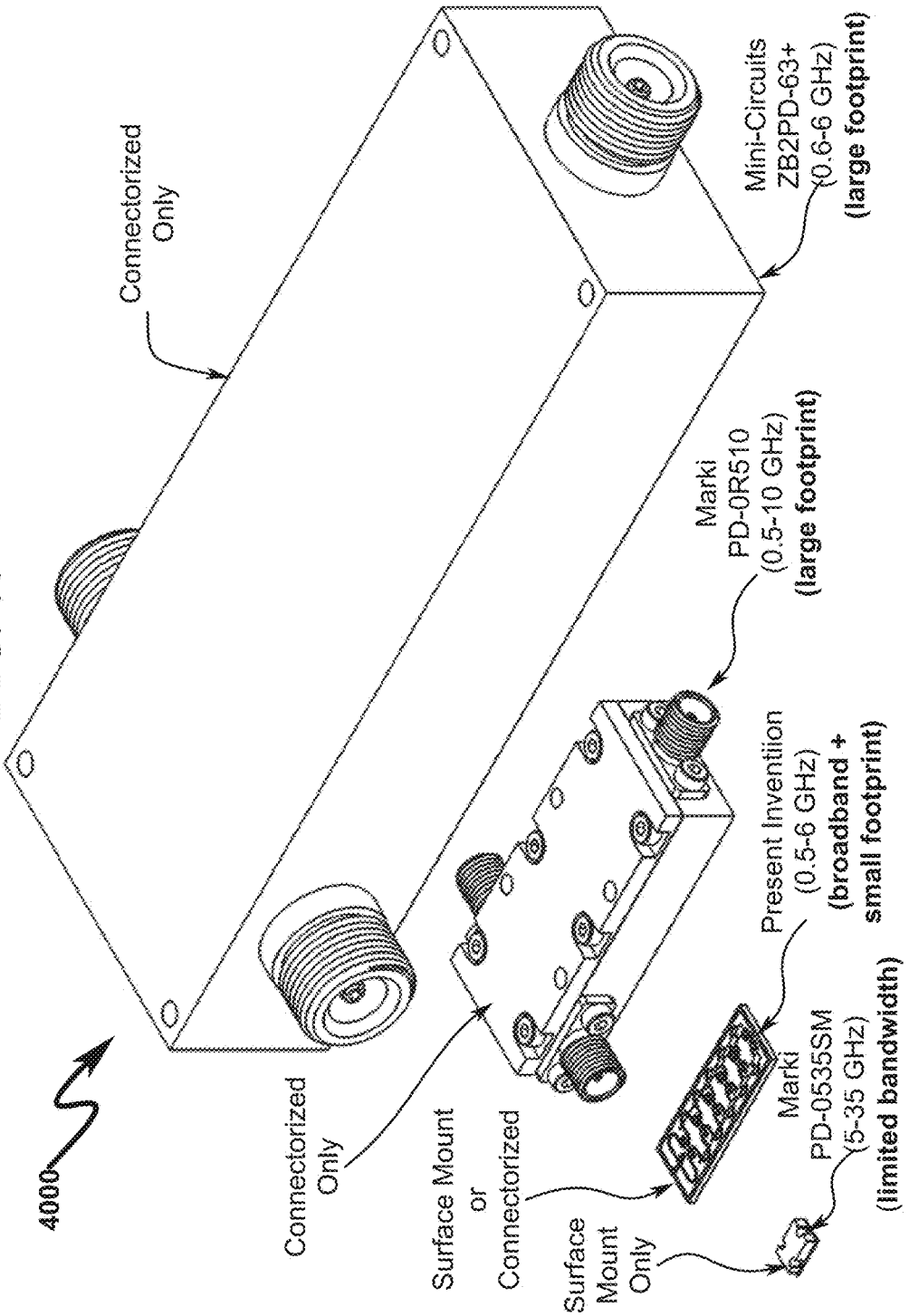
FIG. 40 illustrates a size and bandwidth comparison between the present invention and the prior art Mini-Circuits model ZB2PD-63+, Marki model PD-0R510, and Marki model PD-0535SM Wilkinson power dividers.

Basic concepts taught by the present invention may be best illustrated by the exemplary preferred embodiment depicted in FIG. 33 (3300)-FIG. 40 (4000). The perspective views illustrated provide an exemplary construction of a 2-way splitter/combiner. Here an exemplary 2-way RF power splitter/combiner is illustrated by example and comprises a signal routine substrate (SRS) (3301) that is sandwiched between a bottom reference plane (BRP) (3302) and conducting signal traces comprising a top signal plane (TSP) (3303). As illustrated the TSP (3303) may incorporate a ground reference perimeter (3304, 3305) that is electrically coupled to the BRP (3302).

Figure 39:
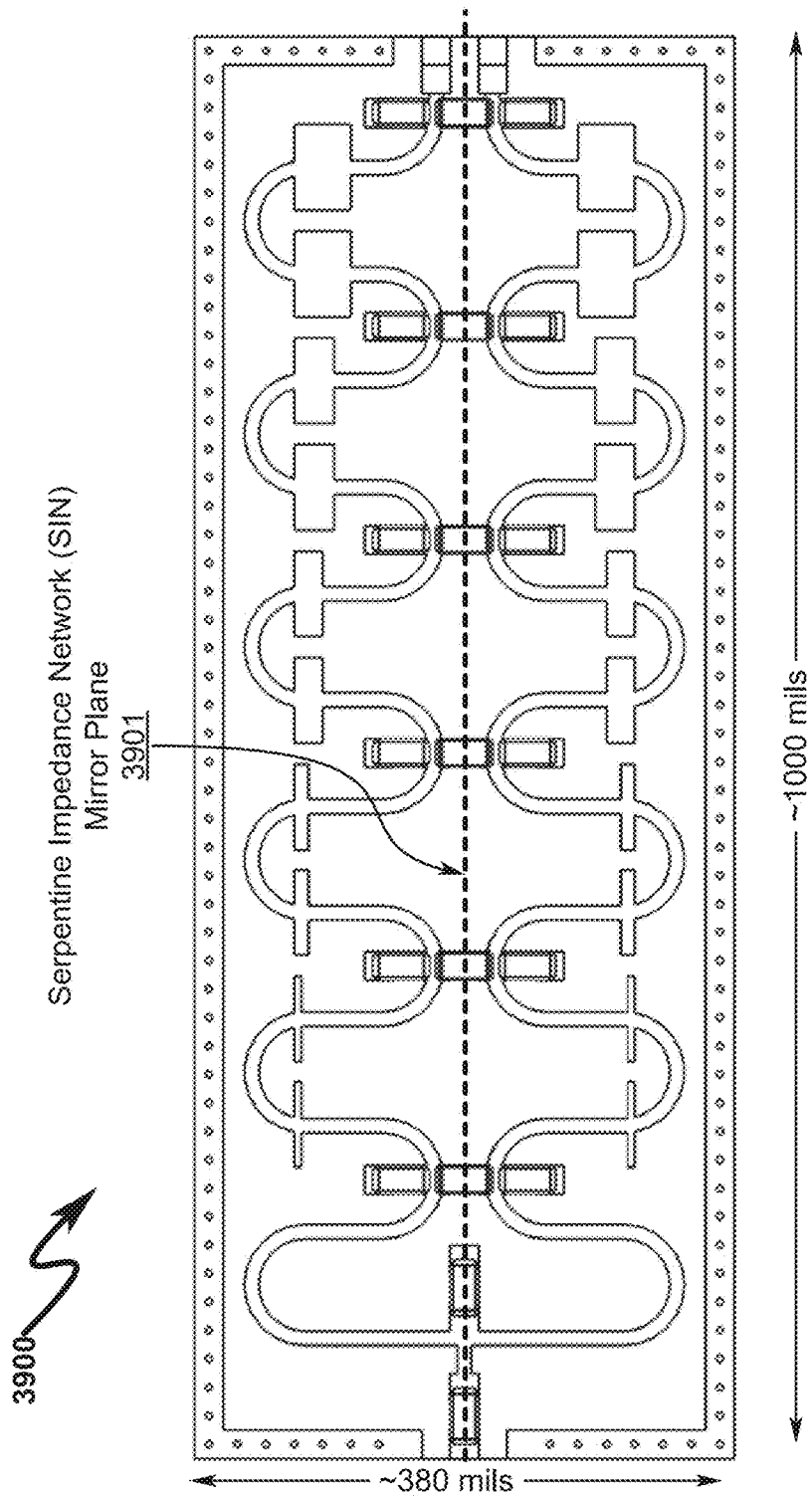
FIG. 39 illustrates a top right front perspective view of a preferred exemplary invention embodiment implemented as a 2-way RF splitter/combiner depicting the PCB layout with passive components hidden.

This exemplary 2-way splitter/combiner is configured with a RF input port (RIP) (3311) configured to accept a RF signal input (RSI) (or alternatively emit a combined RF output) and an RF output port (ROP) structures (3312, 3313) configured to emit the split RF output (or alternatively accept two RF signal inputs) and a first mirrored serpentine impedance network (FSN) (3314) and a second mirrored serpentine impedance network (SSN) (3315) that interconnect the RIP (3311) and ROP (3312, 3313). The serpentine impedance network mirror plane is depicted in FIG. 39 (3900, 3901). Within each mirrored serpentine impedance network (3314, 3315) a series of positive serpentine node (PSN) (3316, 3317) traces and negative serpentine node (NSN) (3318, 3319) traces are formed. While illustrated having a uniform trace width, the FSN (3314) and SSN (3315) (collectively the serpentine impedance network (SIN)) may have differing trace widths along its path. These differing trace widths may be used to provide for enhanced impedance matching of the SIN between the RIP (3311) and ROP (3312, 3313) structures.

Bridging the negative serpentine node (NSN) (3318, 3319) traces is a bridge passive component (BPC) (3321) that is typically a resistor. This BPC serves as an isolation device between the (NSN) (3318, 3319) traces and their corresponding SIN trace elements. Each negative serpentine node (NSN) (3318, 3319) trace is also coupled to the bottom reference plane (BRP) (3302) with a passive electrical component (3322, 3323) that is typically a capacitor. The RIP (3311) and ROP (3312, 3313) may be coupled to the first mirrored serpentine impedance network (FSN) (3314) and second mirrored serpentine impedance network (SIN) (3315) via one or more passive components (not shown) (typically resistors and/or capacitors) for impedance matching purposes in some circumstances. Within each serpentine impedance network (SIN) (3314, 3315) there are a series of paired coupling traces (PCT) (3327, 3328) positioned between the (PSN) (3316, 3317) and the (NSN) (3318, 3319) whose function is to perform transformer coupling along the SIN (3314, 3315) and also provide for impedance matching of the RIP (3311) and ROP (3312, 3313).

While the exemplary embodiment depicted in FIG. 33 (3300)-FIG. 40 (4000) is sized at approximately 380 mils by 1000 mils and utilizes conventional 0402-sized (approximately 0.040 inch×0.020 inch or 1 mm×0.5 mm) components, one skilled in the art will recognize that the exact size of the system will be highly application dependent. In many preferred embodiment applications 0201-sized components or smaller may be utilized. Furthermore, while each SIN shown comprises six PSN/NSN pairs, the exact number of PSN/NSN pairs is only required to be greater than one and is not a limiting feature of the invention. The sizing and positioning of the PCT traces and their exact number will be dependent on the application and is only given by example in this illustration.

A size comparison of the present invention as exemplified by this illustrative construction and the corresponding prior art is generally depicted in FIG. 40 (4000). Here it can be seen that the present invention is considerably more space efficient that all other 2-way splitter/combiners illustrated while simultaneously exhibiting functioning behavior over a broadband frequency range (500 MHz-6000 MHz). The prior art components depicted either have large volume footprints or lack broadband functionality. Furthermore, the present invention is amenable to construction using either connectorized assembly or surface mount construction. The prior art illustrated is amenable only to one or the other of these construction types.

Exemplary 2-Way Layout and Performance (4100)-(4800)

Figure 41:
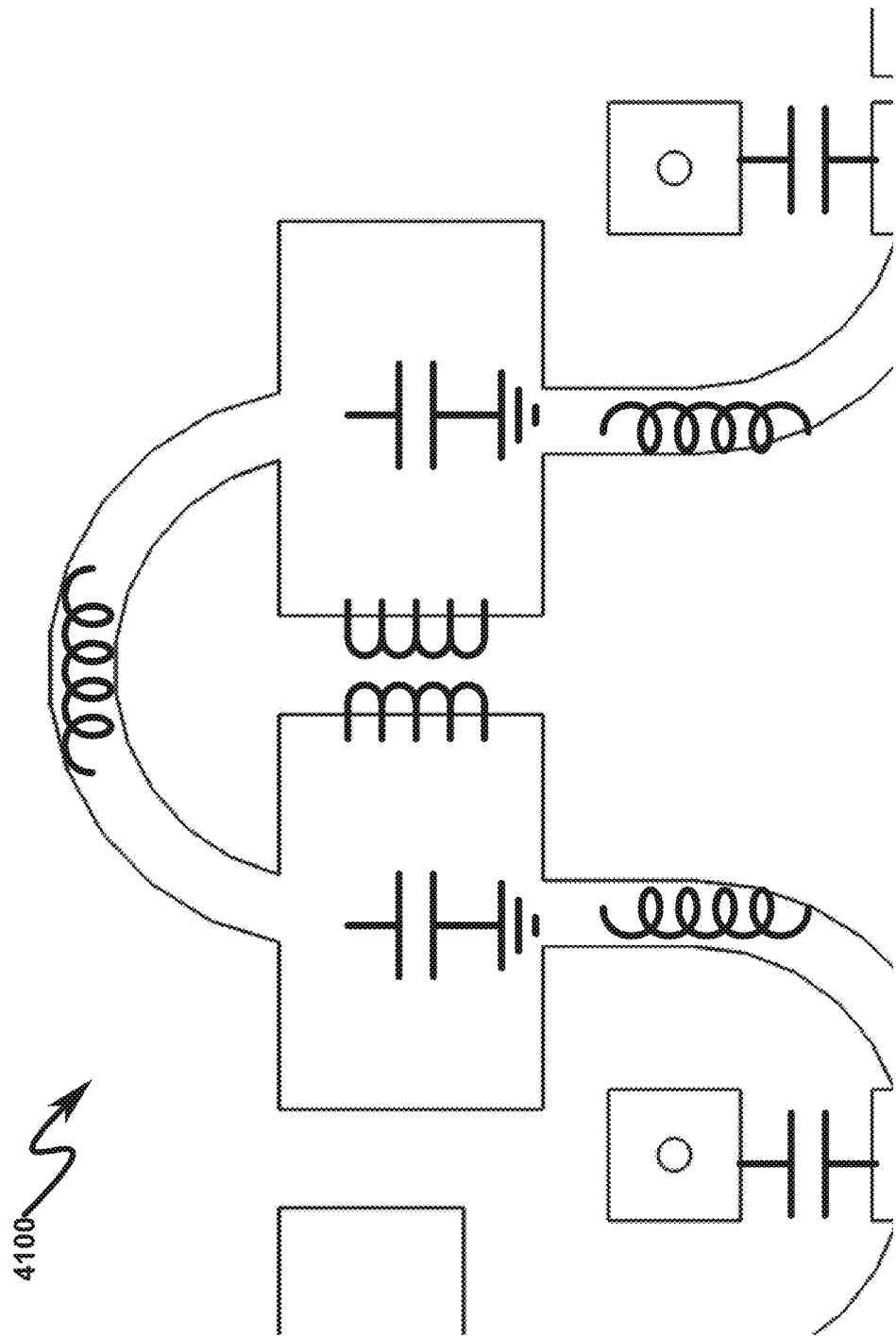
FIG. 41 illustrates an exemplary PCB detail layout for a preferred exemplary invention 2-way RF splitter/combiner embodiment and depicts a lumped element model associated with the PCB layout.
Figure 44:
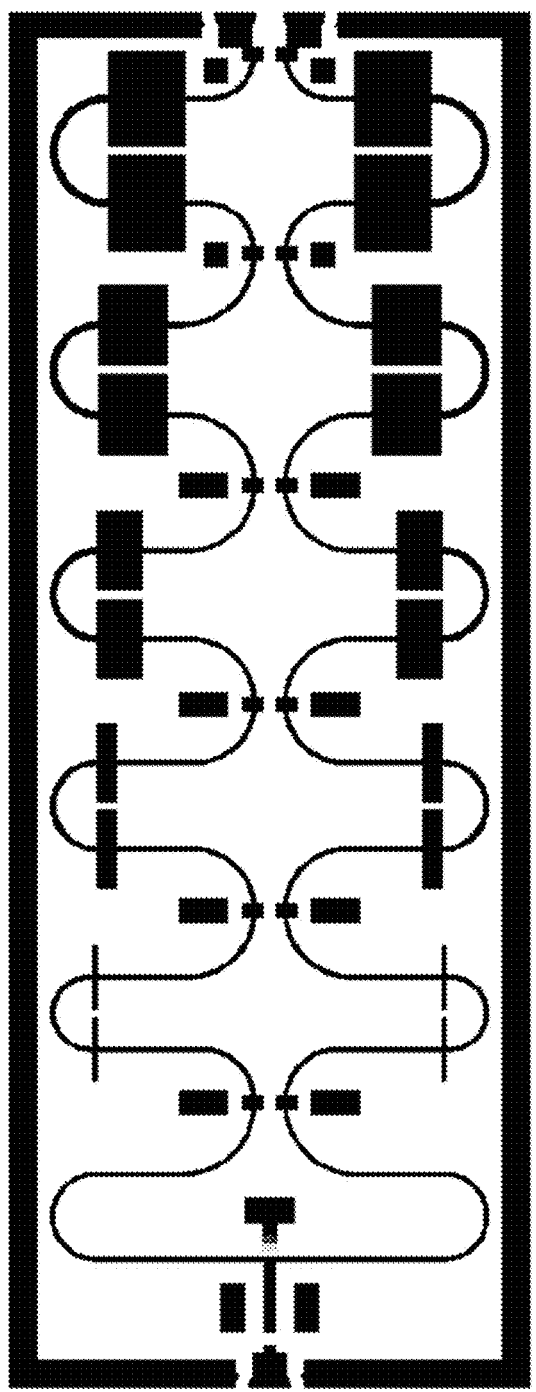
FIG. 44 illustrates an exemplary PCB detail layout for a preferred exemplary invention 2-way RF splitter/combiner embodiment.
Figure 48:
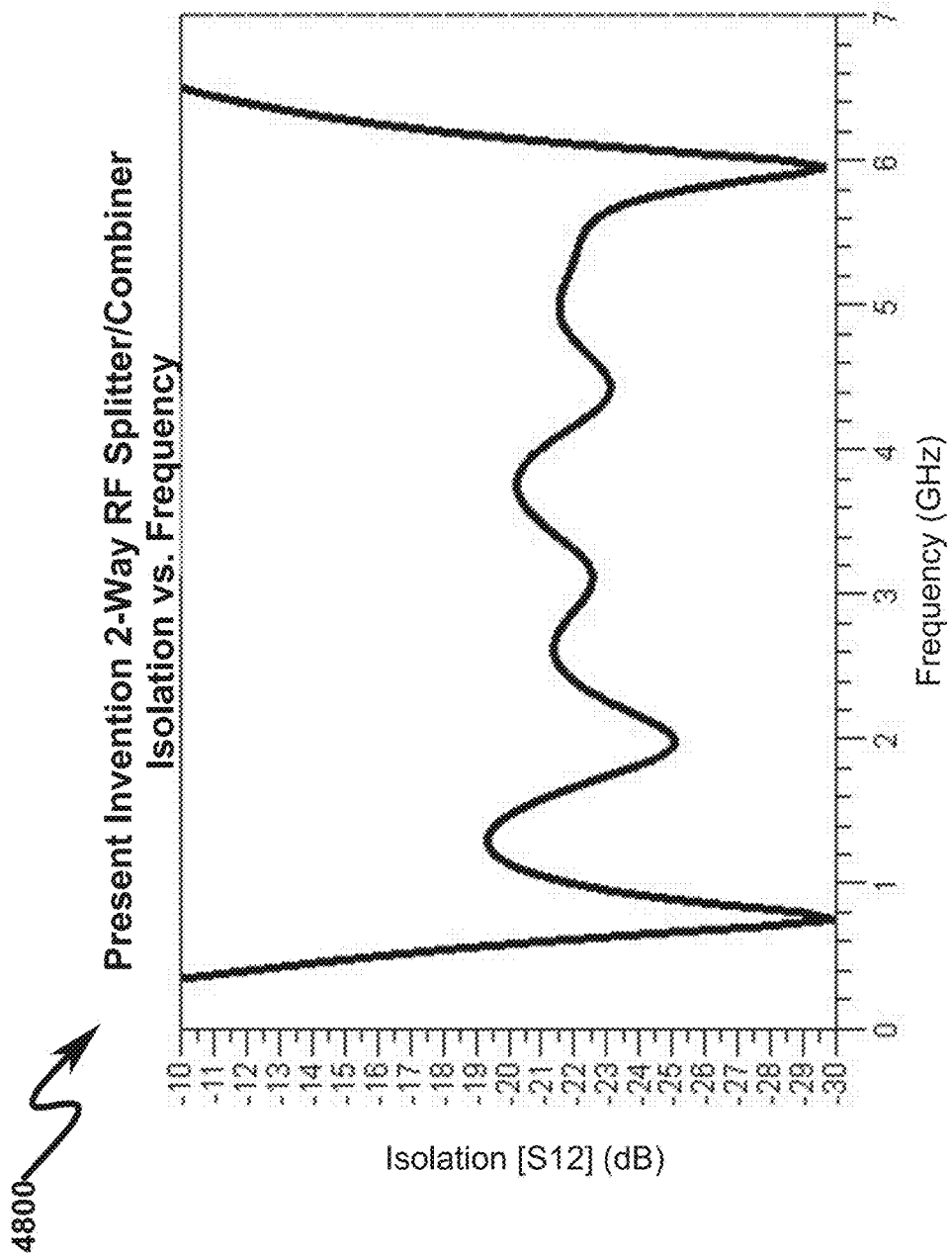
FIG. 48 illustrates a graph of isolation vs. frequency for a preferred exemplary invention 2-way RF splitter/combiner embodiment.

An exemplary 2-way splitter/combiner PCB layout illustrating the concepts of the invention is generally depicted in FIG. 41 (4100)-FIG. 44 (4400). Simulated performance of this configuration is depicted in FIG. 45 (4500)-FIG. 48 (4800).

FIG. 41 (4100) illustrates a lumped element model for the SIN and PCT structure. Here it can be seen that the serpentine traces ace like inductors, the fat coupled trace lines (PCT) act like capacitors and a transformer or, more accurately, like a RF coupler. There are also distributed transmission line effects simultaneously occurring within each SIN. Thus, the operation of the SIN is a simultaneous combination of lumped, distributed, and transformer/coupler-like characteristics which form the overall response characteristics of the RF splitter/combiner. This is in contrast to the Wilkinson power divider in which each section only represents an impedance transformation.

Figure 42:
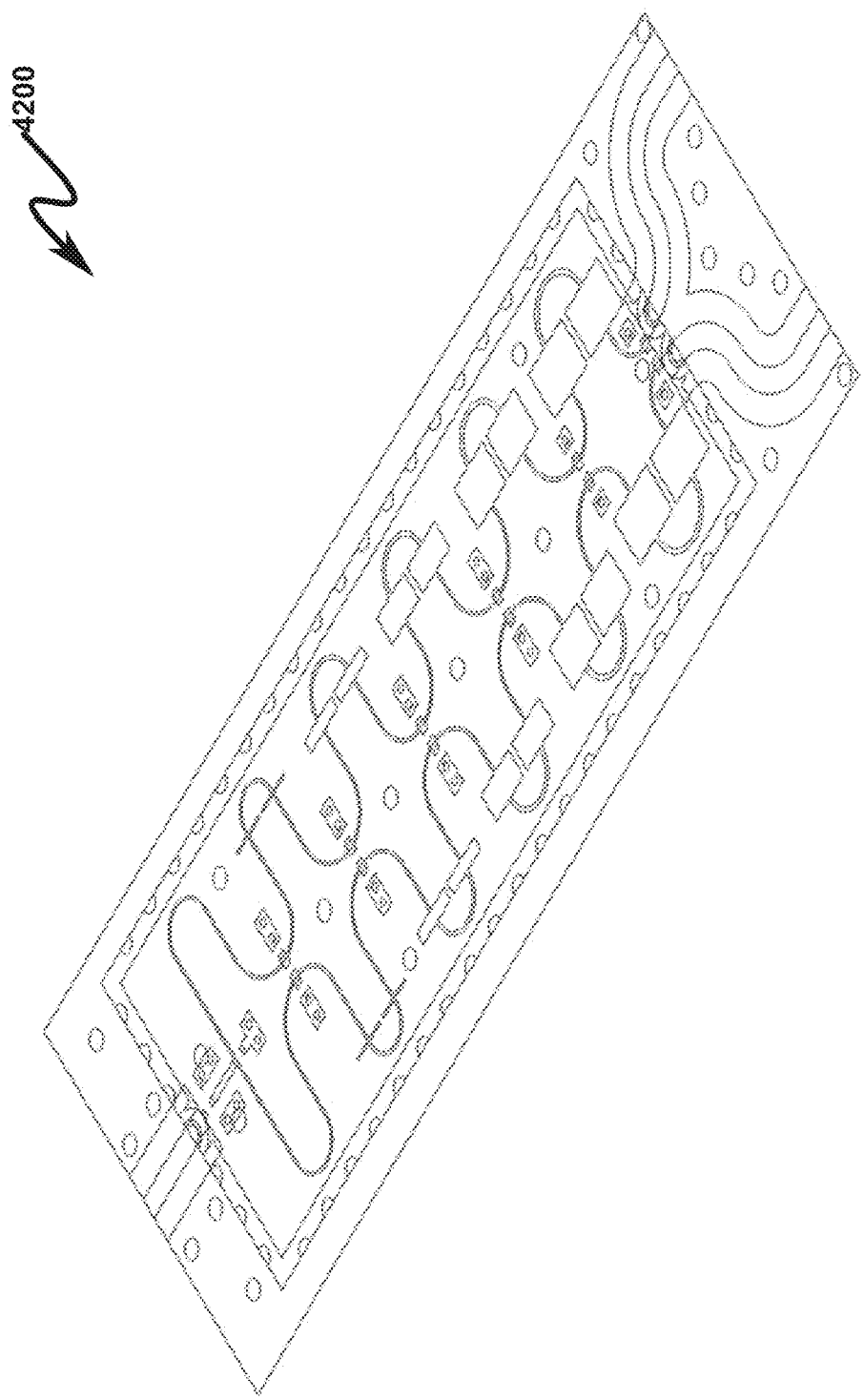
FIG. 42 illustrates a perspective view of an exemplary PCB layout for a preferred exemplary invention 2-way RF splitter/combiner embodiment mated to a transition interface structure.
Figure 43:
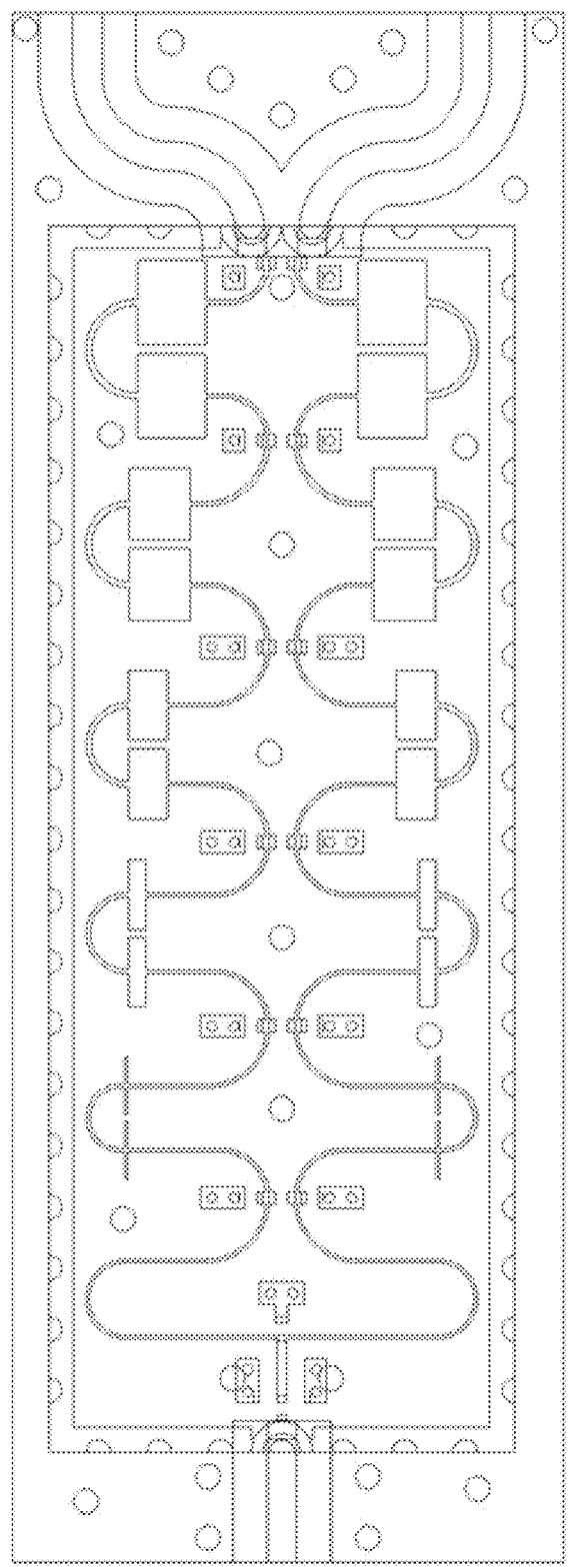
FIG. 43 illustrates a top view of an exemplary PCB layout for a preferred exemplary invention 2-way RF splitter/combiner embodiment mated to a transition interface structure.

It is instructive to note from the exemplary PCB layout provided in FIG. 41 (4100)-FIG. 44 (4400) that the SIN trace elements are not necessarily uniformly wide along the entire length of the serpentine trace. This differential in trace width may be used to impedance match the RIP and ROP along the length of the SIN. The views of FIG. 42 (4200)-FIG. 43 (4300) illustrate an exemplary 2-way RF splitter/combiner mated to an interface structure used to connect the RIP and ROP ports to the splitter/combiner. FIG. 44 (4300) provides additional detail of the RF splitter/combiner PCB layout and provides insight into the varying line widths of the serpentine structure.

Figure 45:
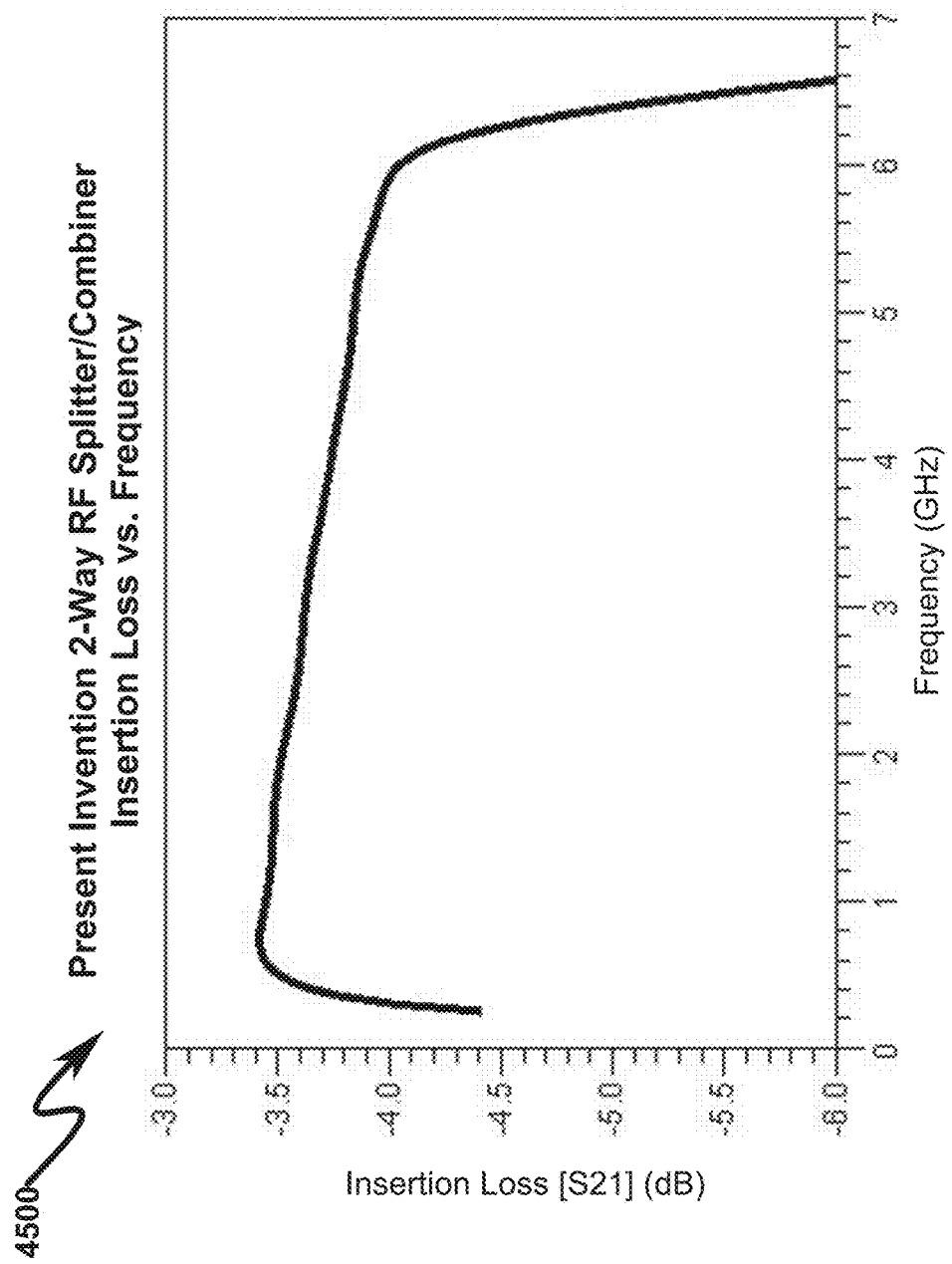
FIG. 45 illustrates a graph of insertion loss vs. frequency for a preferred exemplary invention 2-way RF splitter/combiner embodiment.
Figure 46:
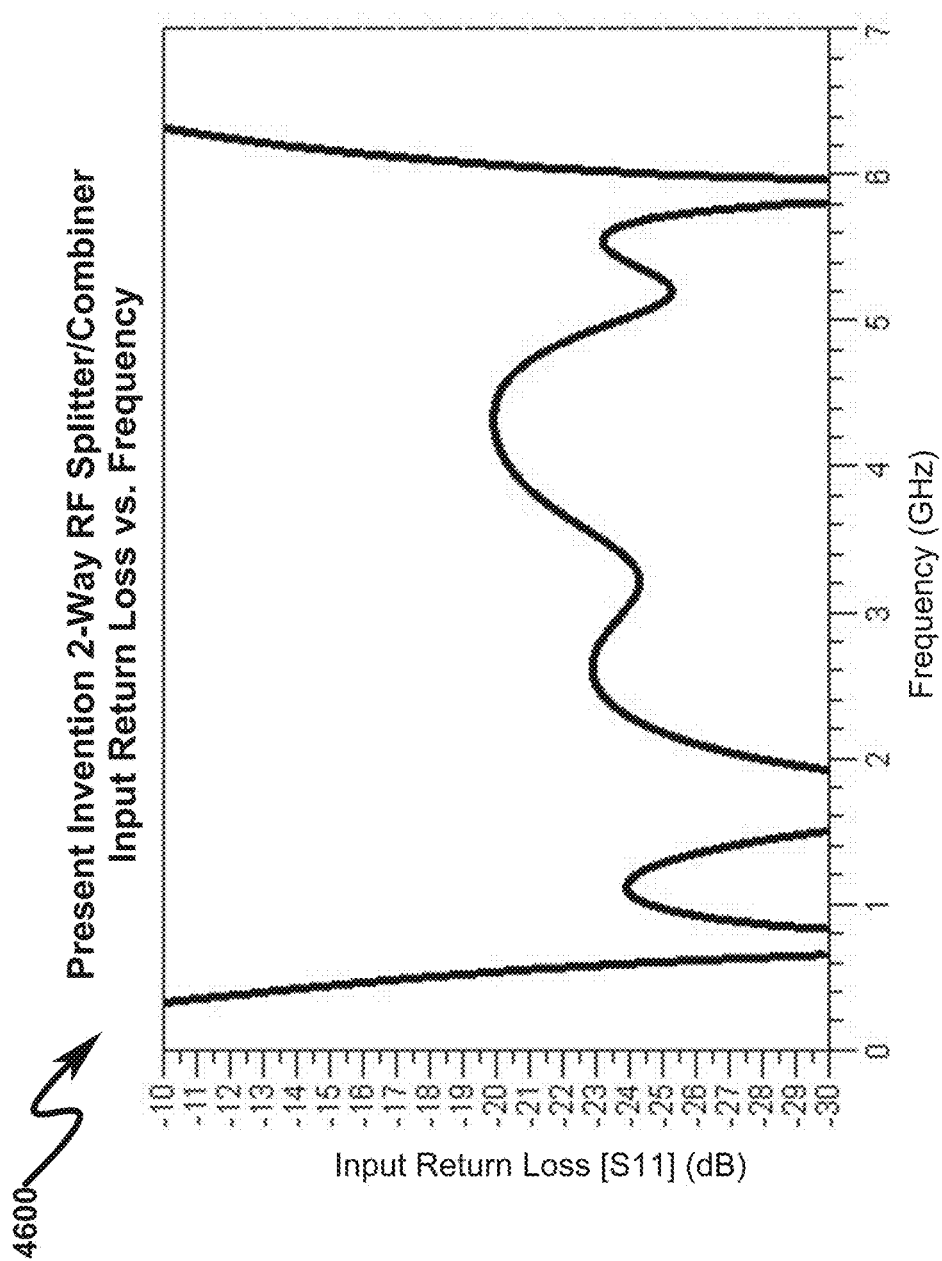
FIG. 46 illustrates a graph of input return loss vs. frequency for a preferred exemplary invention 2-way RF splitter/combiner embodiment.
Figure 47:
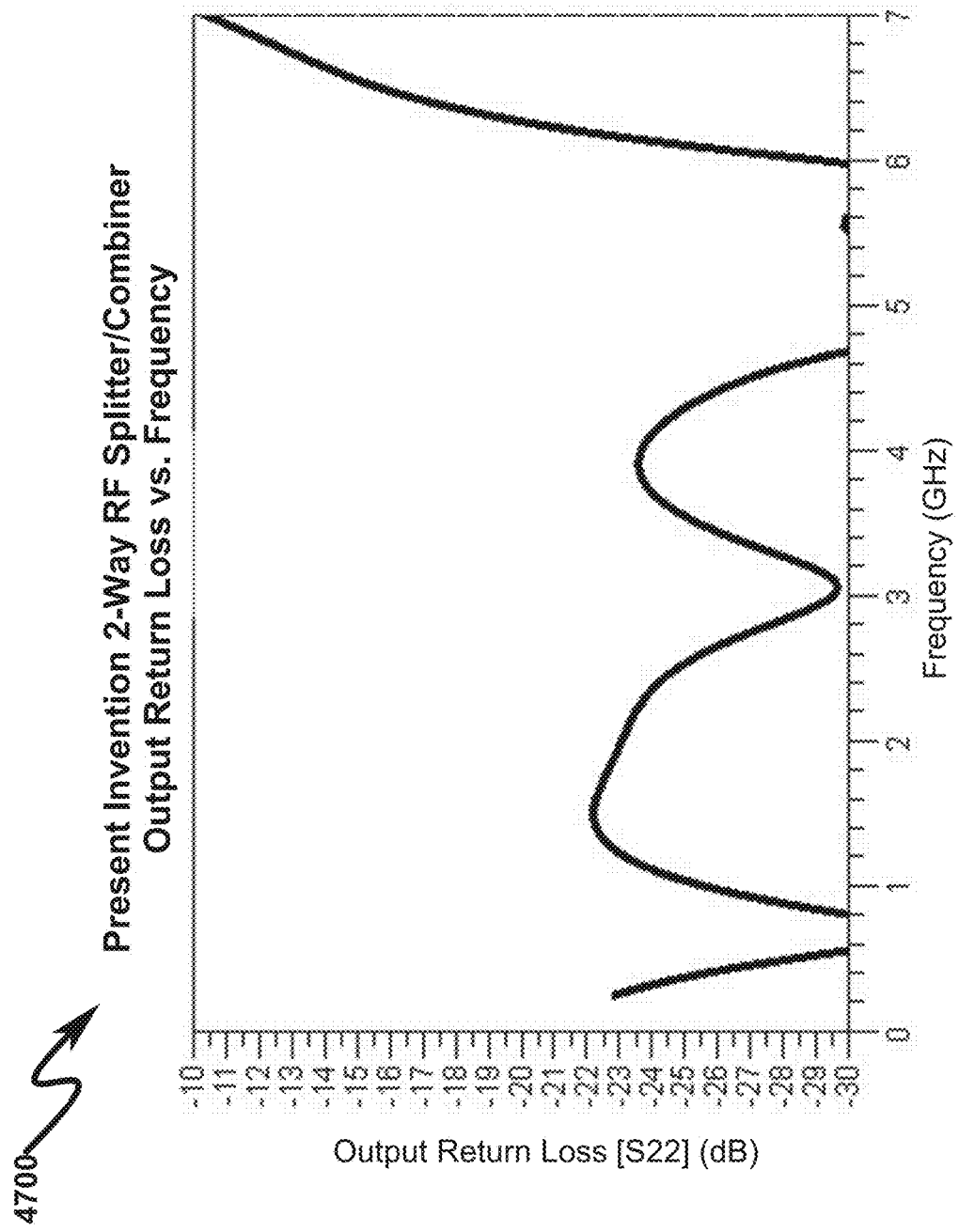
FIG. 47 illustrates a graph of output return loss vs. frequency for a preferred exemplary invention 2-way RF splitter/combiner embodiment.

Here it can be seen from FIG. 45 (4500) that the broadband performance of this exemplary invention embodiment is quite good and ranges from approximately 500 MHz to over 6 GHz. Input return loss (FIG. 46 (4600)) and output return loss (FIG. 47 (4700)) parameters are excellent as well as port isolation (FIG. 48 (4800)) such that the performance of the present invention as illustrated is comparable to the prior art devices that have been presented while at the same time drastically reducing the overall device volume footprint for the splitter/combiner.

Exemplary 4-Way RF Splitter/Combiner (4900)-(5600)

The 2-way RF splitter/combiner discussed above may be daisy-chained to provide for powers-of-two splitter/combiner configurations. Two examples of this daisy-chained construction are depicted in FIG. 49 (4900)-FIG. 52 (5200) and FIG. 53 (5300)-FIG. 56 (5600).

Figure 49:
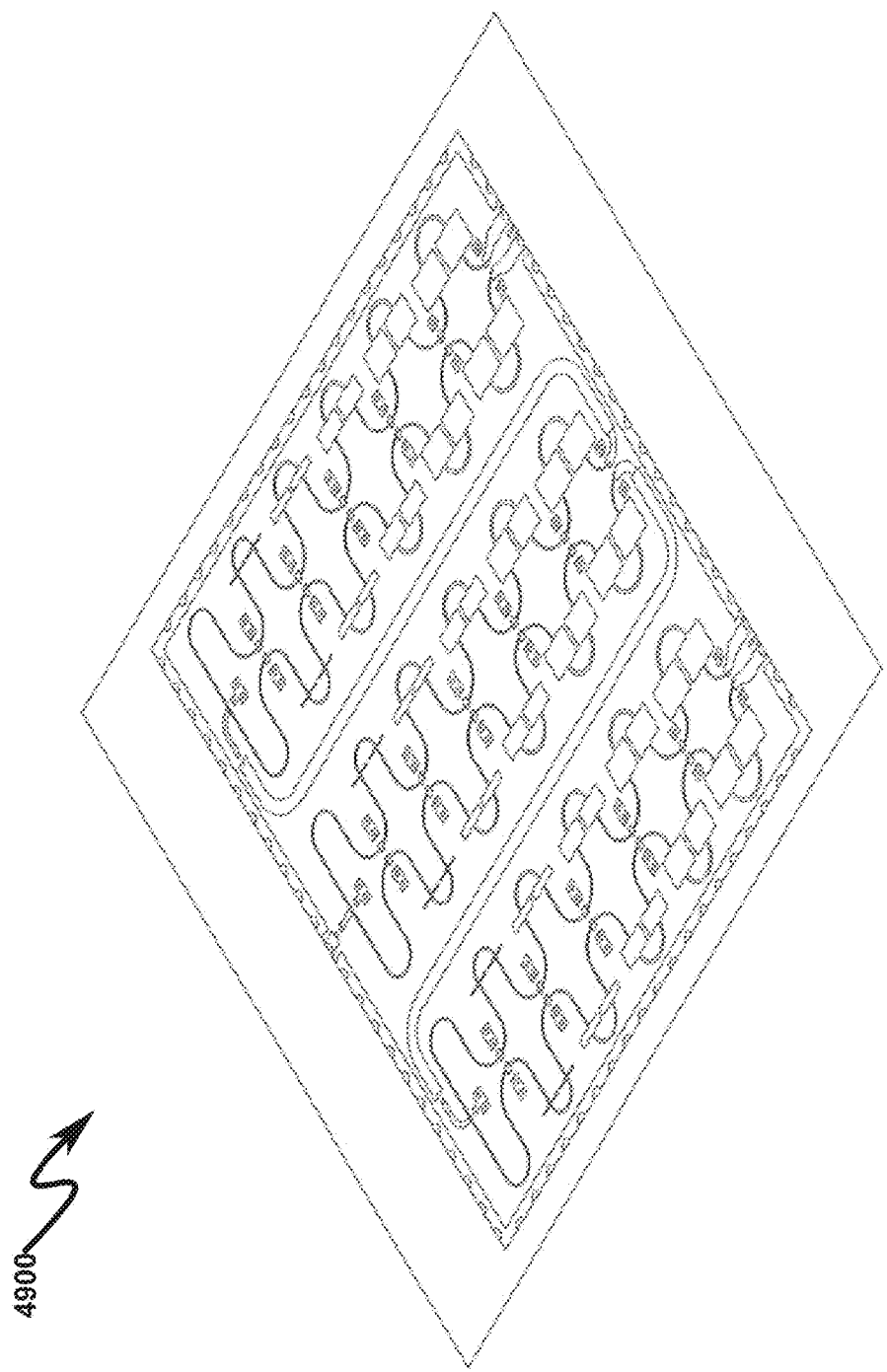
FIG. 49 illustrates a top PCB layout perspective view of a preferred exemplary RF 4-way splitter combiner invention embodiment having symmetric 2-way splitter orientations.
Figure 50:
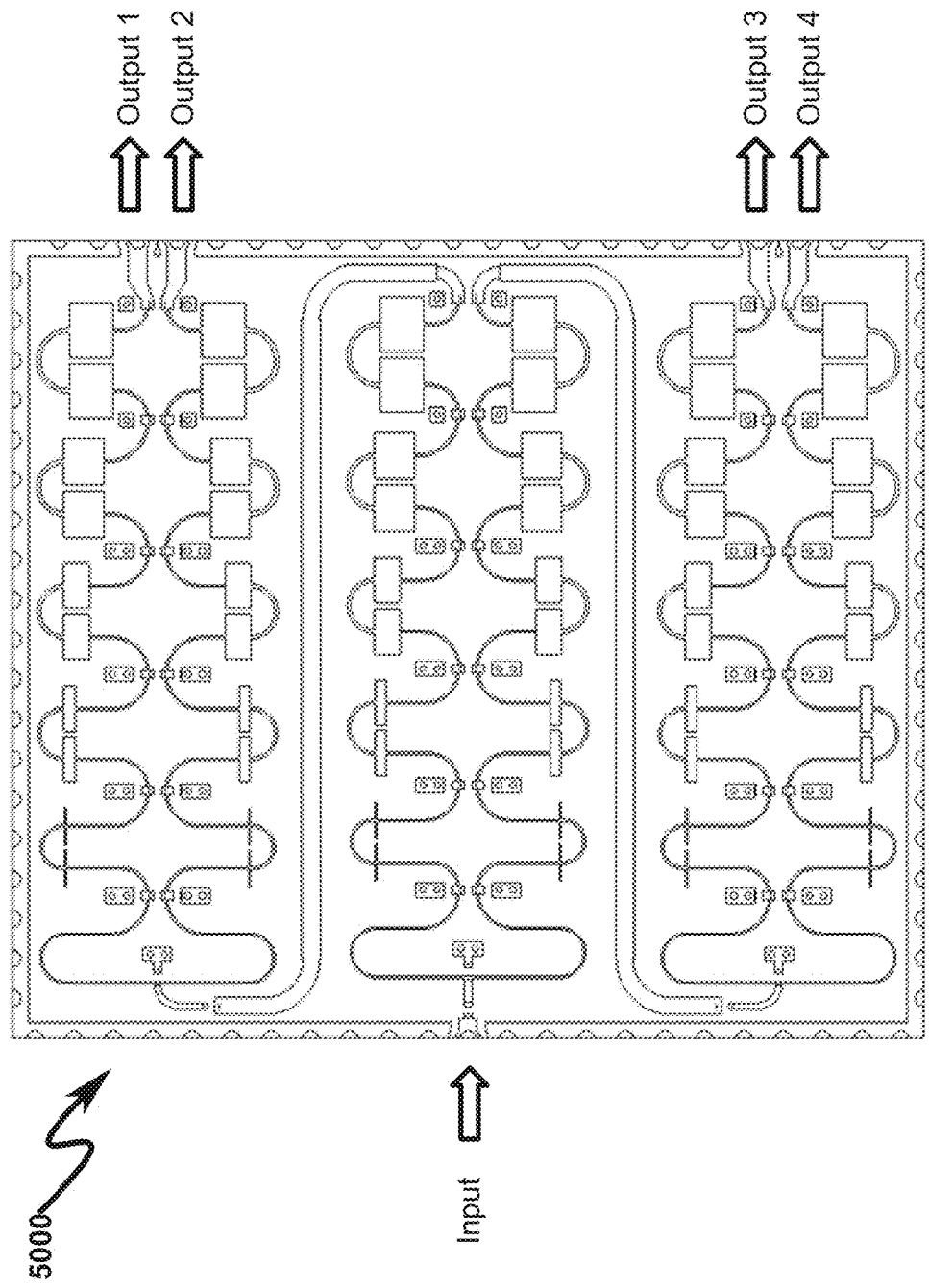
FIG. 50 illustrates a top PCB layout view of a preferred exemplary RF 4-way splitter combiner invention embodiment having symmetric 2-way splitter orientations.
Figure 51:
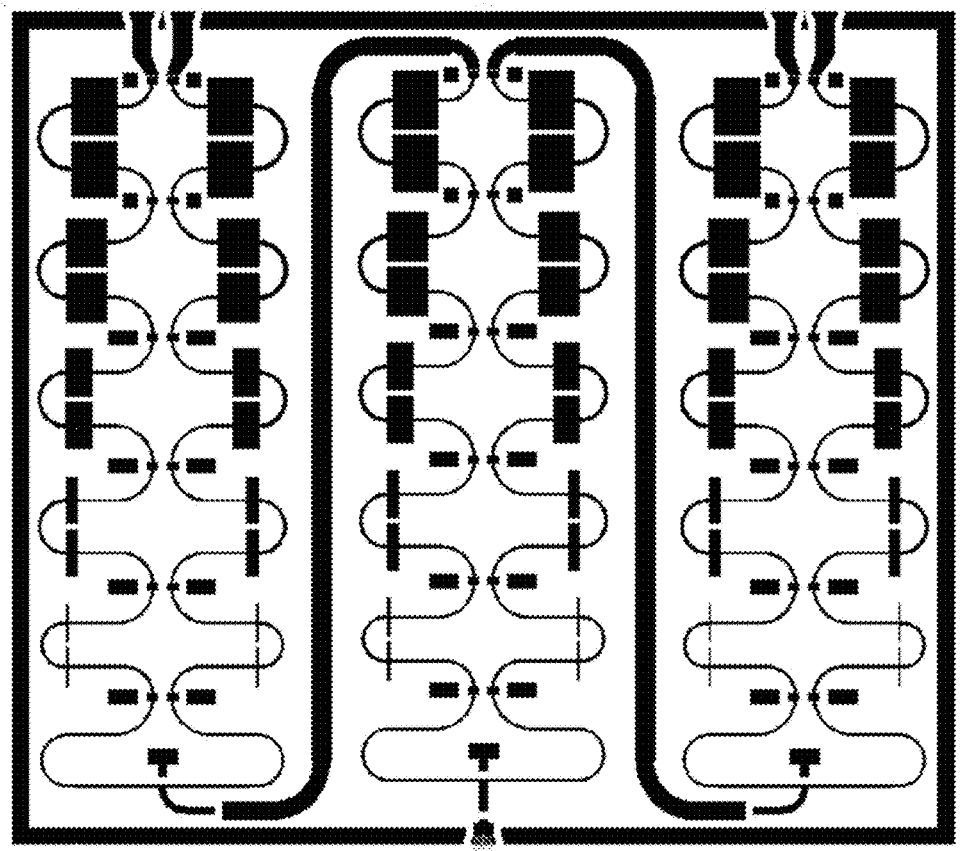
FIG. 51 illustrates a top PCB mask view of a preferred exemplary RF 4-way splitter combiner invention embodiment having symmetric 2-way splitter orientations.
Figure 52:
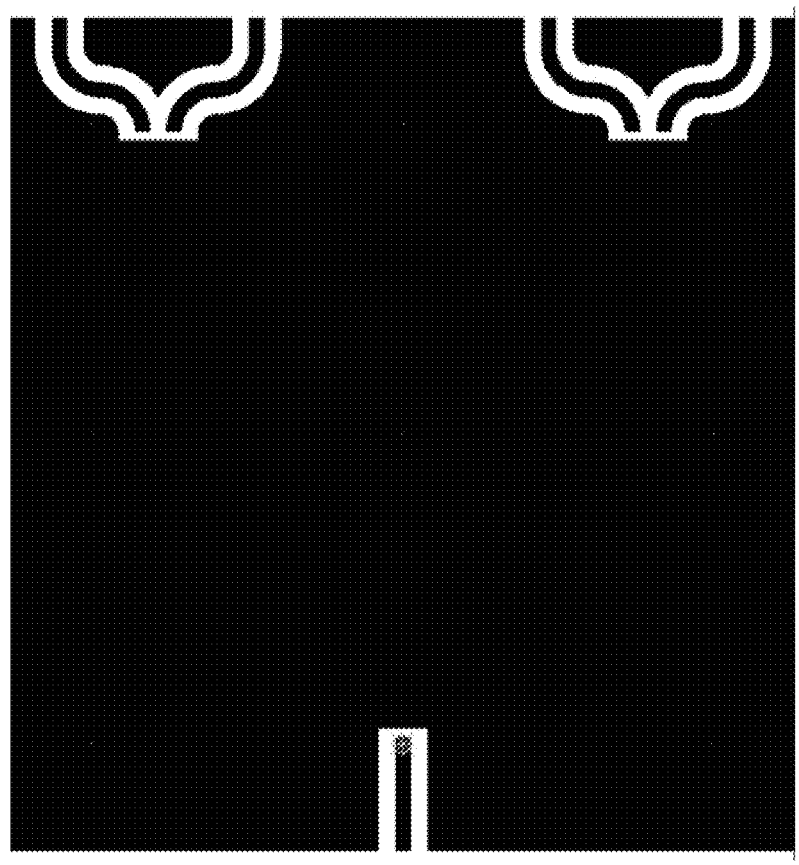
FIG. 52 illustrates a PCB detail mask view of a preferred exemplary RF 4-way splitter combiner invention embodiment having symmetric 2-way splitter orientations.

FIG. 49 (4900)-FIG. 52 (5200) depict a configuration in which three 2-way splitter/combiners are fabricated on the same substrate in the same orientation. Routing from the outputs of the first 2-way splitter is routed to the inputs of the second and third 2-way splitters to provide for four outputs that provide 4-way power splitting.

Figure 53:
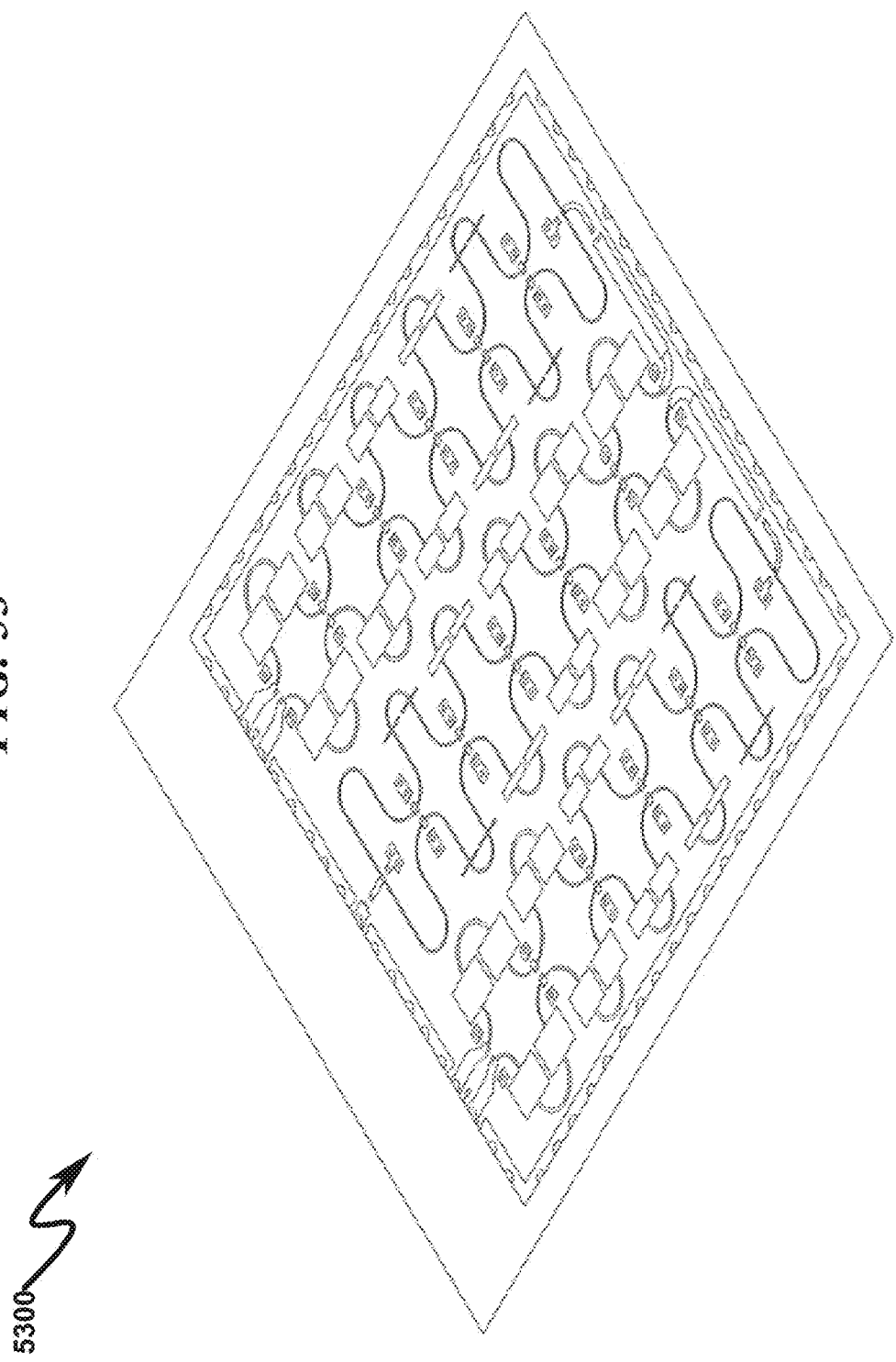
FIG. 53 illustrates a top PCB layout perspective view of a preferred exemplary RF 4-way splitter combiner invention embodiment having anti-symmetric 2-way splitter orientations.
Figure 54:
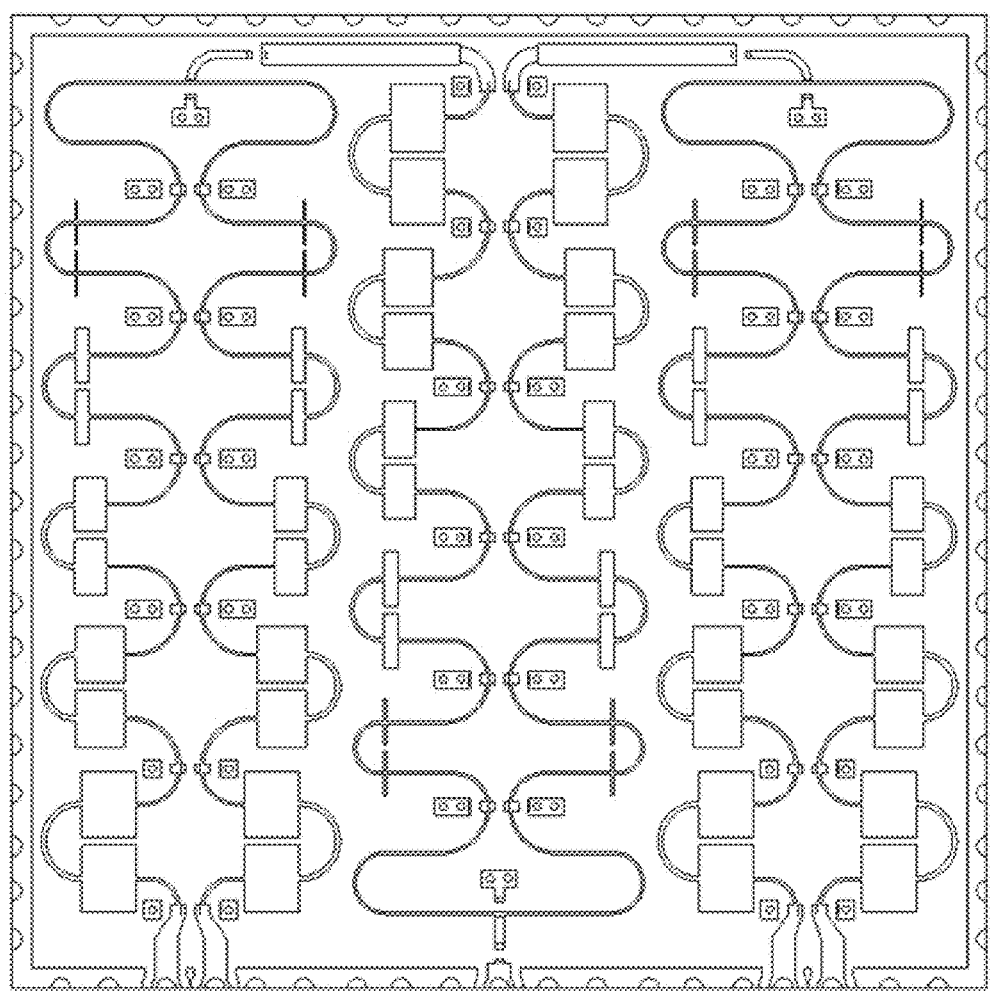
FIG. 54 illustrates a top PCB layout view of a preferred exemplary RF 4-way splitter combiner invention embodiment having anti-symmetric 2-way splitter orientations.
Figure 55:
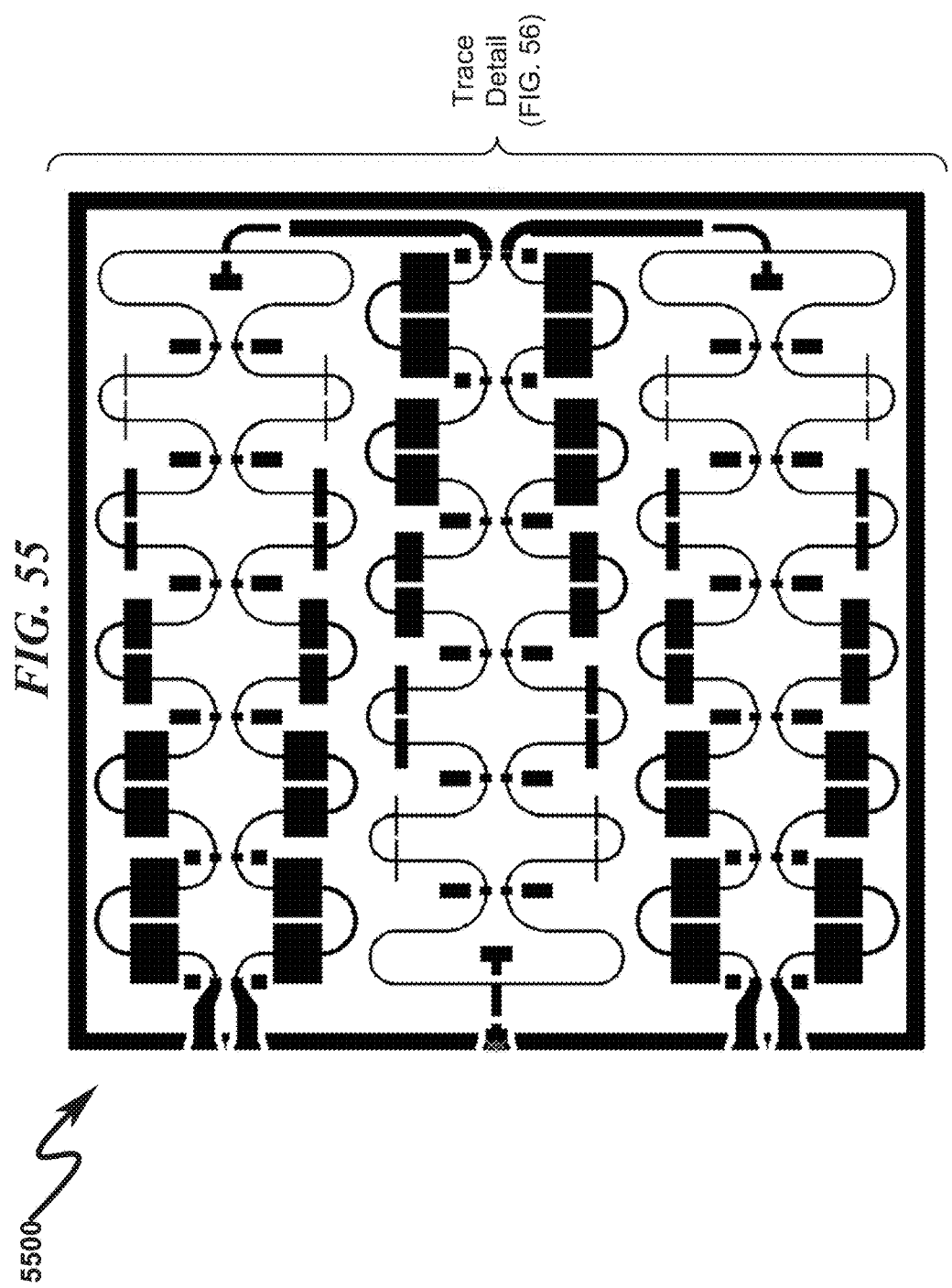
FIG. 55 illustrates a top PCB mask view of a preferred exemplary RF 4-way splitter combiner invention embodiment having anti-symmetric 2-way splitter orientations.
Figure 56:
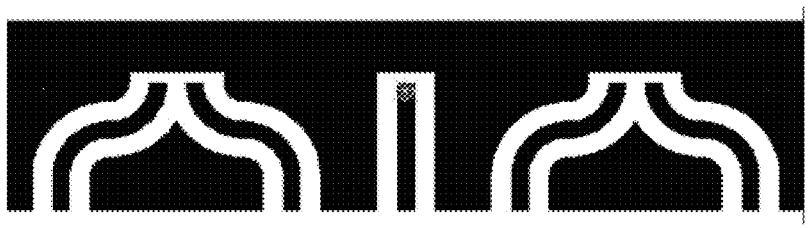
FIG. 56 illustrates a PCB detail mask view of a preferred exemplary RF 4-way splitter combiner invention embodiment having anti-symmetric 2-way splitter orientations.

FIG. 53 (5300)-FIG. 56 (5600) illustrate another 4-way splitter configuration in which the second and third 2-way splitters are oriented 180 degrees opposite that of the first 2-way splitter. This configuration reduces the trace lengths between the outputs of the first 2-way splitter to the inputs of the corresponding second and third 2-way splitters.

One skilled in the art will recognize that any combination of 2-way splitter orientation may be utilized to achieve a variety of 4-way and 2N-way splitter configurations using the teachings of the present invention.

4-Way Splitter/Combiner Performance (5700)-(6200)

Figure 57:
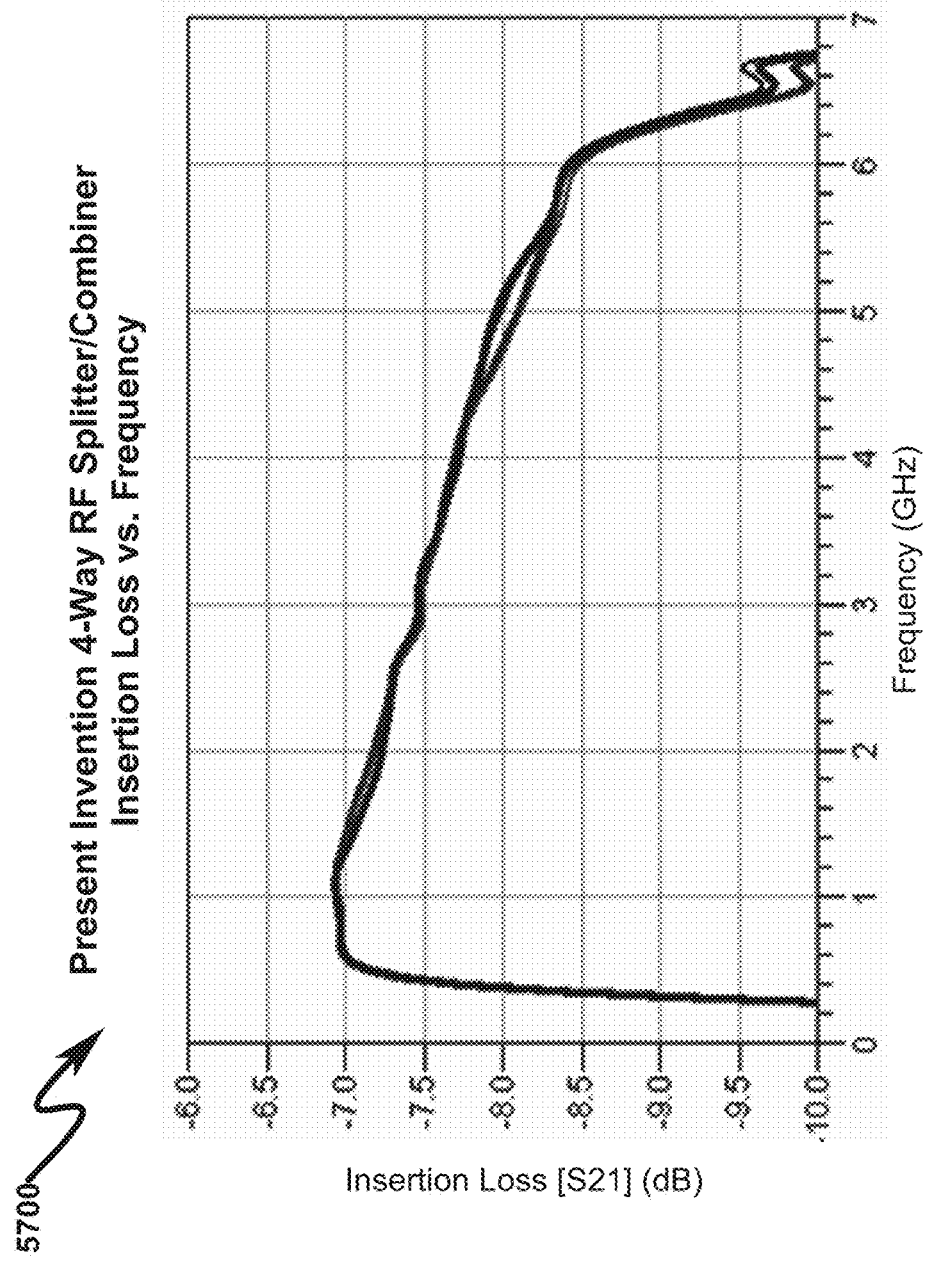
FIG. 57 illustrates a graph depicting typical insertion loss vs. frequency performance of a preferred exemplary RF 4-way splitter combiner invention embodiment.
Figure 58:
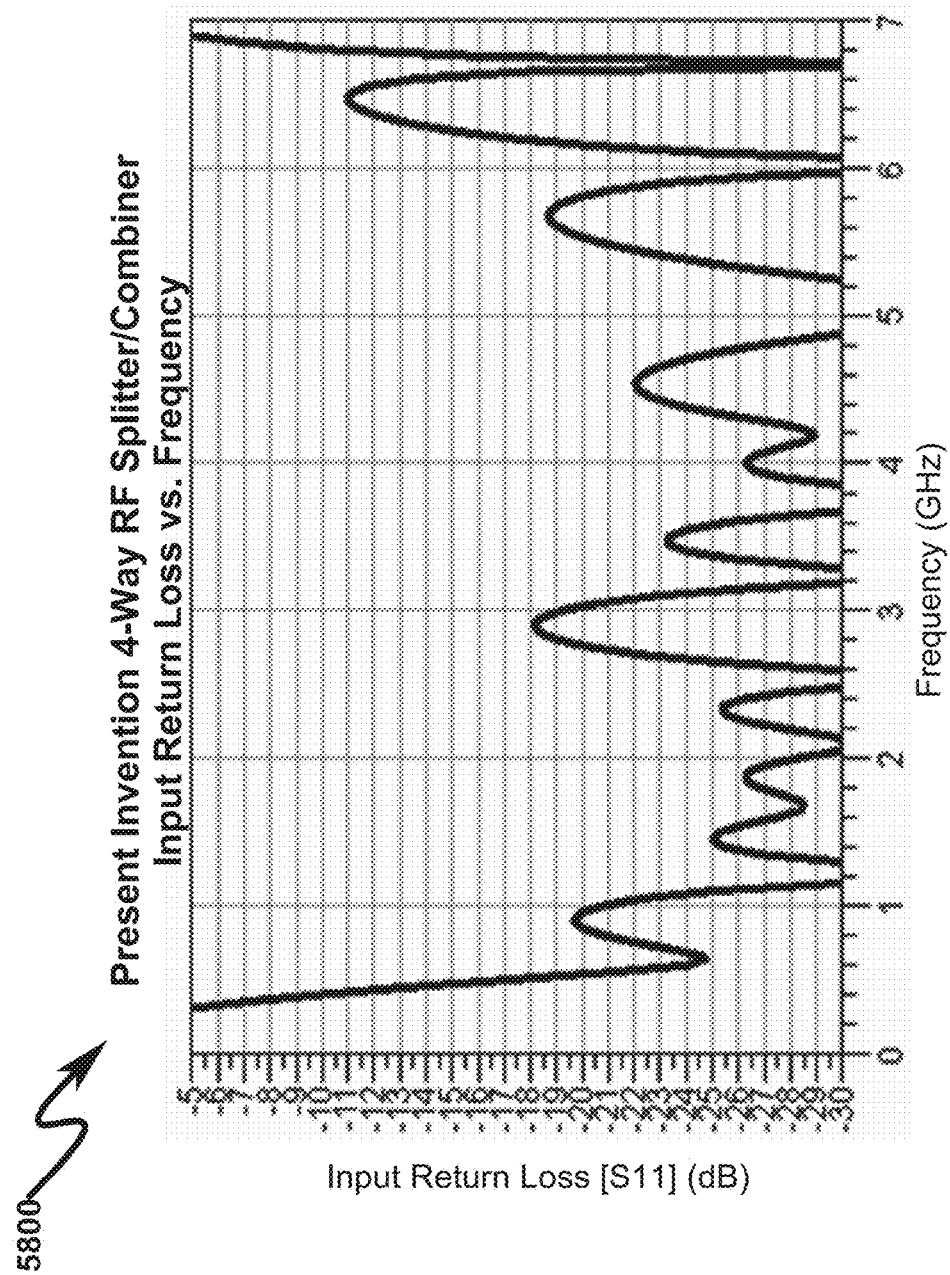
FIG. 58 illustrates a graph depicting typical input return loss vs. frequency performance of a preferred exemplary RF 4-way splitter combiner invention embodiment.
Figure 59:
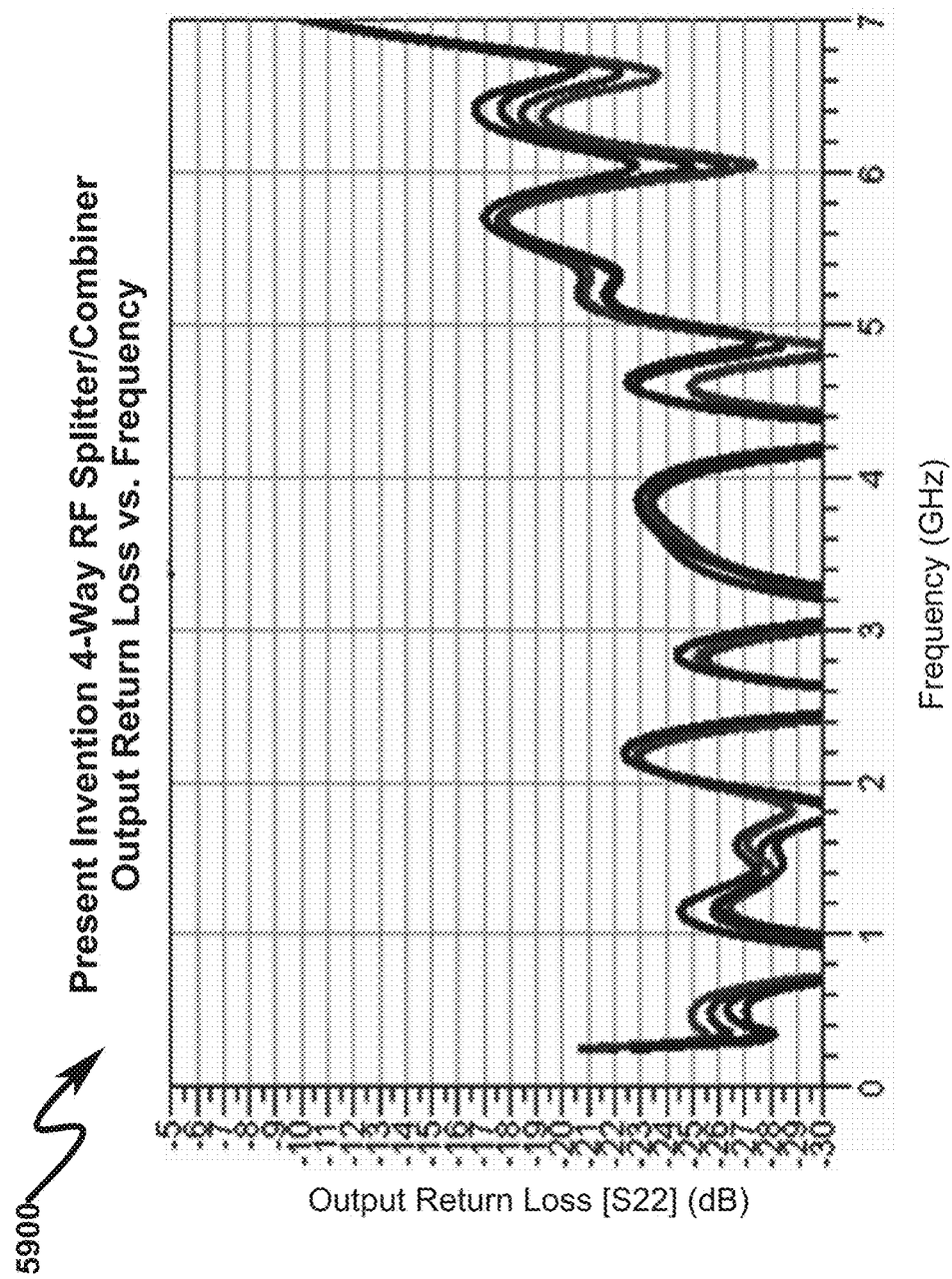
FIG. 59 illustrates a graph depicting typical output return loss vs. frequency performance of a preferred exemplary RF 4-way splitter combiner invention embodiment.
Figure 60:
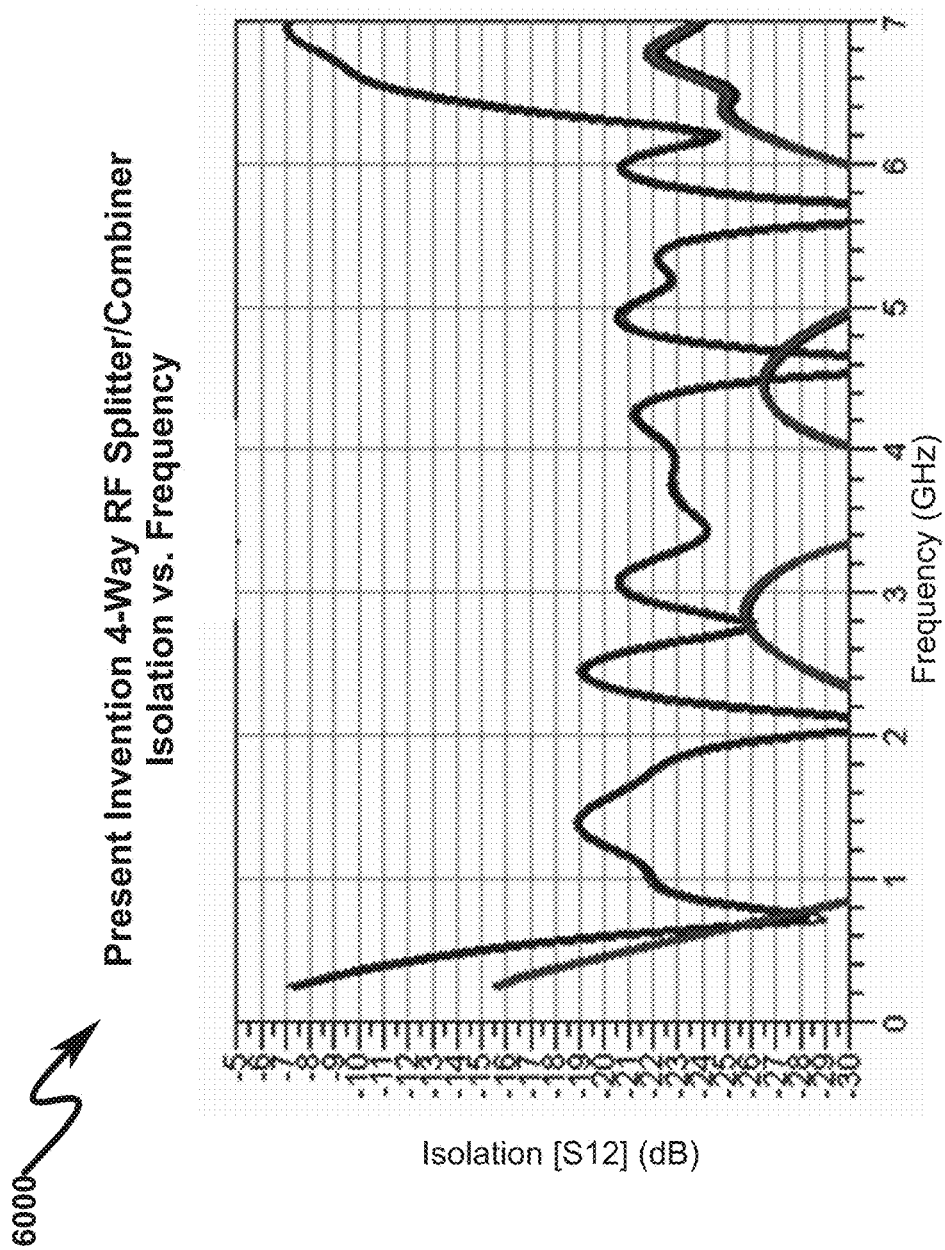
FIG. 60 illustrates a graph depicting typical isolation vs. frequency performance of a preferred exemplary RF 4-way splitter combiner invention embodiment.
Figure 61:
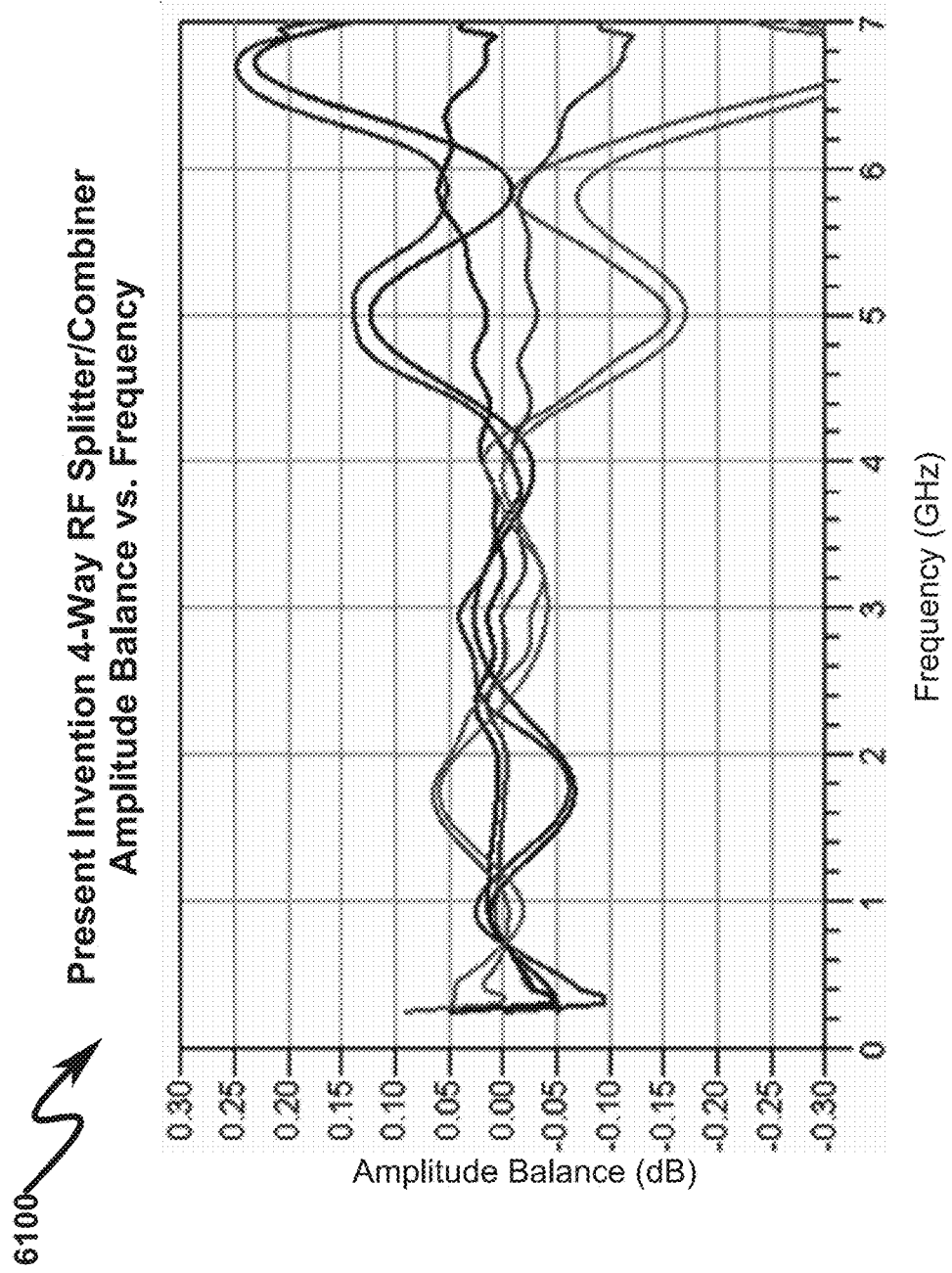
FIG. 61 illustrates a graph depicting typical amplitude balance vs. frequency performance of a preferred exemplary RF 4-way splitter combiner invention embodiment.
Figure 62:
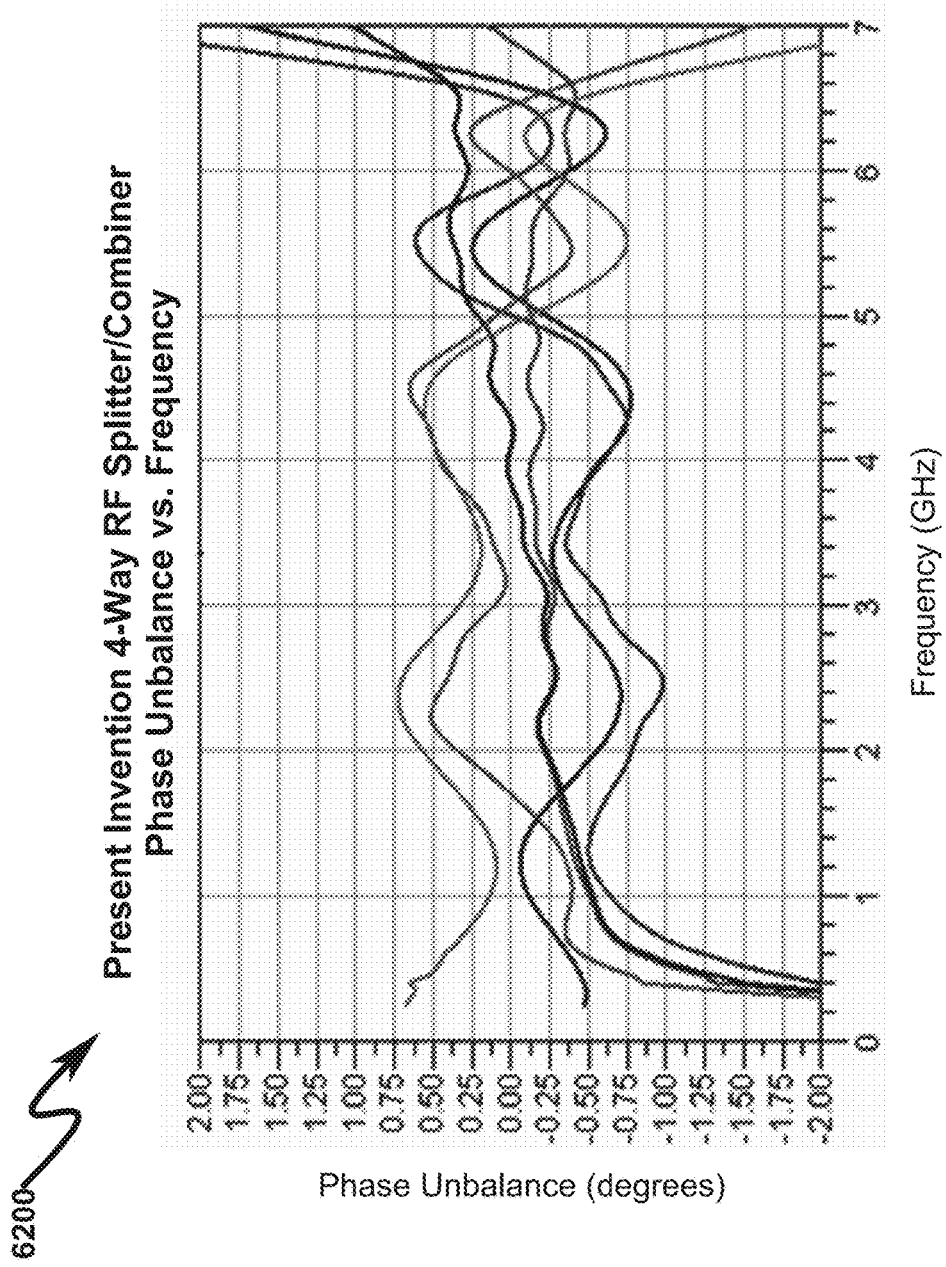
FIG. 62 illustrates a graph depicting typical phase unbalance vs. frequency performance of a preferred exemplary RF 4-way splitter combiner invention embodiment.

Typical performance characteristics of a present invention 4-way splitter/combiner as depicted in FIG. 49 (4900)-FIG. 56 (5600) is generally depicted in the graphs of FIG. 57 (5700)-FIG. 62 (6200). As with the performance graphs of the 2-way splitter embodiment, the 4-way splitter configurations have good performance over a broadband frequency range.

System Generalization (6300)

Figure 63:
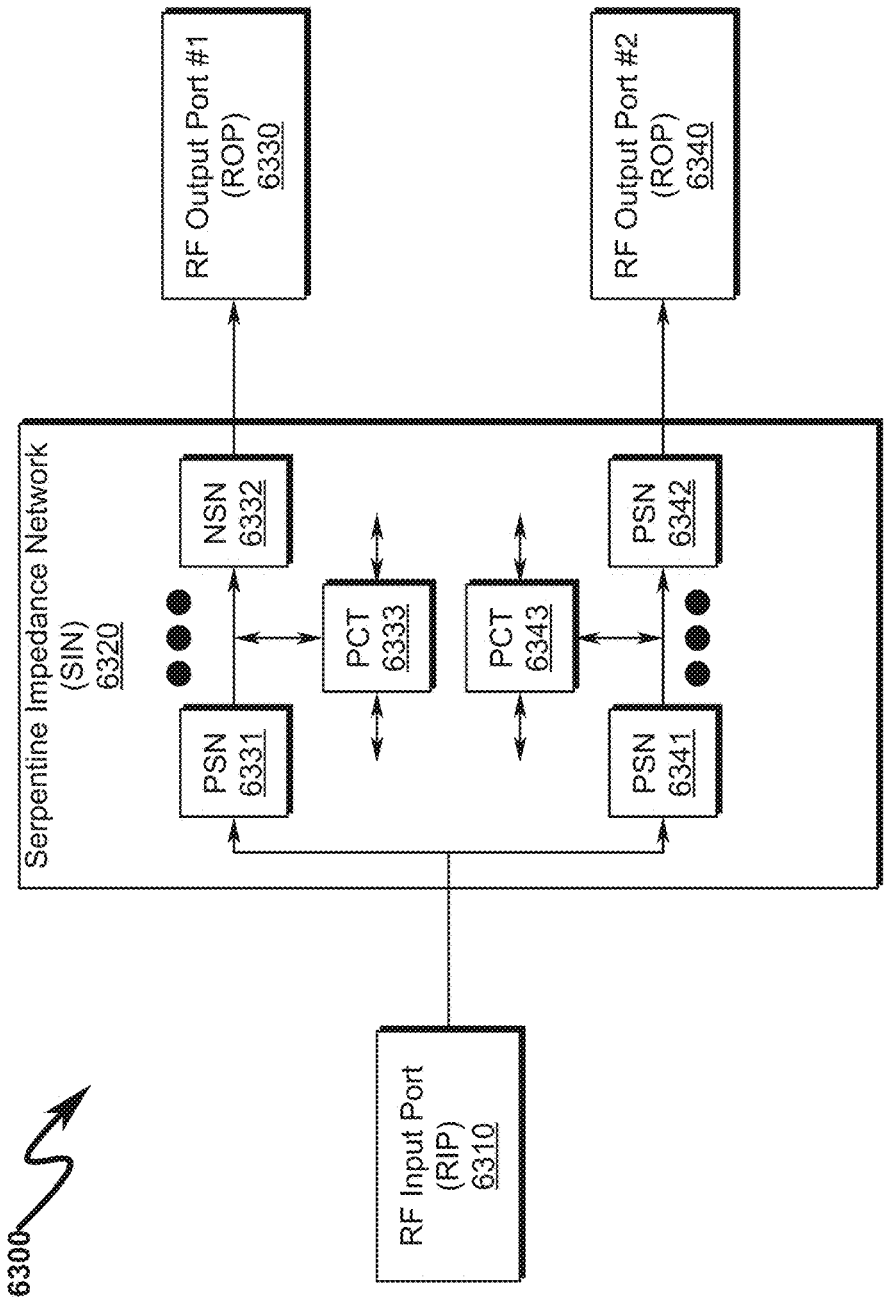
FIG. 63 illustrates a system block diagram depicting the overall concept taught by the present invention.

The present invention system 2-port embodiment may be generalized as depicted in FIG. 63 (6300) wherein a RF input port (6310) is electrically coupled with a serpentine impedance network (6320) to couple input power to a first RF output port (6330) and a second RF output port (6340). Within the SIN (6320) a series of PSNs (6331, 6341) and NSNs (6332, 6342) are interconnected with traces and PCTs (6333, 6343). The lumped performance of this configuration permits broadband frequency operation of the RF splitter/combiner while maintaining a low volumetric footprint for the structure. As discussed previously, the system as described is symmetric and may be used as a power splitter as depicted in this diagram and/or as a power combiner in which the sense of the RF input/output ports is reversed and two RF inputs are combined to form a singular RF output.

Method Overview (6400)

Figure 64:
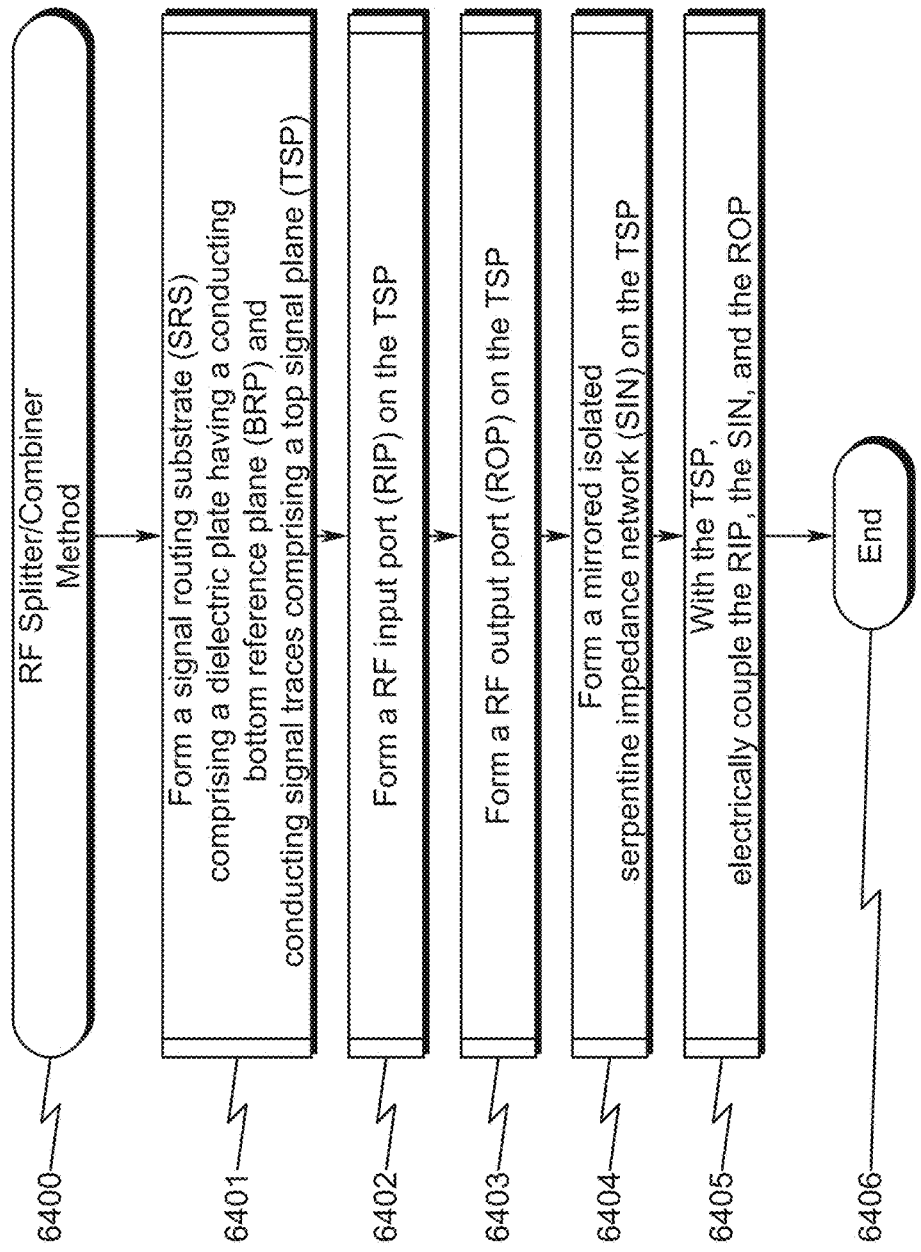
FIG. 64 illustrates an exemplary flowchart depicting a preferred exemplary invention method.

In conjunction with the above-described invention system, a present invention method may be implemented to fabricate a broadband RF splitter/combiner having a small form factor and broadband transfer characteristics. The present invention method may be understood by viewing the flowchart depicted in FIG. 64 (6400) and broadly generalized as a method for RF power splitting/combining comprising:

(1) forming a signal routing substrate (SRS) comprising a dielectric plate having a conducting bottom reference plane (BRP) and conducting signal traces comprising a top signal plane (TSP) (6401);
(2) forming a RF input port (RIP) on the TSP (6402);
(3) forming a RF output port (ROP) on the TSP (6403);
(4) forming a mirrored isolated serpentine impedance network (SIN) on the TSP (6404); and
(5) with the TSP, electrically coupling the RIP, the SIN, and the ROP (6405);

wherein:

the RIP is configured to accept a RF signal input (RSI);
the RIP is configured to electrically couple the RSI to the SIN using an input passive electrical component (IPC);
the ROP comprises a first output port (FOP) and a second output port (SOP) each configured to emit a matched respective RF signal output (RSO) derived from the RSI;
the ROP is configured to electrically couple the SIN to the FOP and the SOP with a pair of output passive electrical components (OPC);
the SIN comprises a first serpentine impedance trace (FST) on the TSP and a second serpentine impedance traces (SST) on the TSP;
the FST and the SST are configured as mirrored structures about a common reference plane between the FST and the SST;
the FST and the SST each comprise a series of positive serpentine node (PSN) traces and negative serpentine node (NSN) traces;
the series of the PSN and the NSN comprise individually selected trace widths (ITW);
the FST and the SST incorporate a series of paired coupling traces (PCT) positioned between the PSN and the NSN on the FST and the SST respectively;
the NSN of the FST is electrically coupled to a corresponding mirrored NSN of the SST with a bridge passive electrical component (BPC);
the NSN of each FST is electrically coupled to the BRP with a first passive electrical component (FPC);
the NSN of each SST is electrically coupled to the BRP with a second passive electrical component (SPC); and
the IPC, the OPC, the BPC, the FPC, the SPC, the PCT, and the ITW are selected to impedance match the RIP to the FOP and the SOP.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

2-Way Splitter Experimental Results (6500)-(8000)

Figure 65:
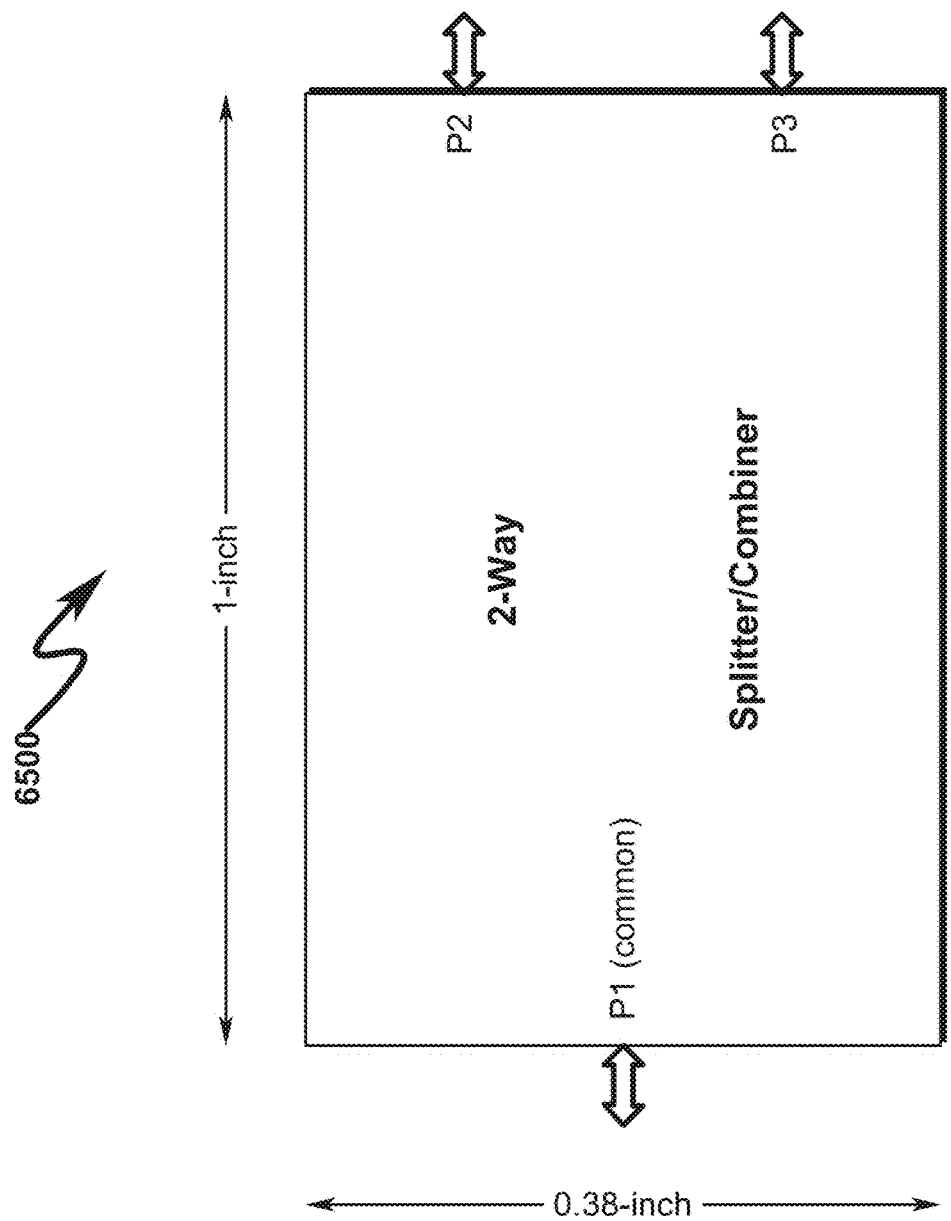
FIG. 65 illustrates a system block diagram of a constructed 2-way splitter/combiner and depicts constructed dimensions and port structure orientation.
Figure 66:
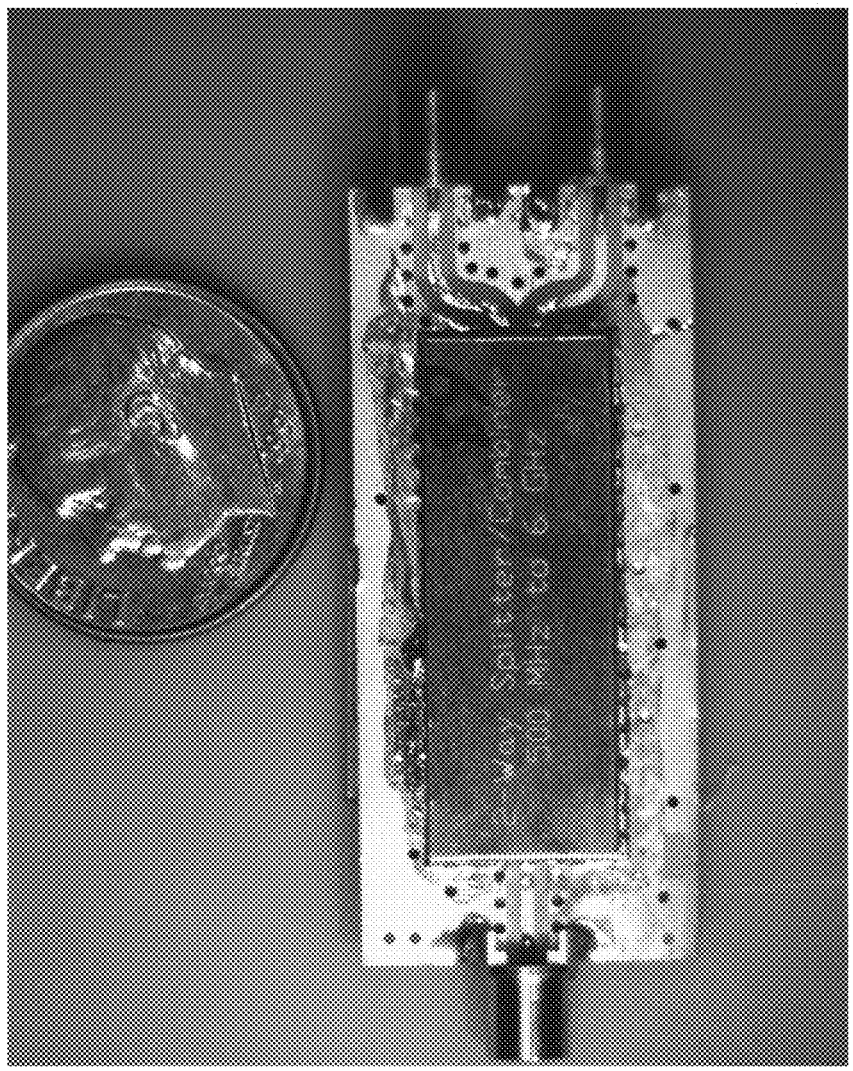
FIG. 66 illustrates a top view of a constructed 2-way splitter/combiner with reference size object.
Figure 67:
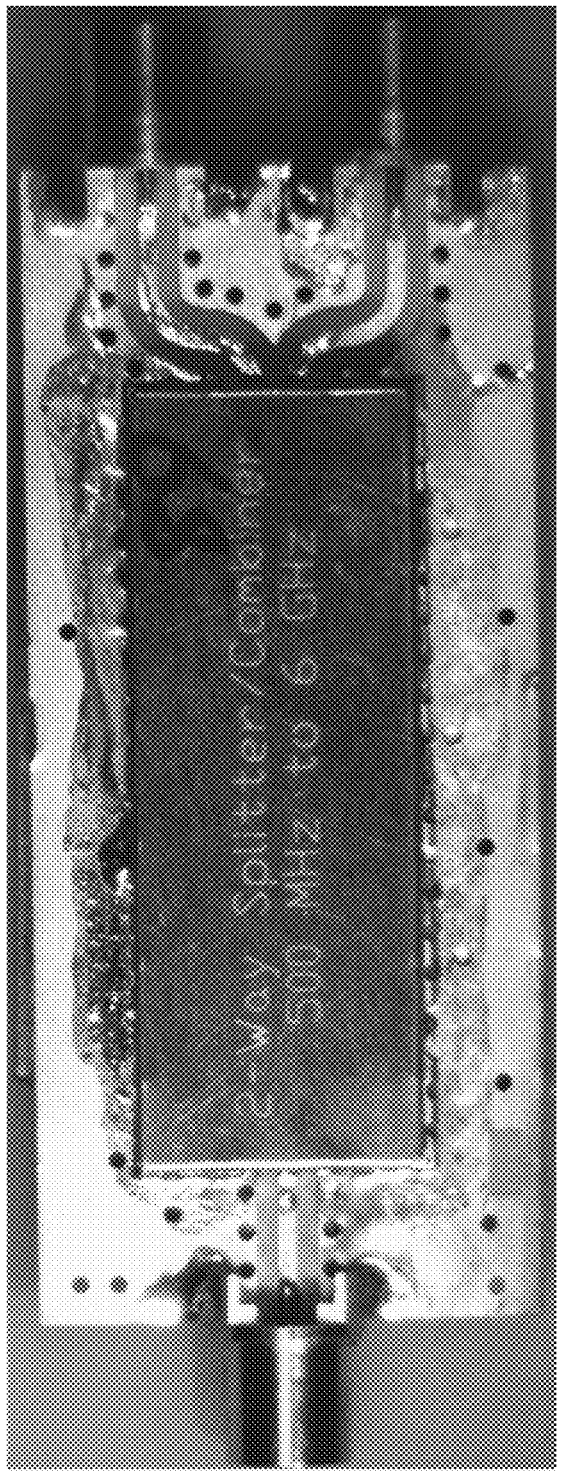
FIG. 67 illustrates a detail top view of a constructed 2-way splitter/combiner.
Figure 68:
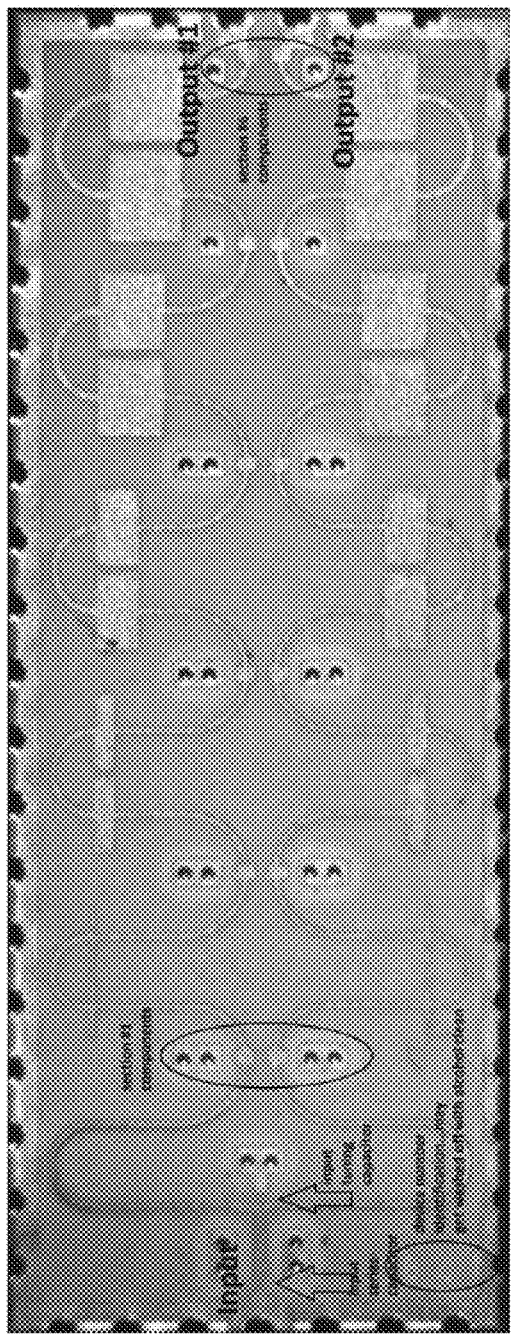
FIG. 68 illustrates a detail top view of a constructed 2-way splitter/combiner substrate.
Figure 69:
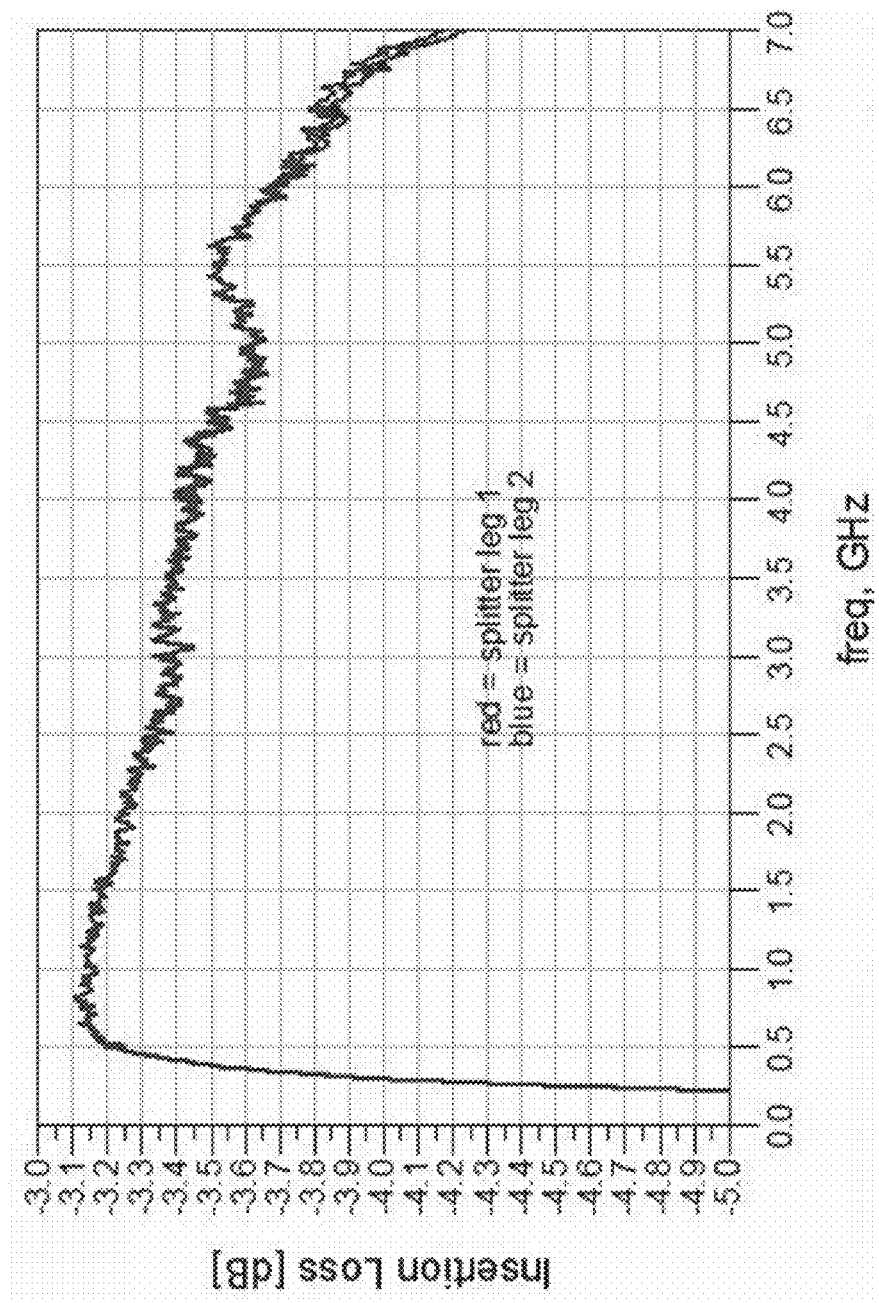
FIG. 69 illustrates a graph of measured insertion loss for the constructed 2-way splitter/combiner of FIG. 65-FIG. 68.
Figure 70:
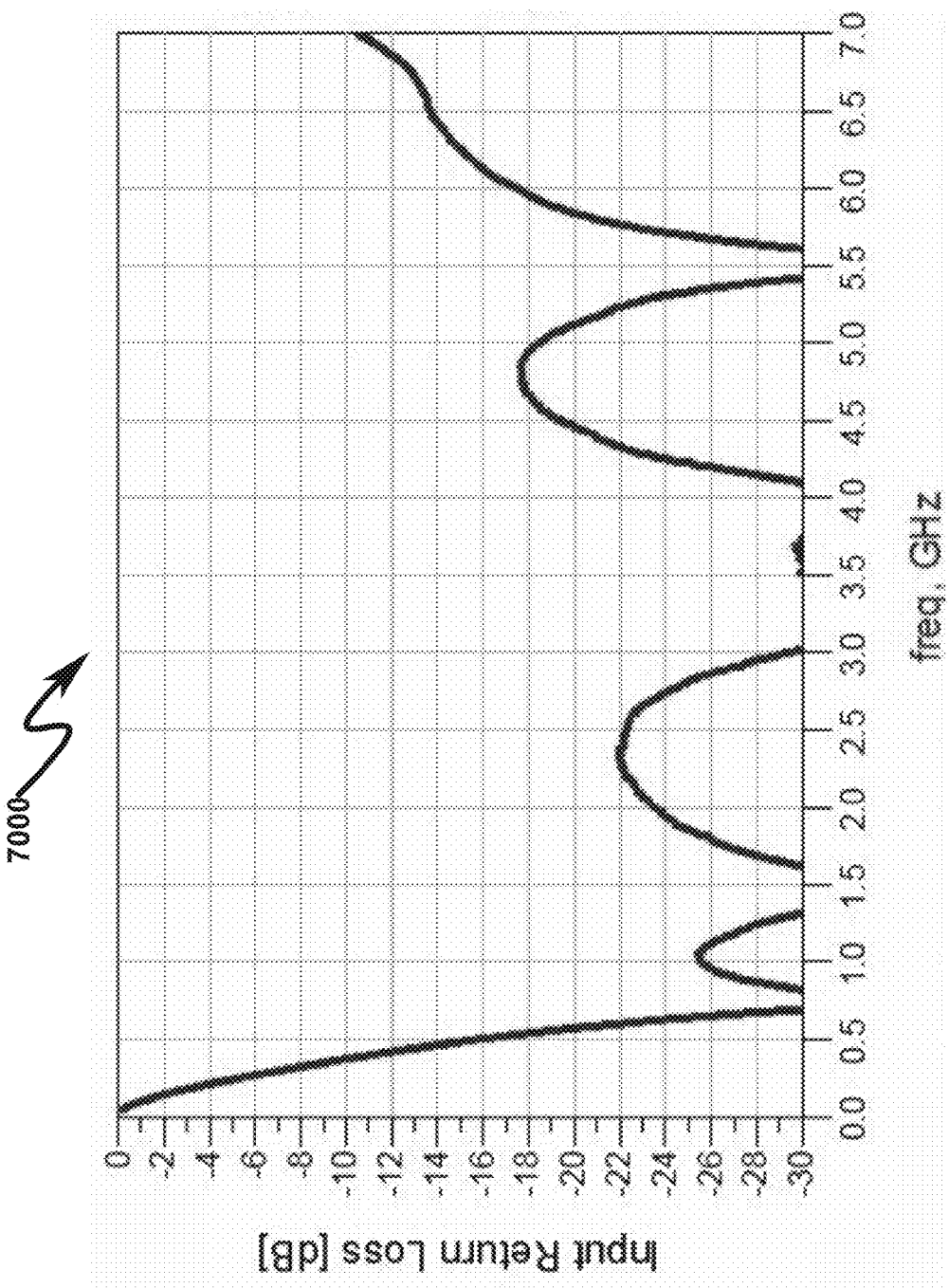
FIG. 70 illustrates a graph of measured return loss for the constructed 2-way splitter/combiner of FIG. 65-FIG. 68.
Figure 71:
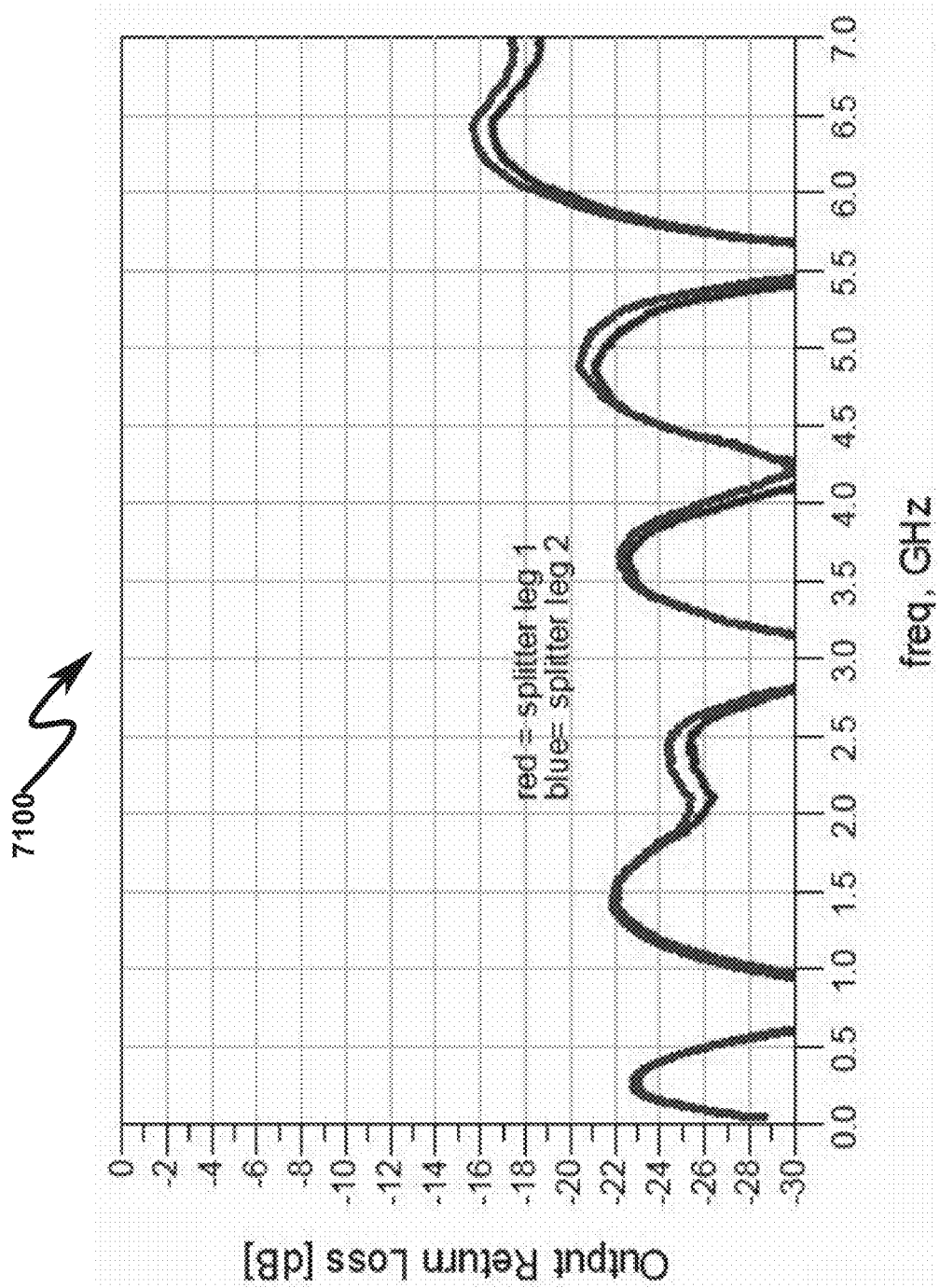
FIG. 71 illustrates a graph of measured output return loss for the constructed 2-way splitter/combiner of FIG. 65-FIG. 68.
Figure 72:
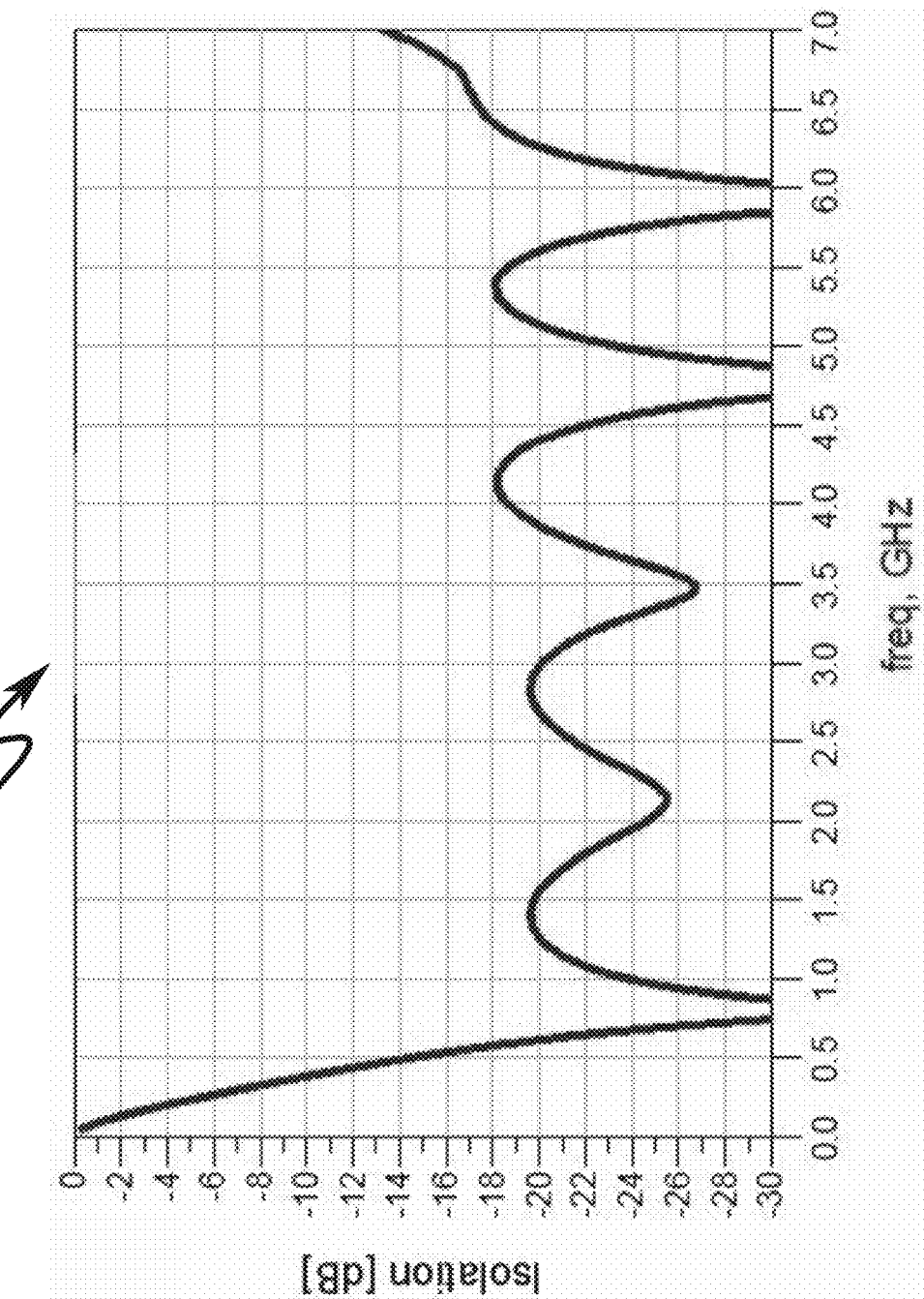
FIG. 72 illustrates a graph of measured isolation for the constructed 2-way splitter/combiner of FIG. 65-FIG. 68.
Figure 73:
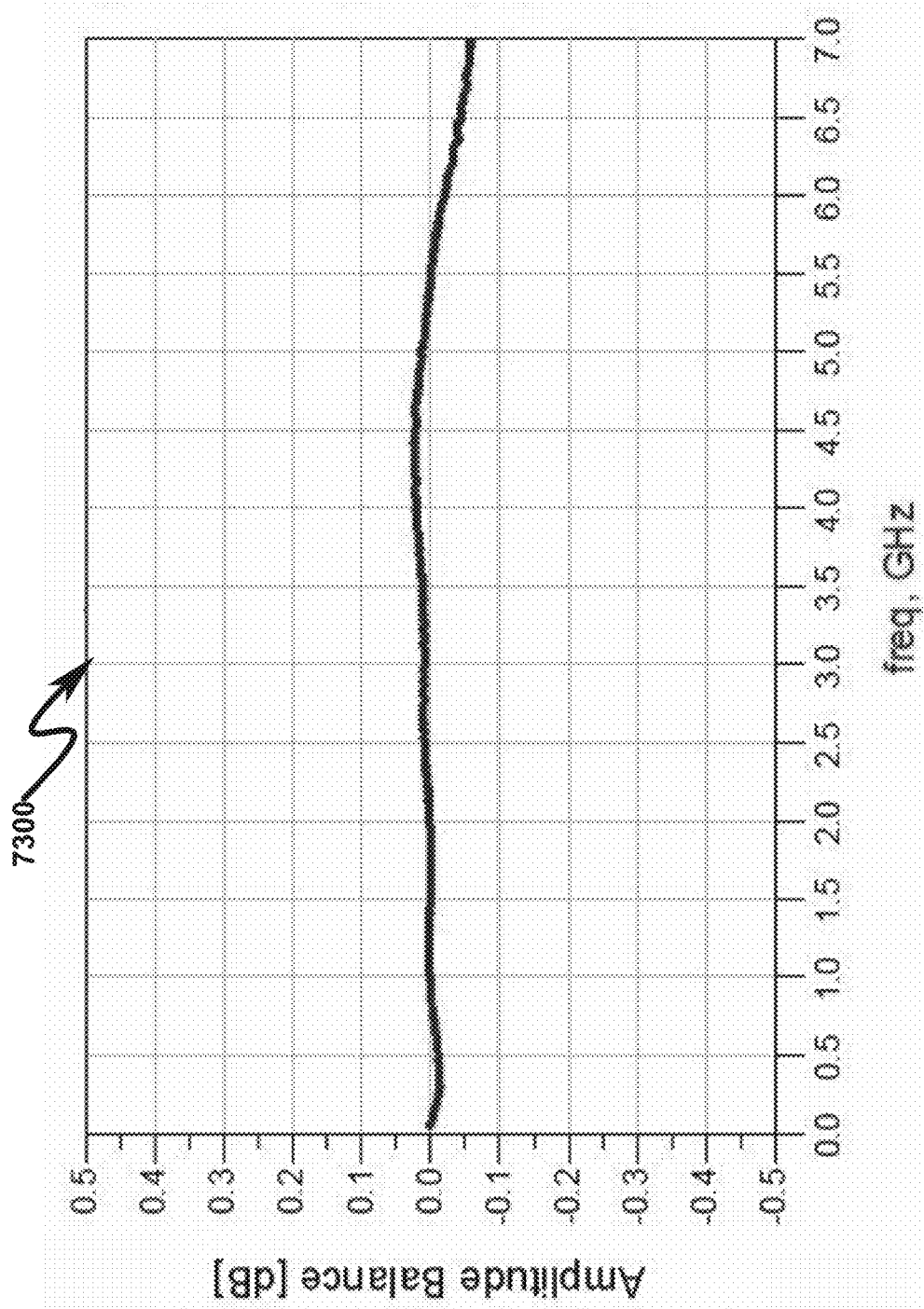
FIG. 73 illustrates a graph of measured amplitude balance for the constructed 2-way splitter/combiner of FIG. 65-FIG. 68.
Figure 74:
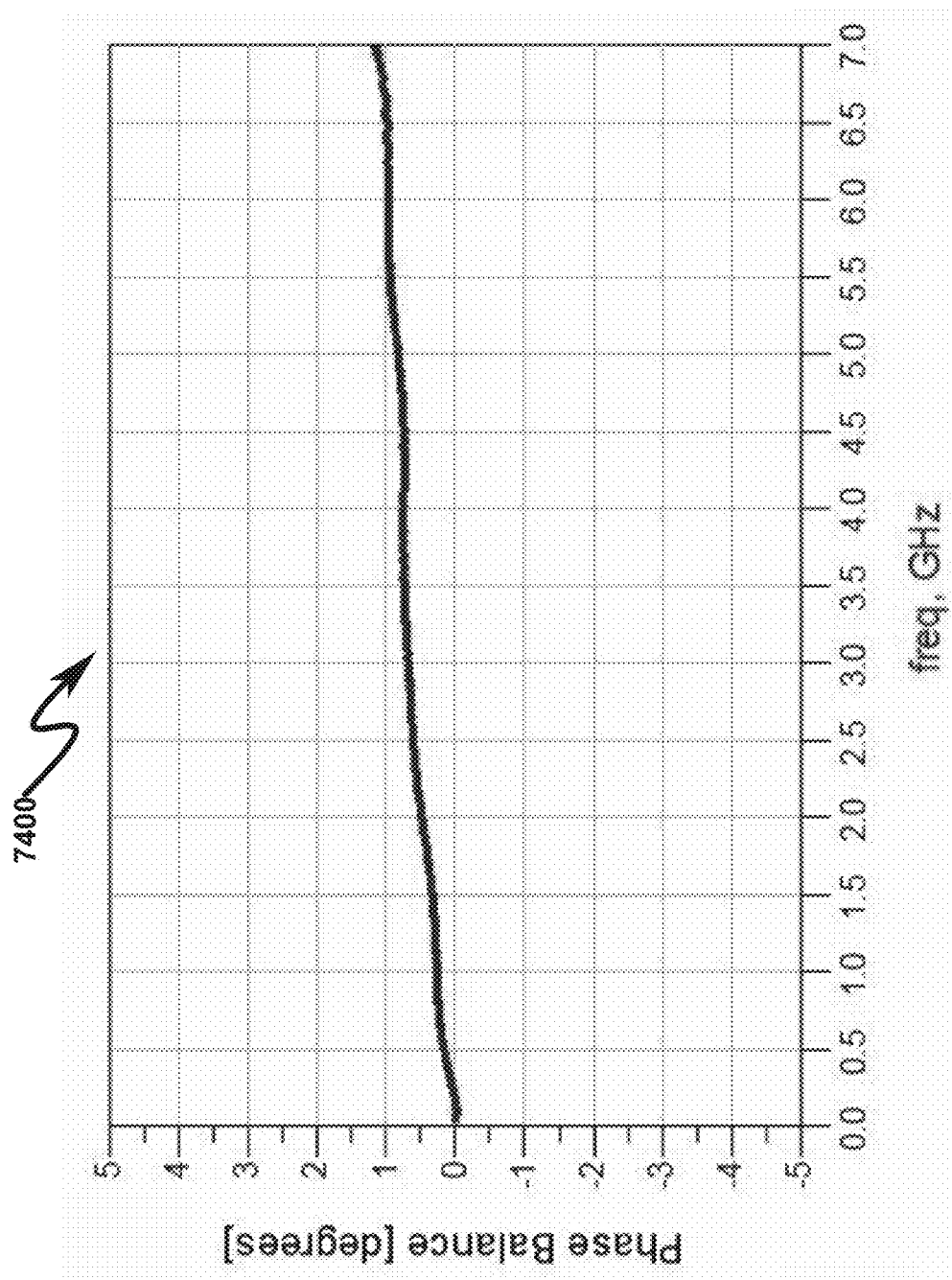
FIG. 74 illustrates a graph of measured phase balance for the constructed 2-way splitter/combiner of FIG. 65-FIG. 68.
Figure 75:
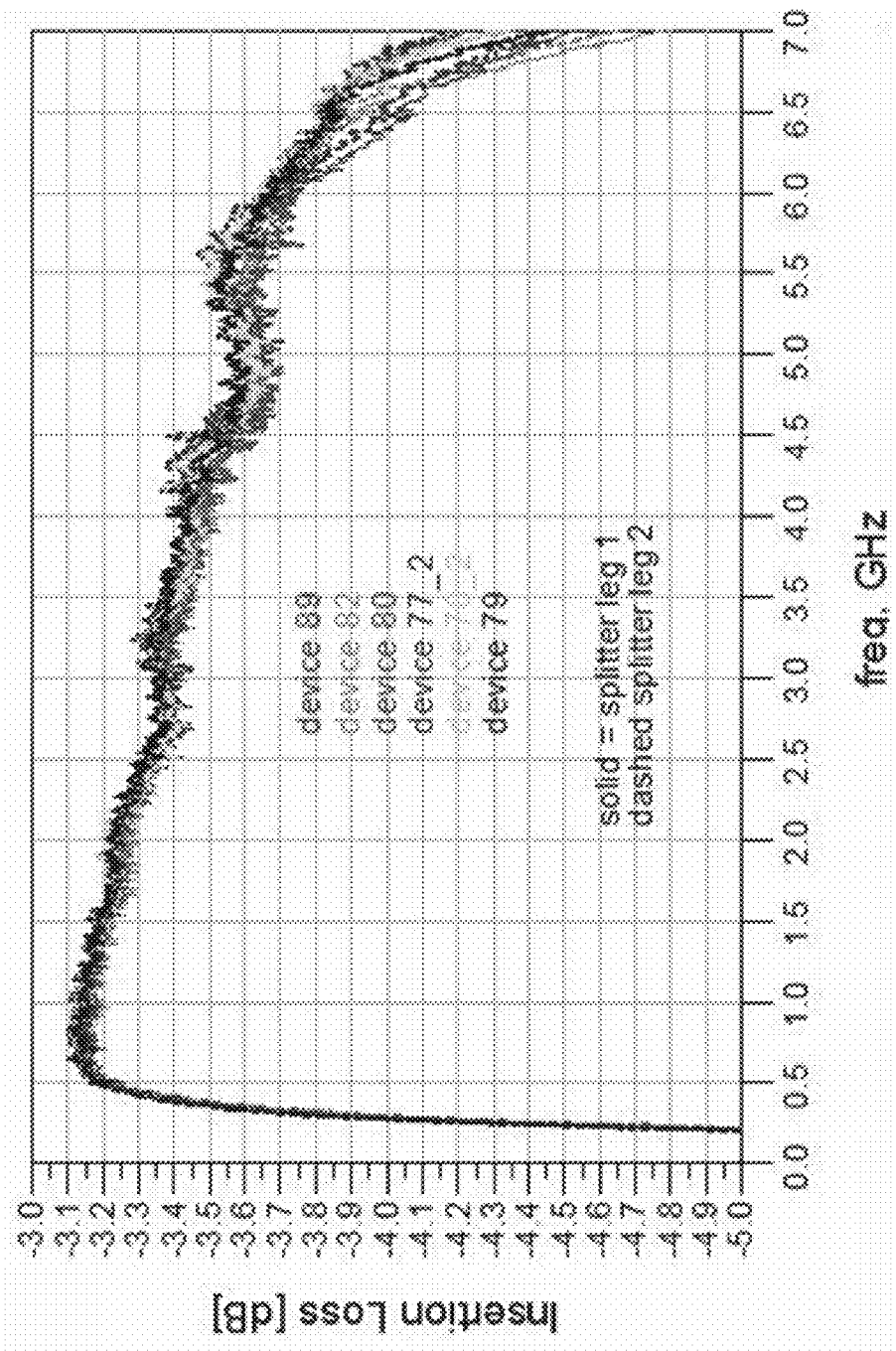
FIG. 75 illustrates a graph of measured insertion loss for a number of constructed 2-way splitter/combiners.
Figure 76:
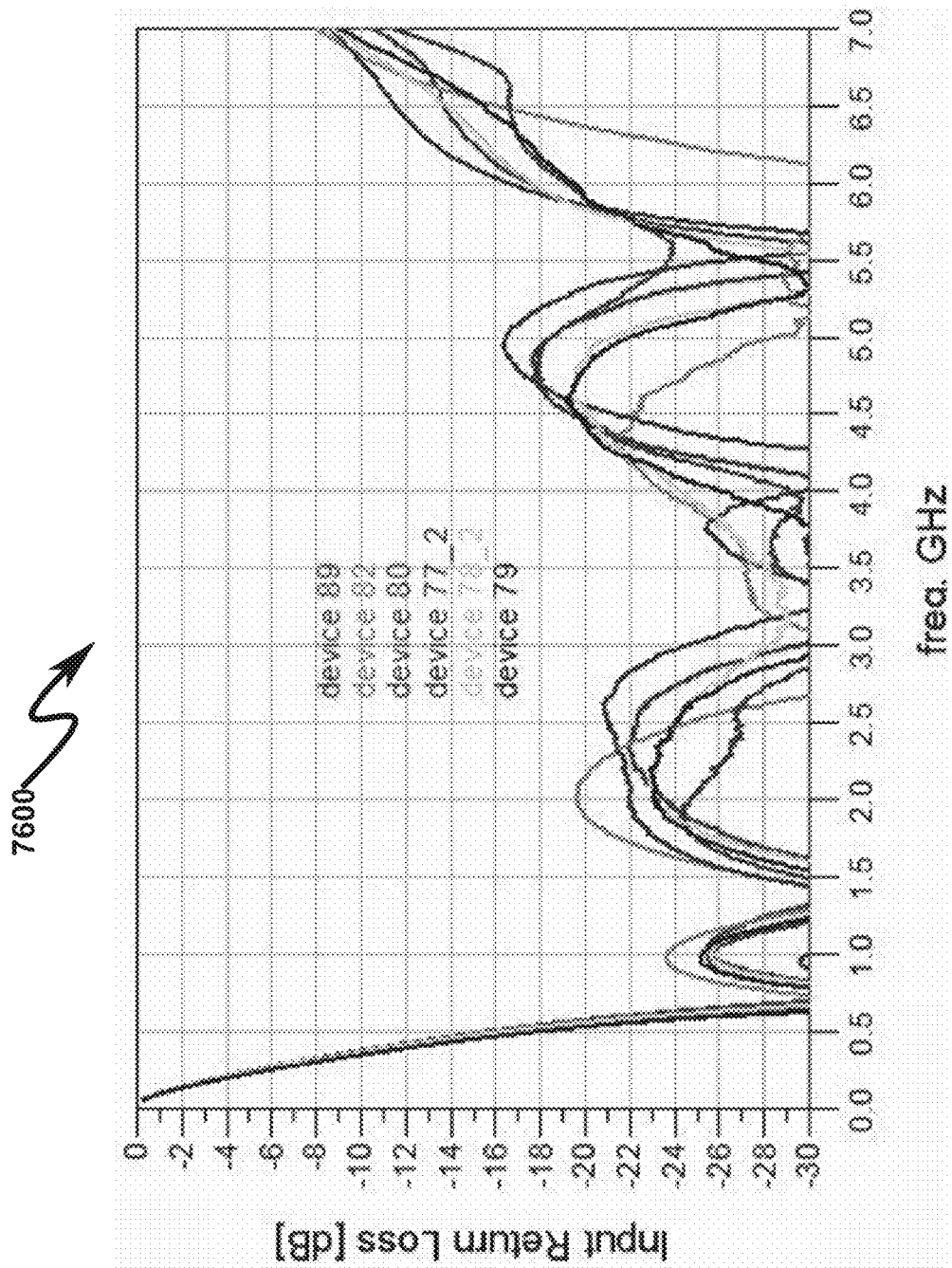
FIG. 76 illustrates a graph of measured input return loss for a number of constructed 2-way splitter/combiners.
Figure 77:
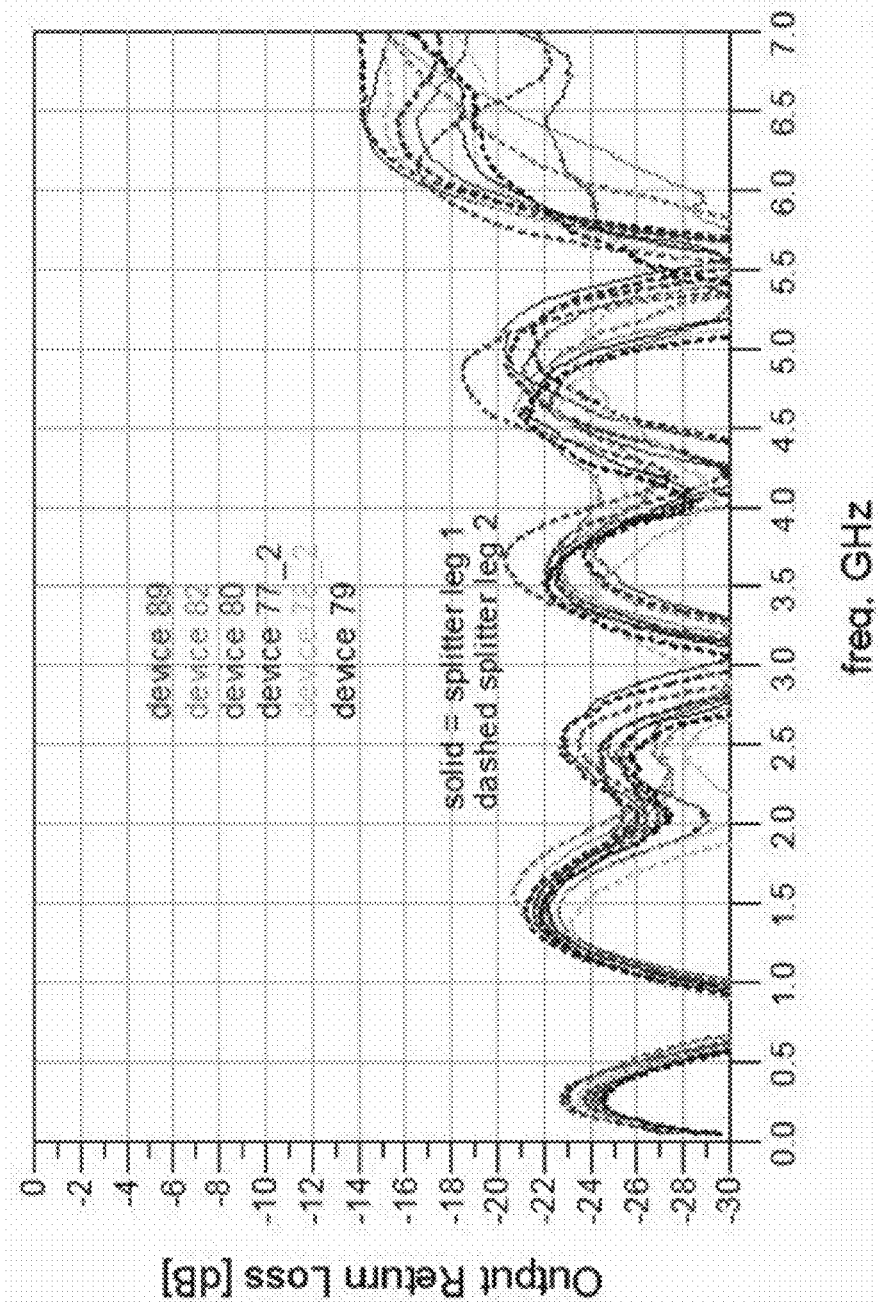
FIG. 77 illustrates a graph of measured output return loss for a number of constructed 2-way splitter/combiners.
Figure 78:
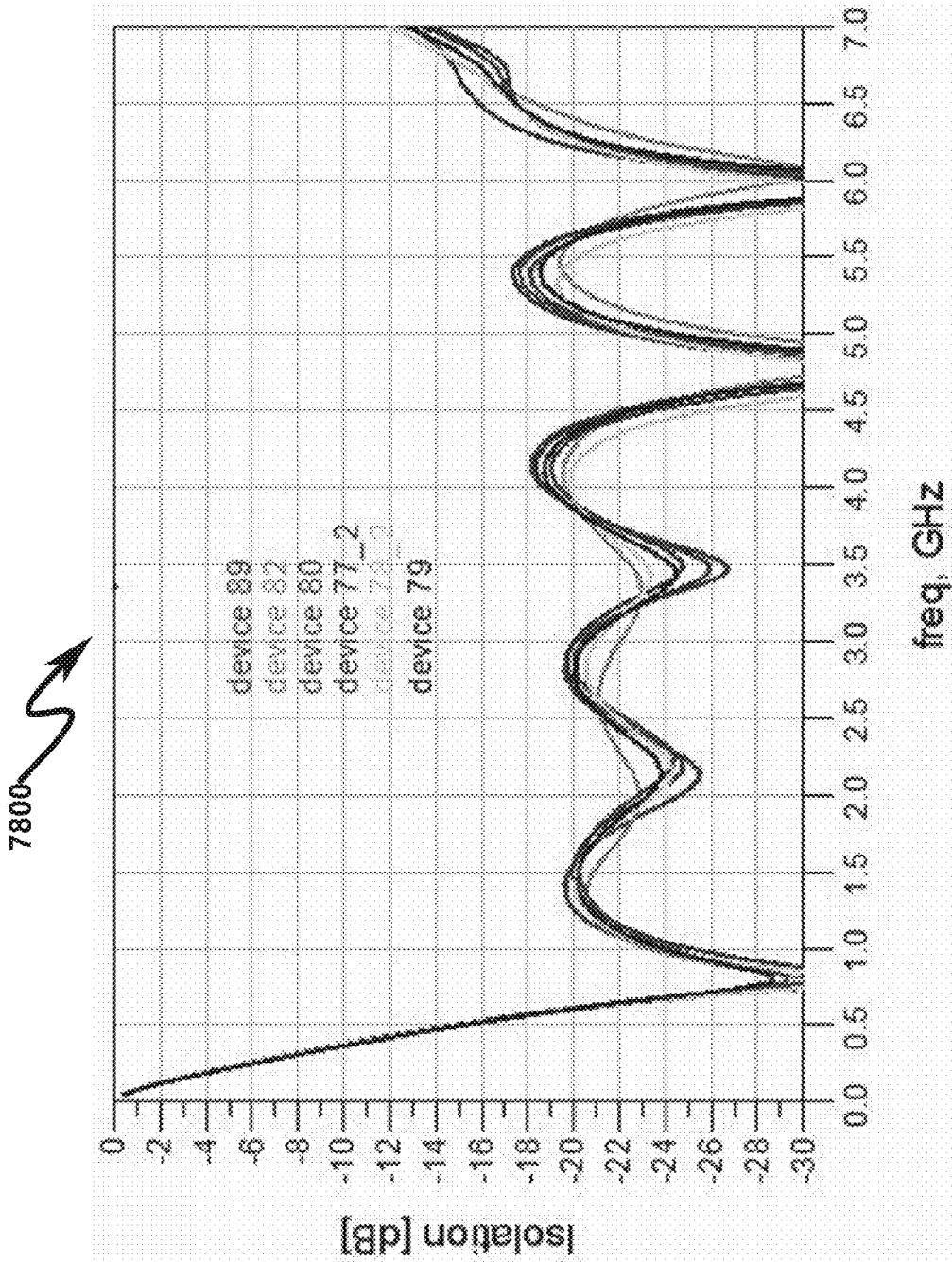
FIG. 78 illustrates a graph of measured isolation for a number of constructed 2-way splitter/combiners.
Figure 79:
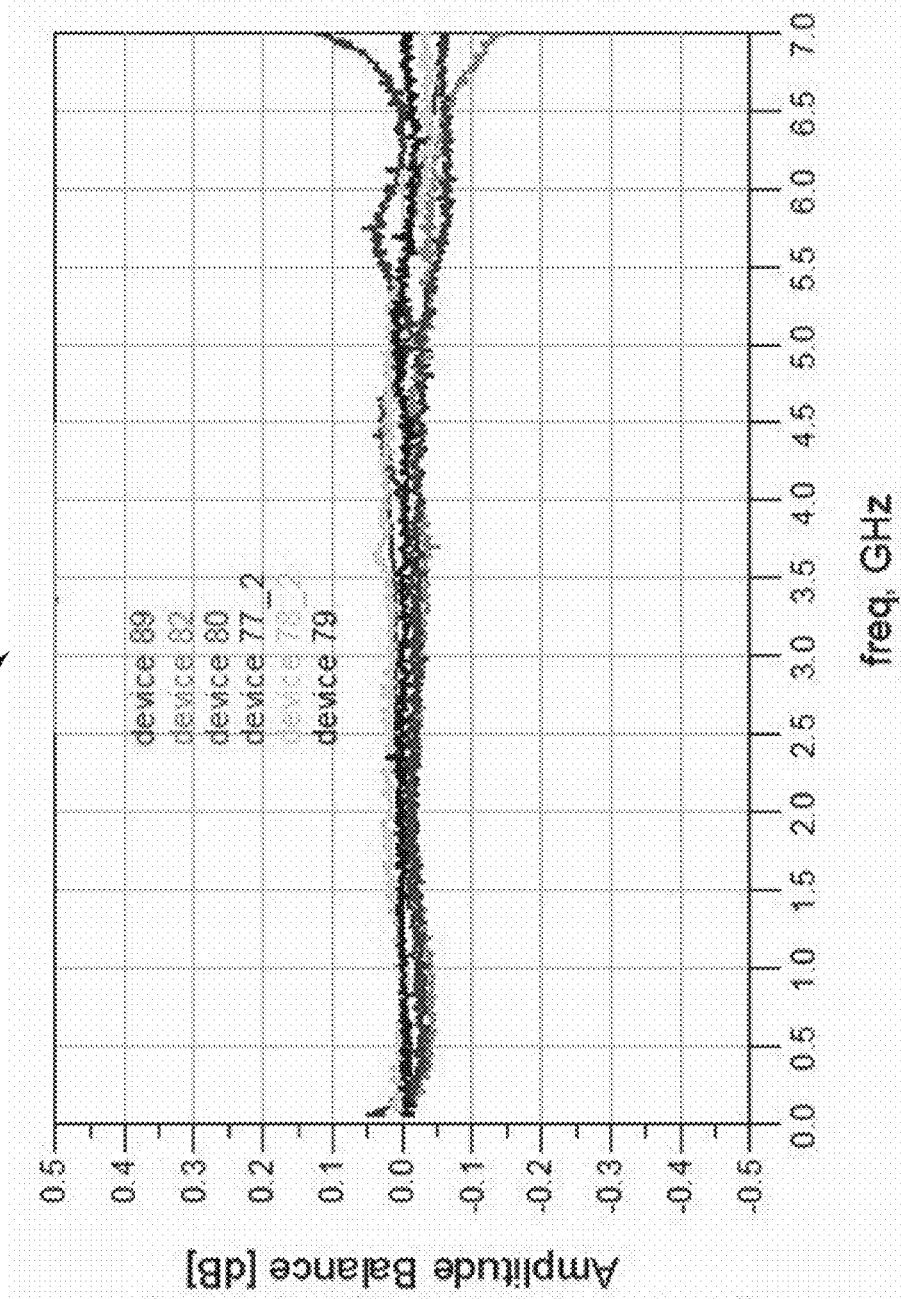
FIG. 79 illustrates a graph of measured amplitude balance for a number of constructed 2-way splitter/combiners.
Figure 80:
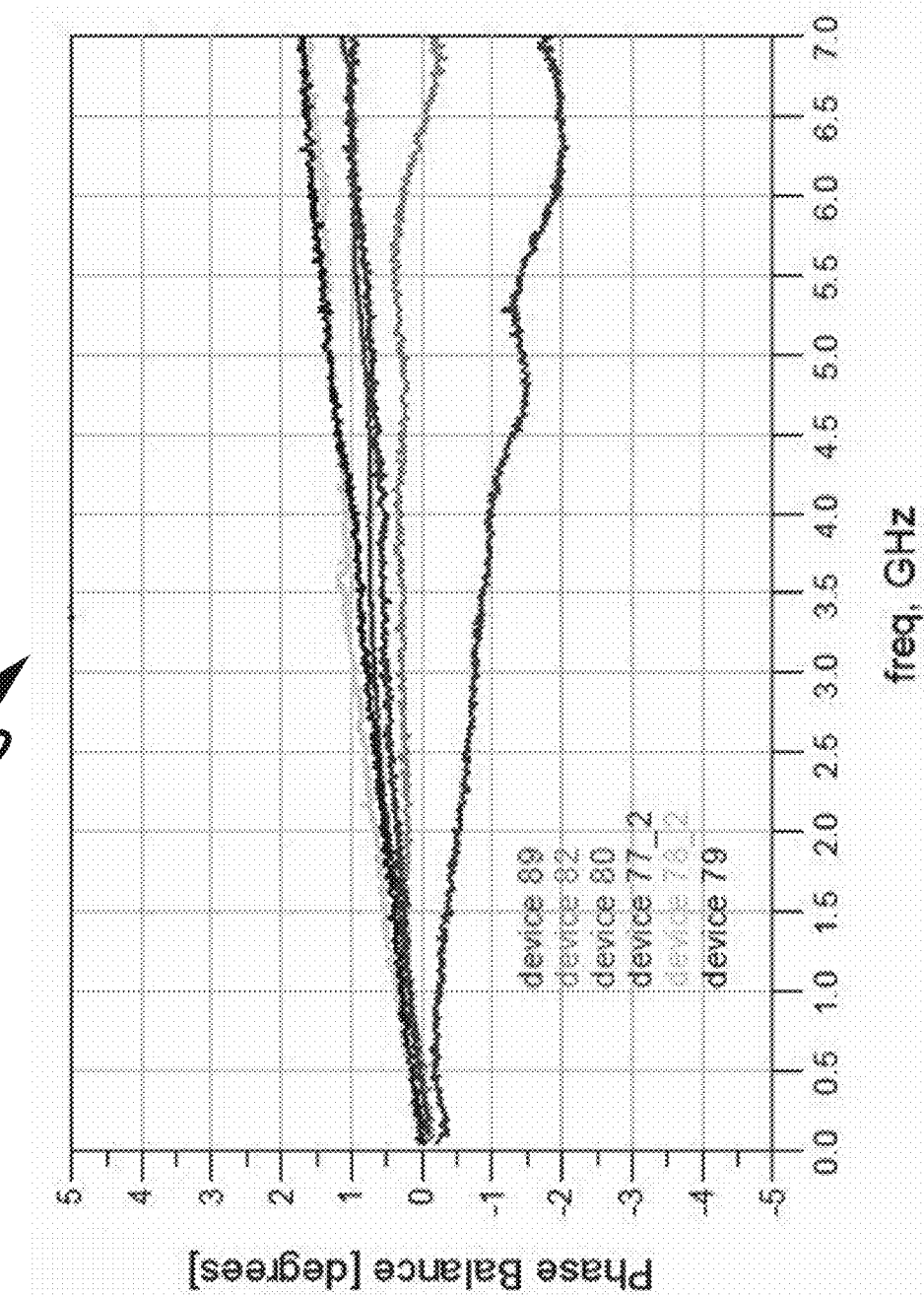
FIG. 80 illustrates a graph of measured phase balance for a number of constructed 2-way splitter/combiners.

Experimental lab results for a 2-way splitter/combiner embodiment as actually constructed are generally illustrated in FIG. 65 (6500)-FIG. 80 (8000). FIG. 65 (6500) provides a schematic block diagram of the 2-way splitter/combiner, depicting the port structures and constructed dimensions. FIG. 66 (6600) depicts the actual 2-way splitter/combiner construction in comparison to a reference object of known size. FIG. 67 (6700) depicts the actual 2-way splitter/combiner construction with improved detail. FIG. 68 (6800) depicts the actual 2-way splitter/combiner substrate trace construction in detail. FIG. 69 (6900)-FIG. 74 (7400) depict performance data from the constructed 2-way splitter/combiner of FIG. 66 (6600)-FIG. 68 (6800). Performance characteristics for a spread of constructed 2-way splitter/combiners is provided in FIG. 75 (7500)-FIG. 80 (8000). This performance data collected from actually fabricated devices compares favorably with simulations of the 2-way splitter/combiner design as taught by the present invention.

4-Way Splitter 1-Sided Experimental Results (8100)-(9100)

Figure 81:
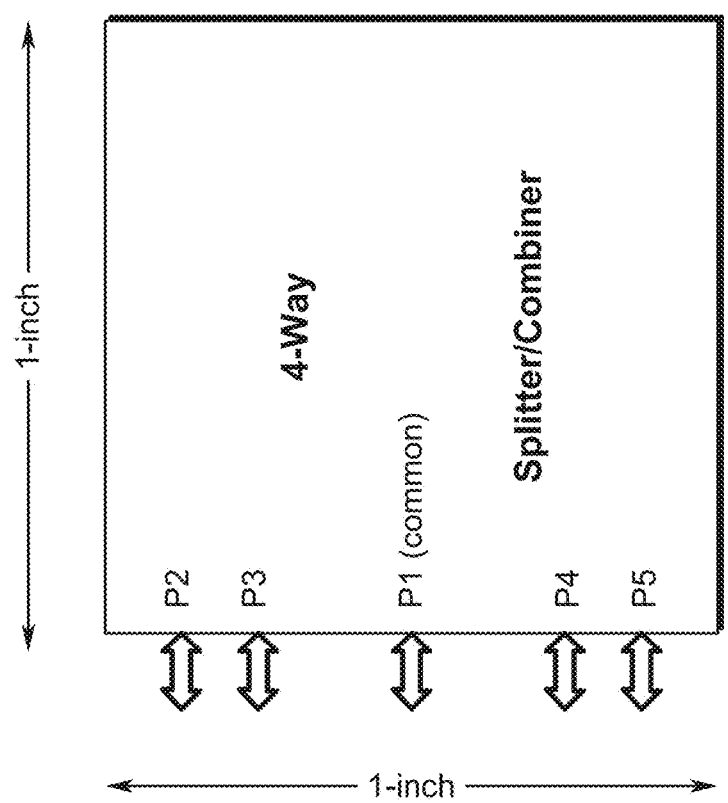
FIG. 81 illustrates a system block diagram of a constructed 4-way splitter/combiner with all ports on one side and depicts constructed dimensions and port structure orientation.
Figure 82:
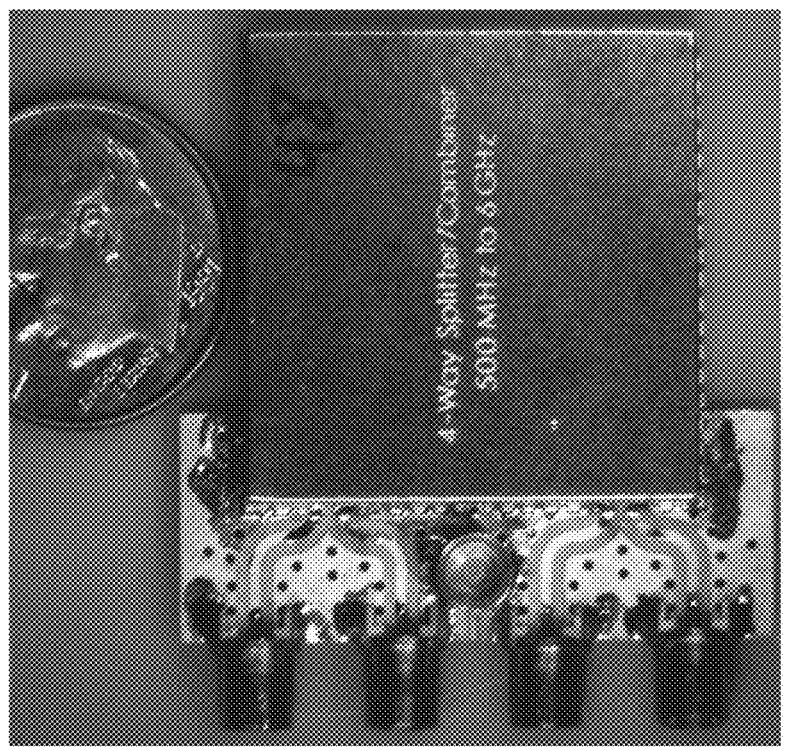
FIG. 82 illustrates a top view of a constructed 4-way splitter/combiner with reference size object.
Figure 83:
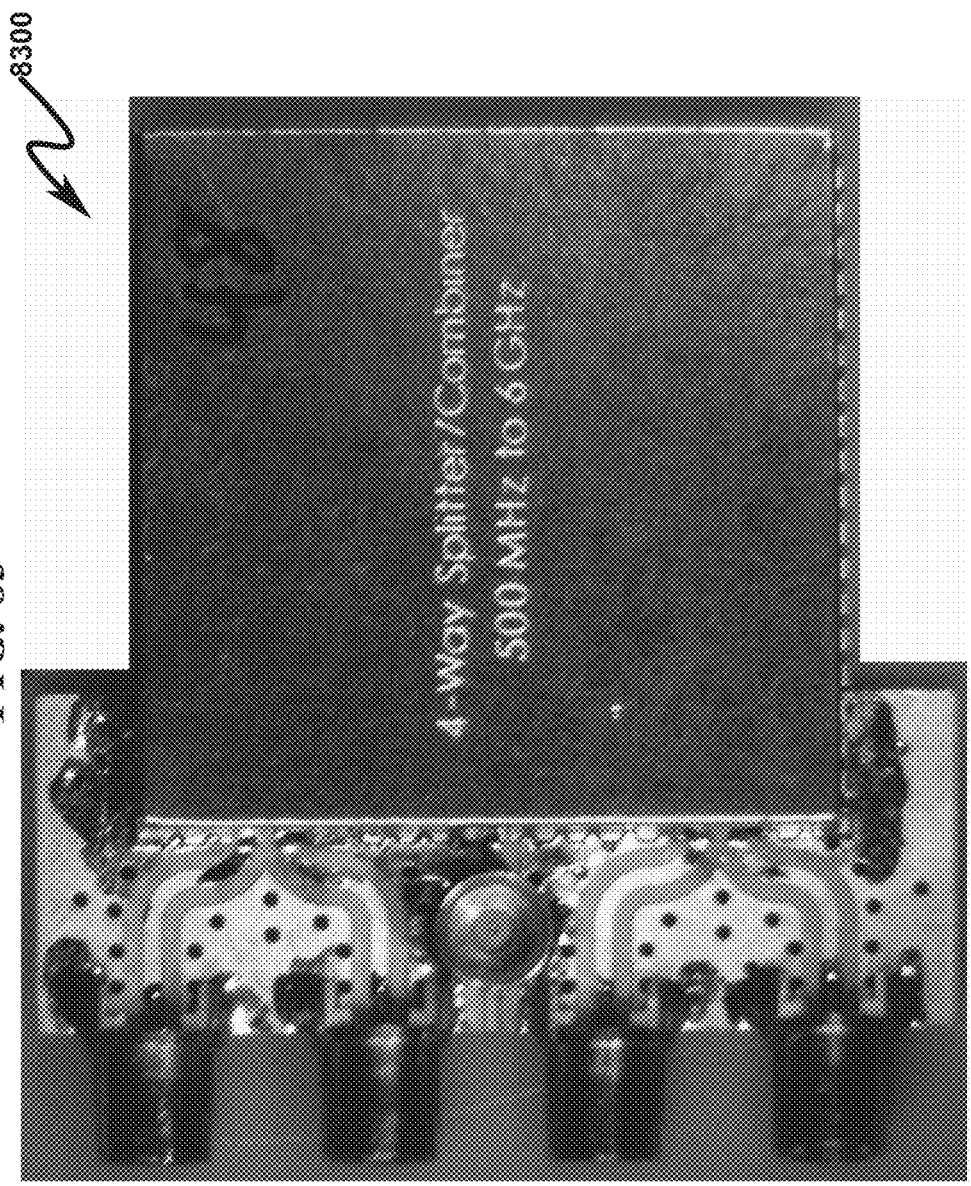
FIG. 83 illustrates a detail top view of a constructed 4-way splitter/combiner.
Figure 84:
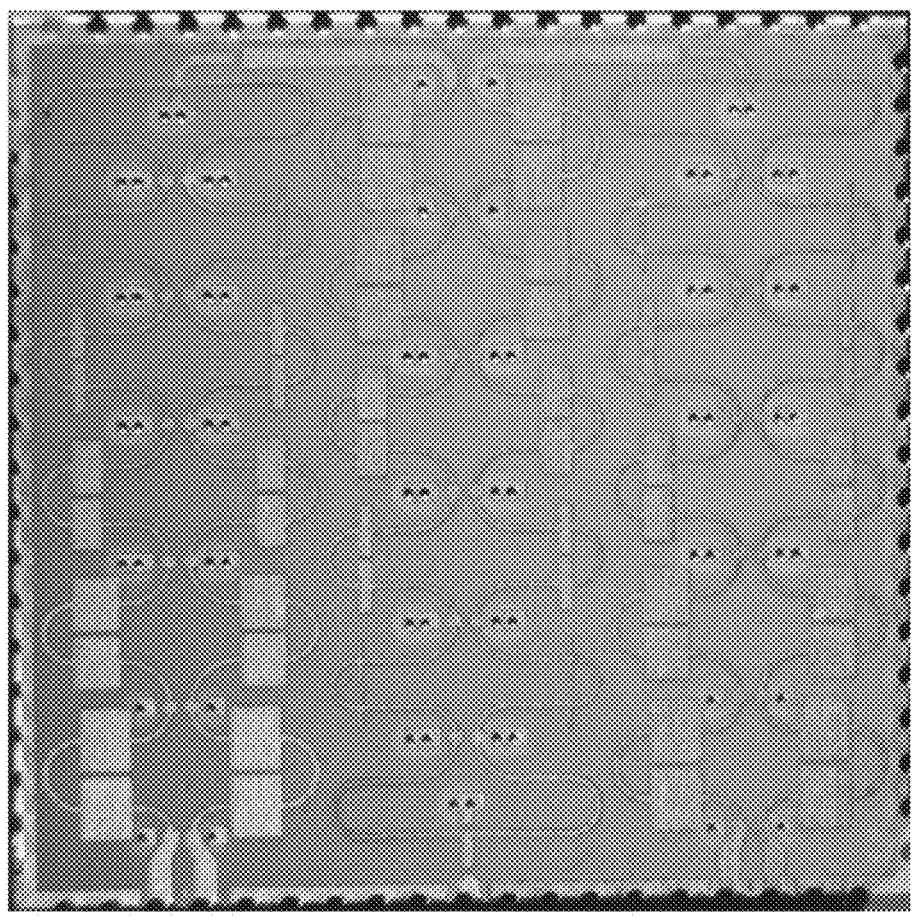
FIG. 84 illustrates a detail top view of a constructed 4-way splitter/combiner substrate.
Figure 85:
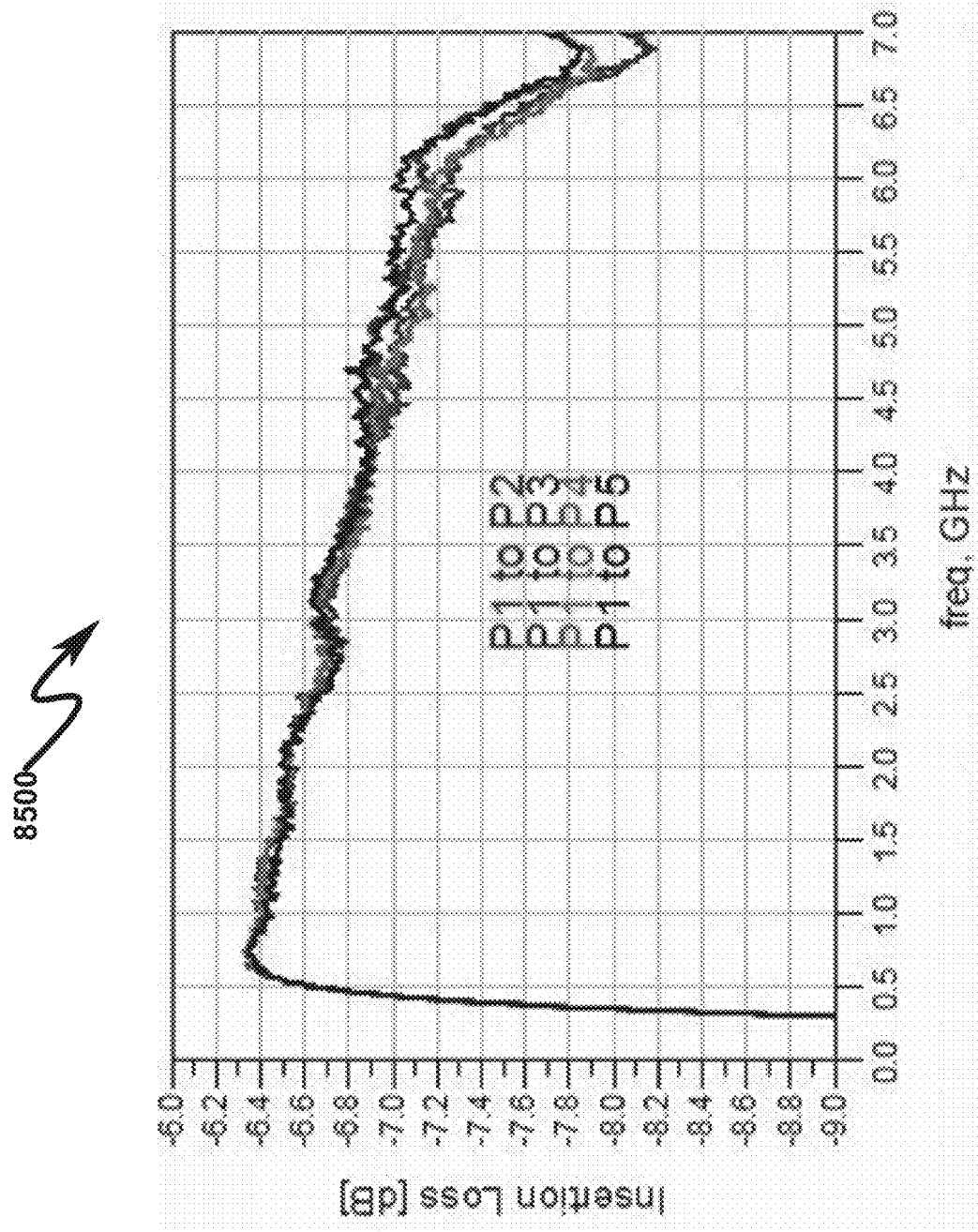
FIG. 85 illustrates a graph of measured insertion loss for the constructed 4-way splitter/combiner of FIG. 81-FIG. 84.
Figure 86:
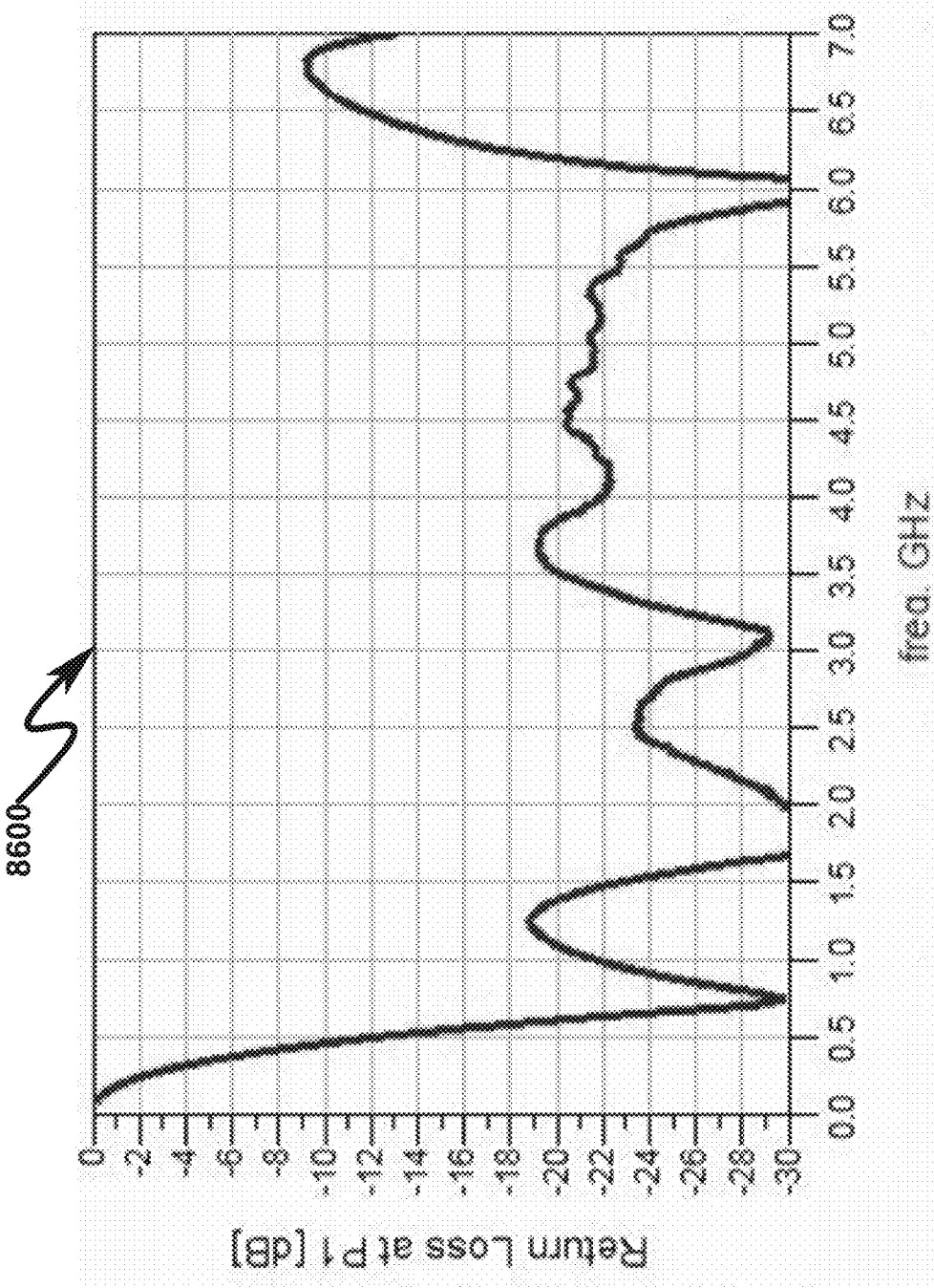
FIG. 86 illustrates a graph of measured return loss at P1 for the constructed 4-way splitter/combiner of FIG. 81-FIG. 84.
Figure 87:
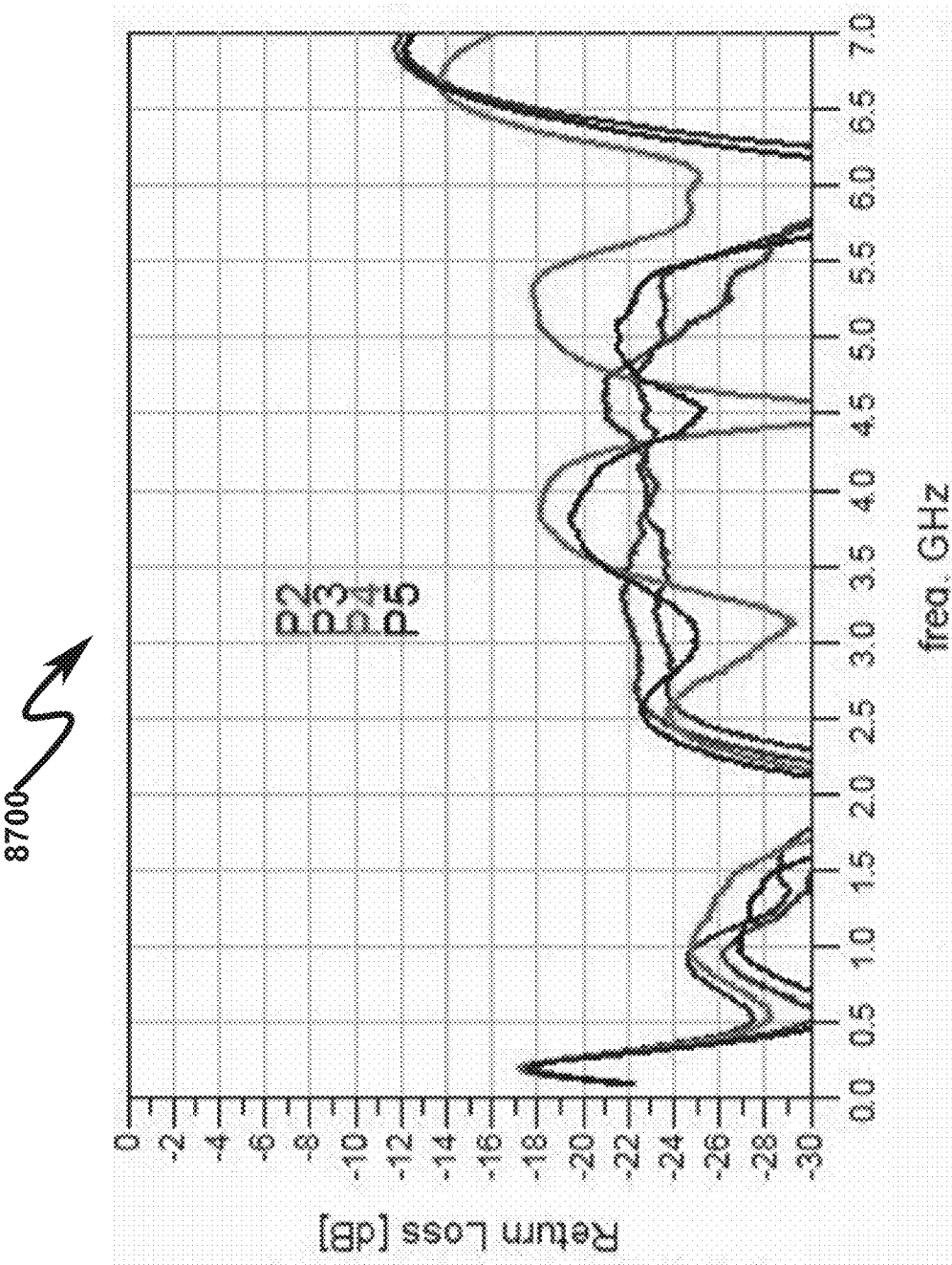
FIG. 87 illustrates a graph of measured output return loss at P2/P3/P4/P5 for the constructed 4-way splitter/combiner of FIG. 81-FIG. 84.
Figure 88:
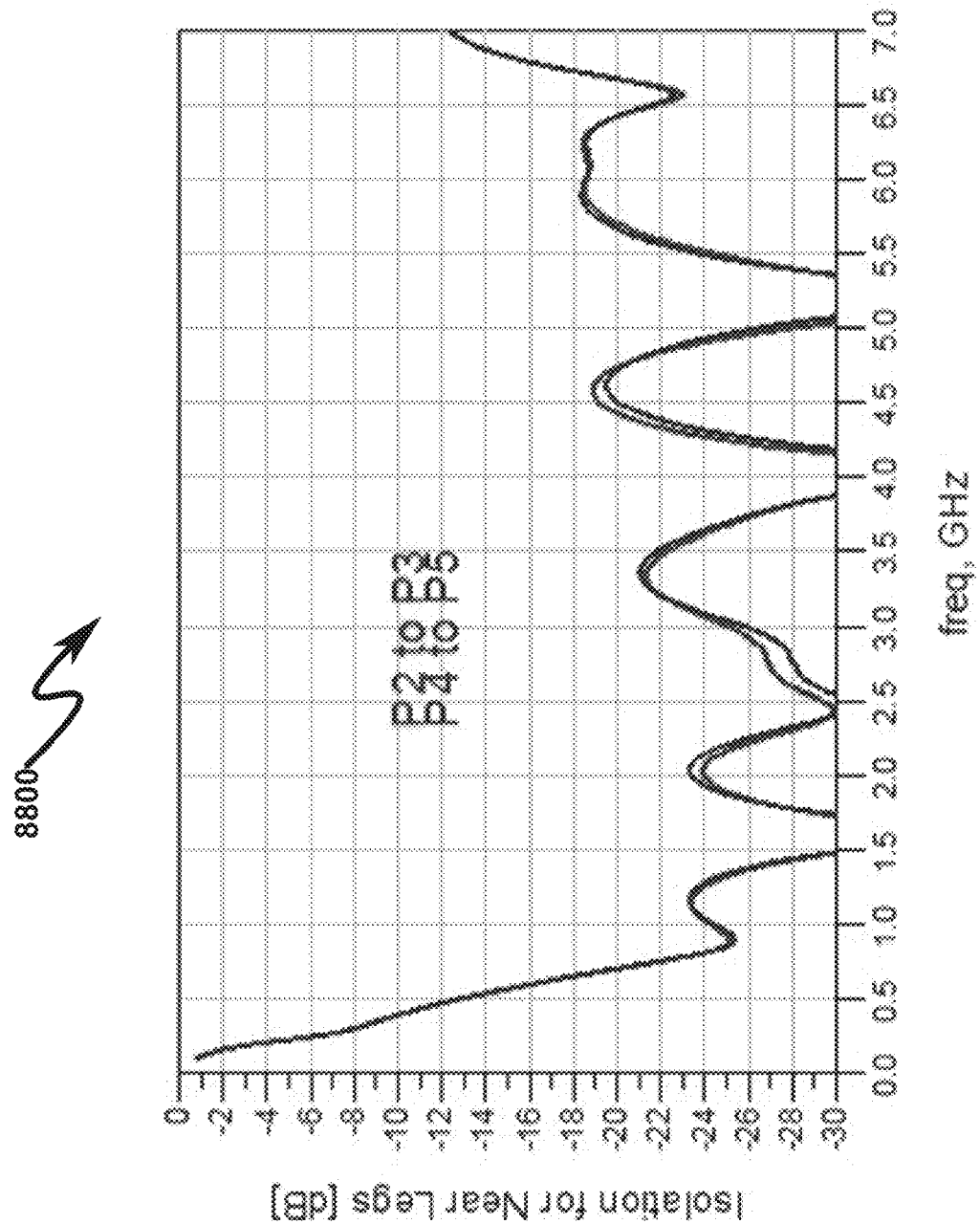
FIG. 88 illustrates a graph of measured isolation for near legs for the constructed 4-way splitter/combiner of FIG. 81-FIG. 84.
Figure 89:
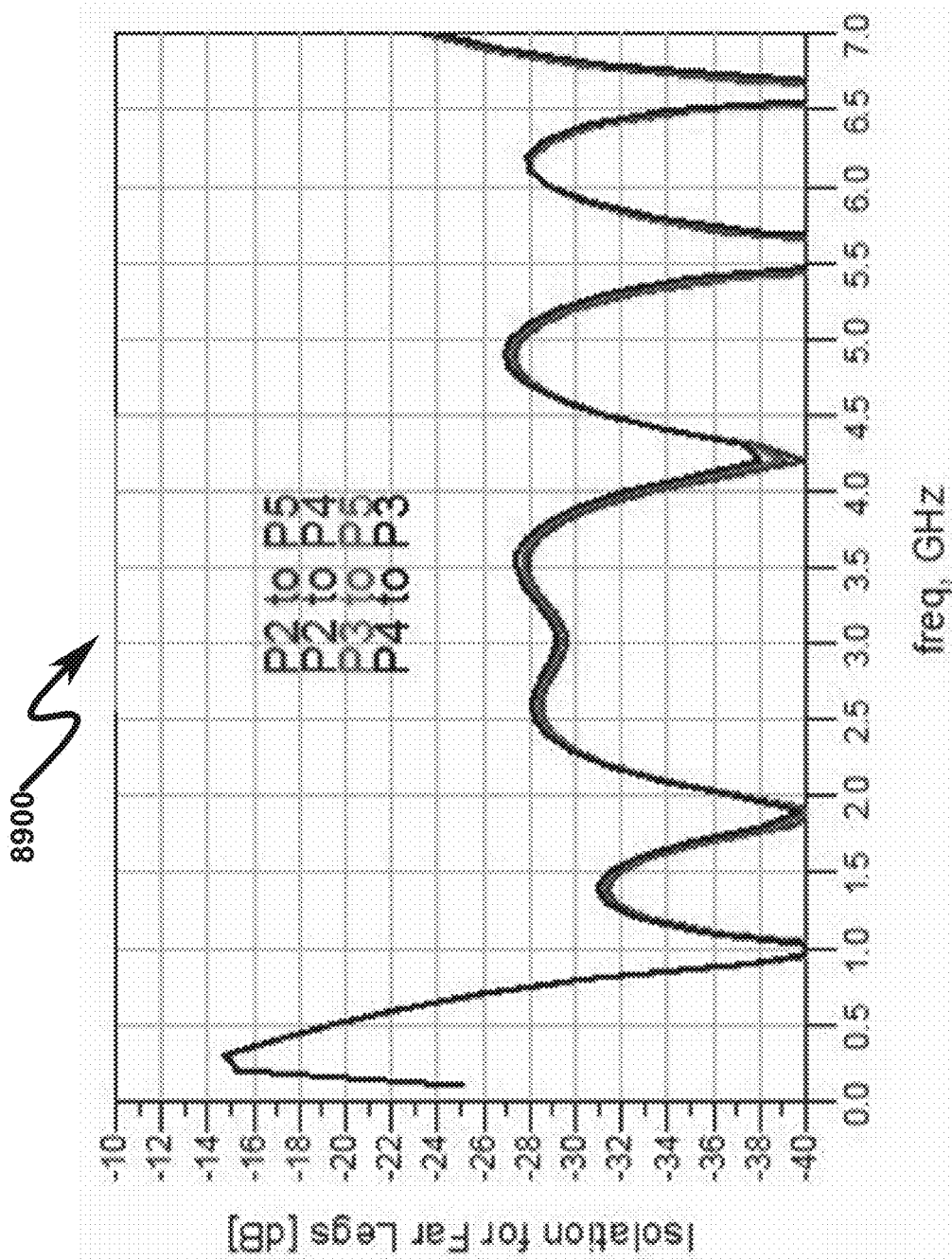
FIG. 89 illustrates a graph of measured isolation for far legs for the constructed 4-way splitter/combiner of FIG. 81-FIG. 84.
Figure 90:
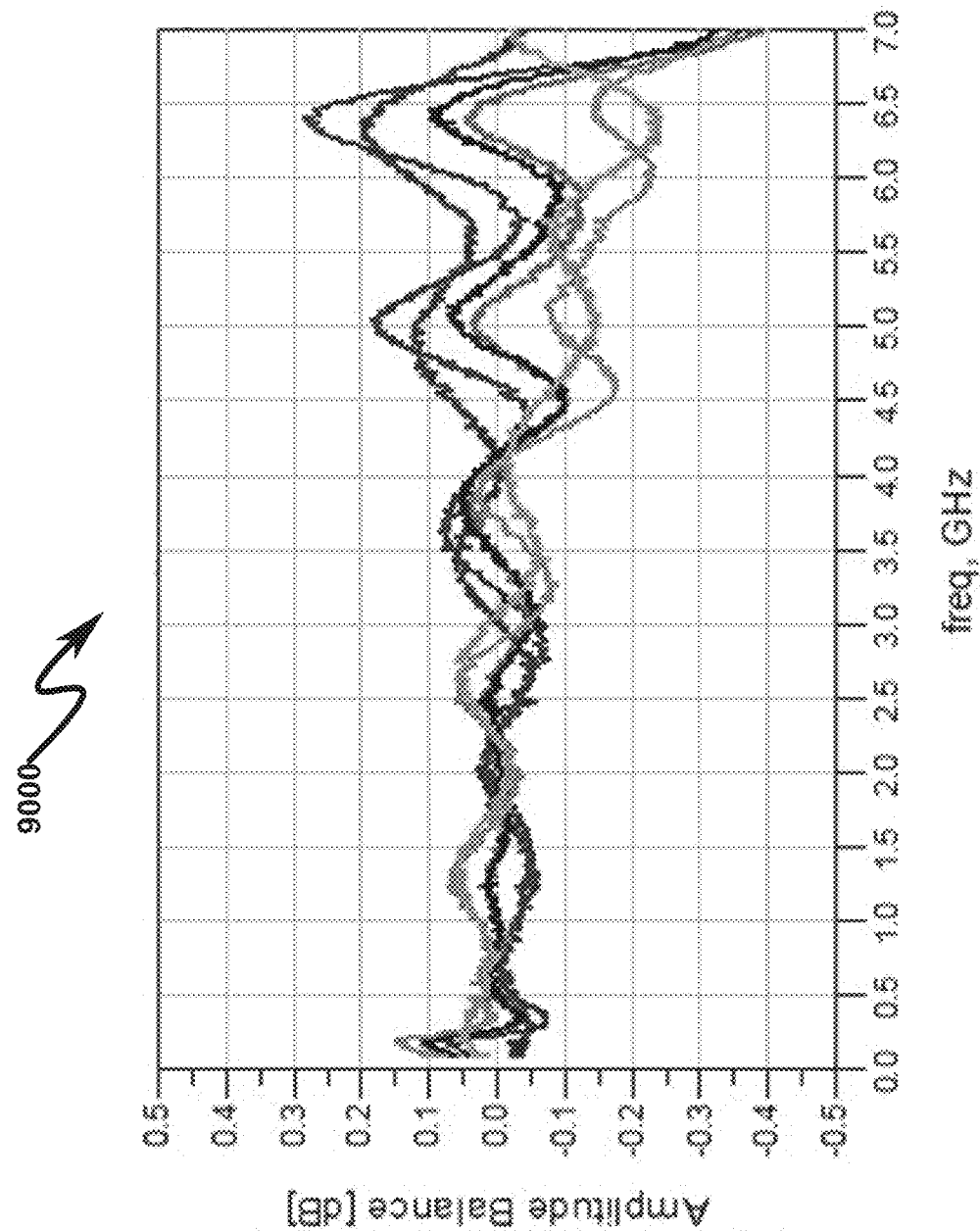
FIG. 90 illustrates a graph of measured amplitude balance for the constructed 4-way splitter/combiner of FIG. 81-FIG. 84.
Figure 91:
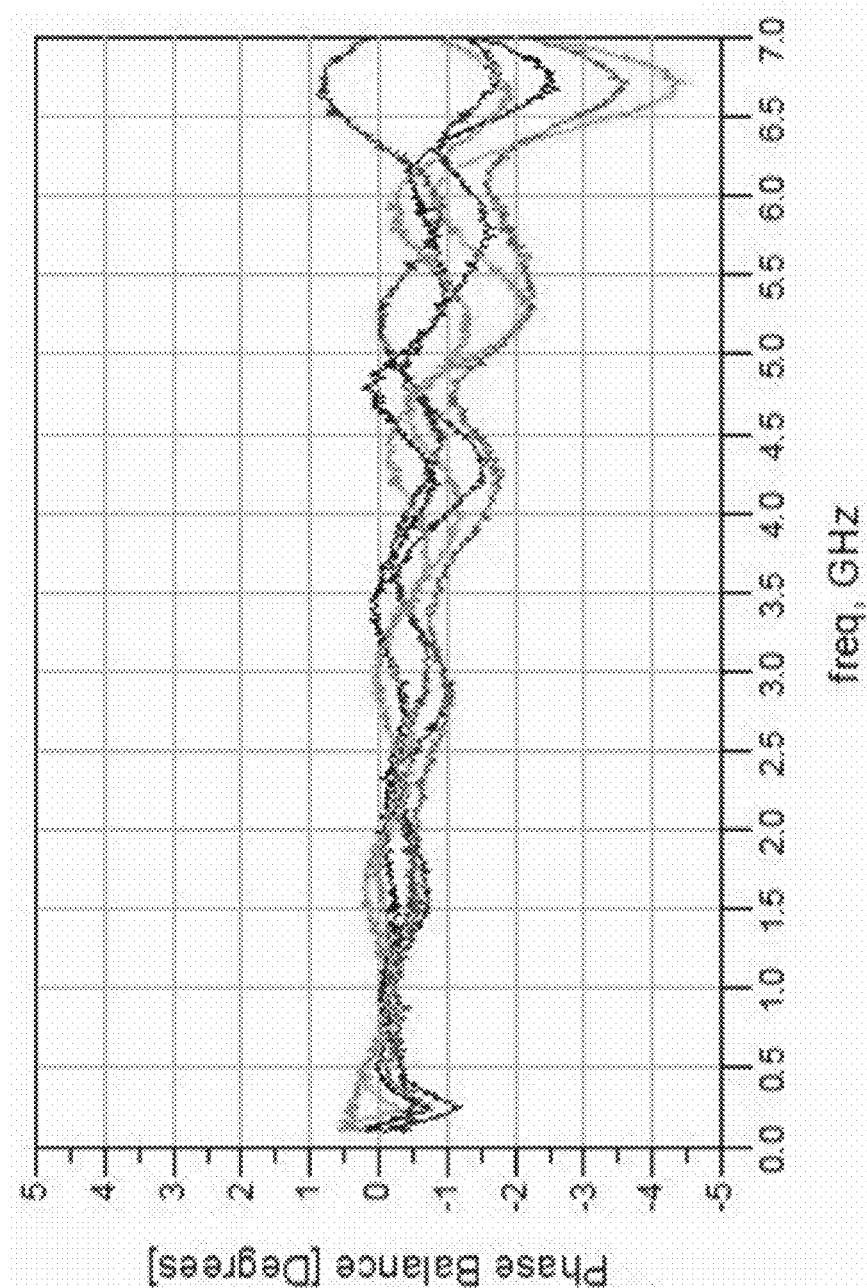
FIG. 91 illustrates a graph of measured phase balance for the constructed 4-way splitter/combiner of FIG. 81-FIG. 84.

Experimental lab results for a 4-way splitter/combiner embodiment with all ports on one side as actually constructed are generally illustrated in FIG. 81 (8100)-FIG. 91 (9100). FIG. 81 (8100) provides a schematic block diagram of the 4-way splitter/combiner with all ports on the same side, depicting the port structures and constructed dimensions. FIG. 82 (8200) depicts the actual 4-way splitter/combiner construction in comparison to a reference object of known size. FIG. 83 (8300) depicts the actual 4-way splitter/combiner construction with improved detail. FIG. 84 (8400) depicts the actual 4-way splitter/combiner substrate trace construction in detail. FIG. 85 (8500)-FIG. 91 (9100) depict performance data from the constructed 4-way splitter/combiner of FIG. 82 (8200)-FIG. 84 (8400). This performance data collected from actually fabricated devices compares favorably with simulations of the 4-way splitter/combiner design as taught by the present invention.

4-Way Splitter 2-Sided Experimental Results (9200)-(10200)

Figure 92:
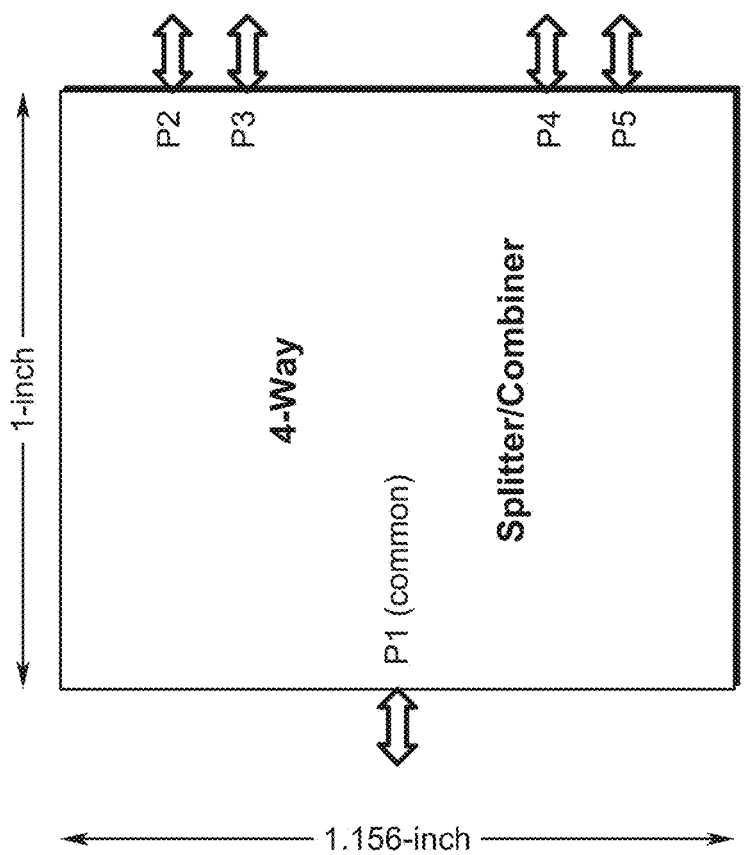
FIG. 92 illustrates a system block diagram of a constructed 4-way splitter/combiner with ports split across two sides of the device and depicts constructed dimensions and port structure orientation.
Figure 93:
FIG. 93 illustrates a top view of a constructed 4-way splitter/combiner with reference size object.
Figure 94:
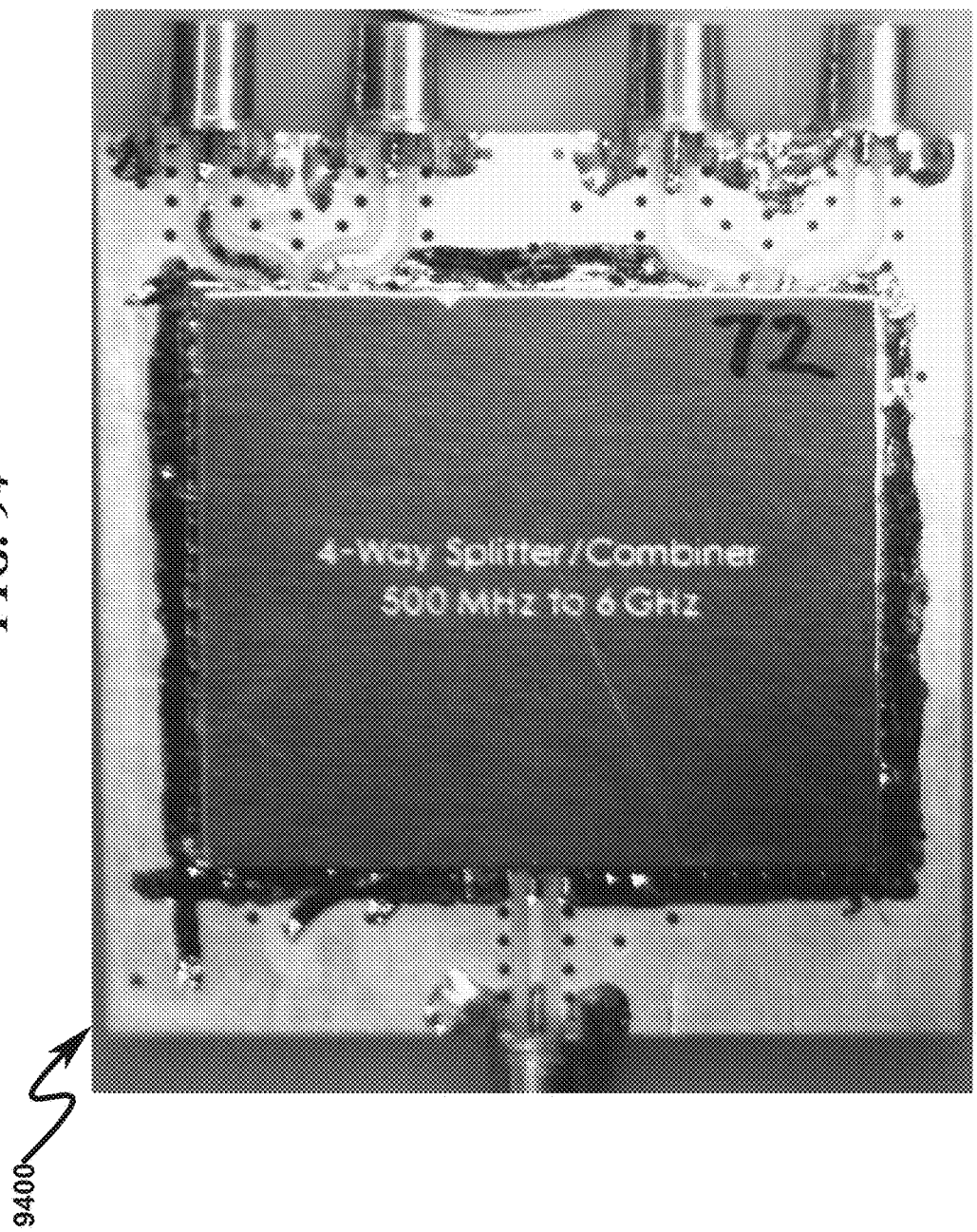
FIG. 94 illustrates a detail top view of a constructed 4-way splitter/combiner.
Figure 95:
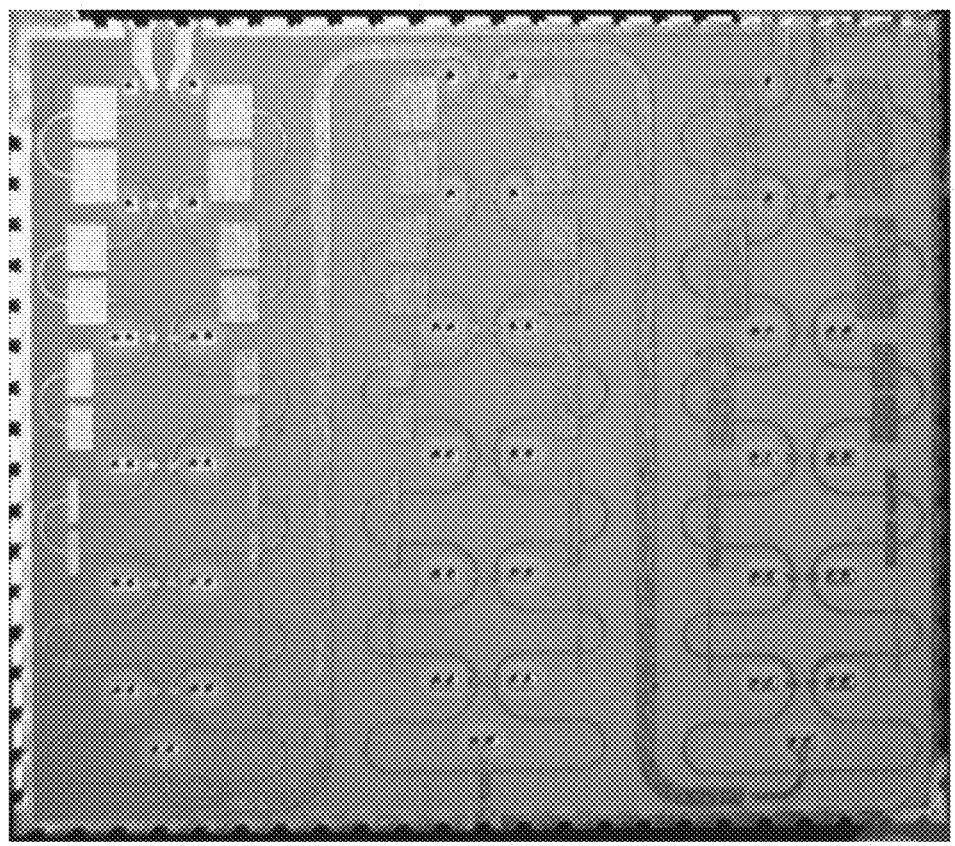
FIG. 95 illustrates a detail top view of a constructed 4-way splitter/combiner substrate.
Figure 96:
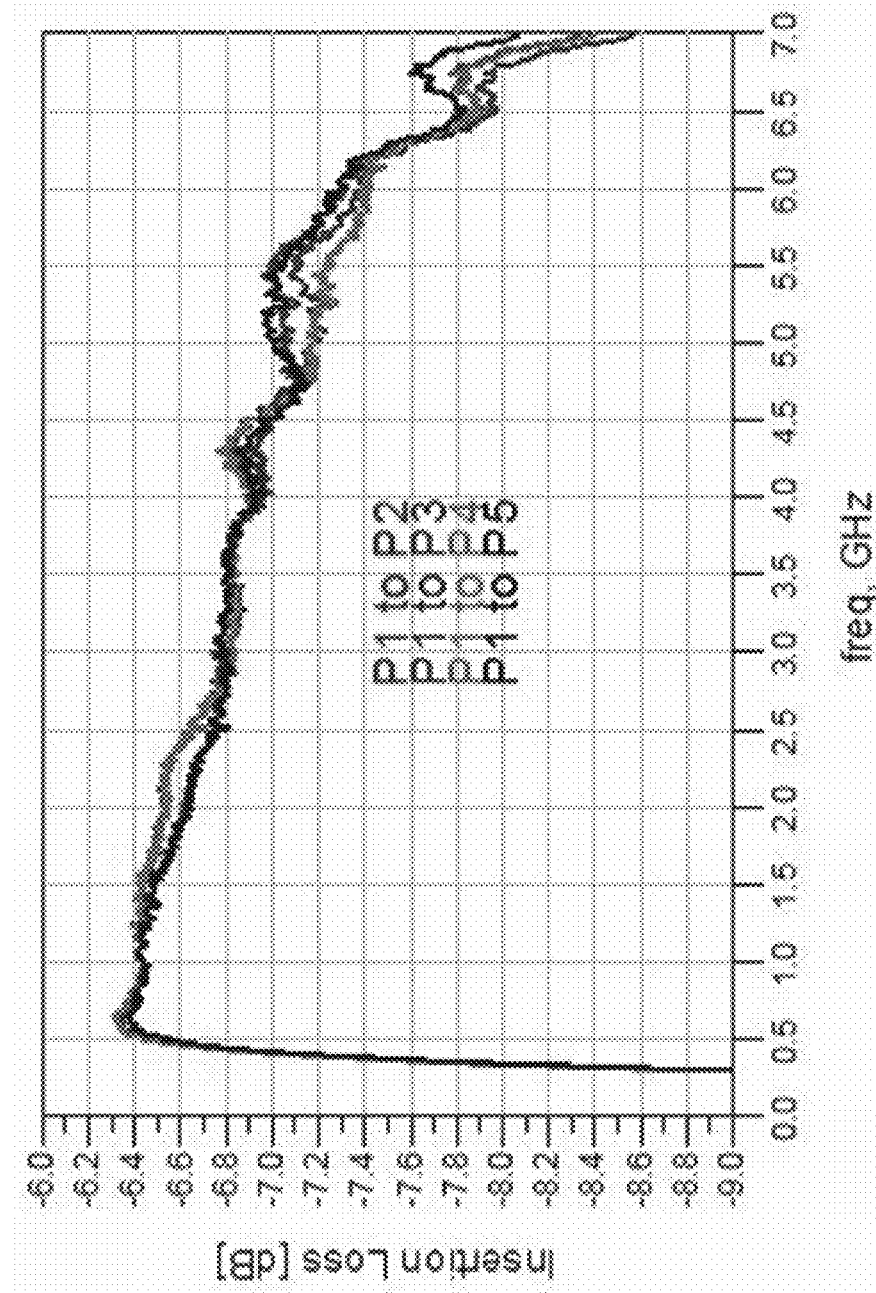
FIG. 96 illustrates a graph of measured insertion loss for the constructed 4-way splitter/combiner of FIG. 92-FIG. 95.
Figure 97:
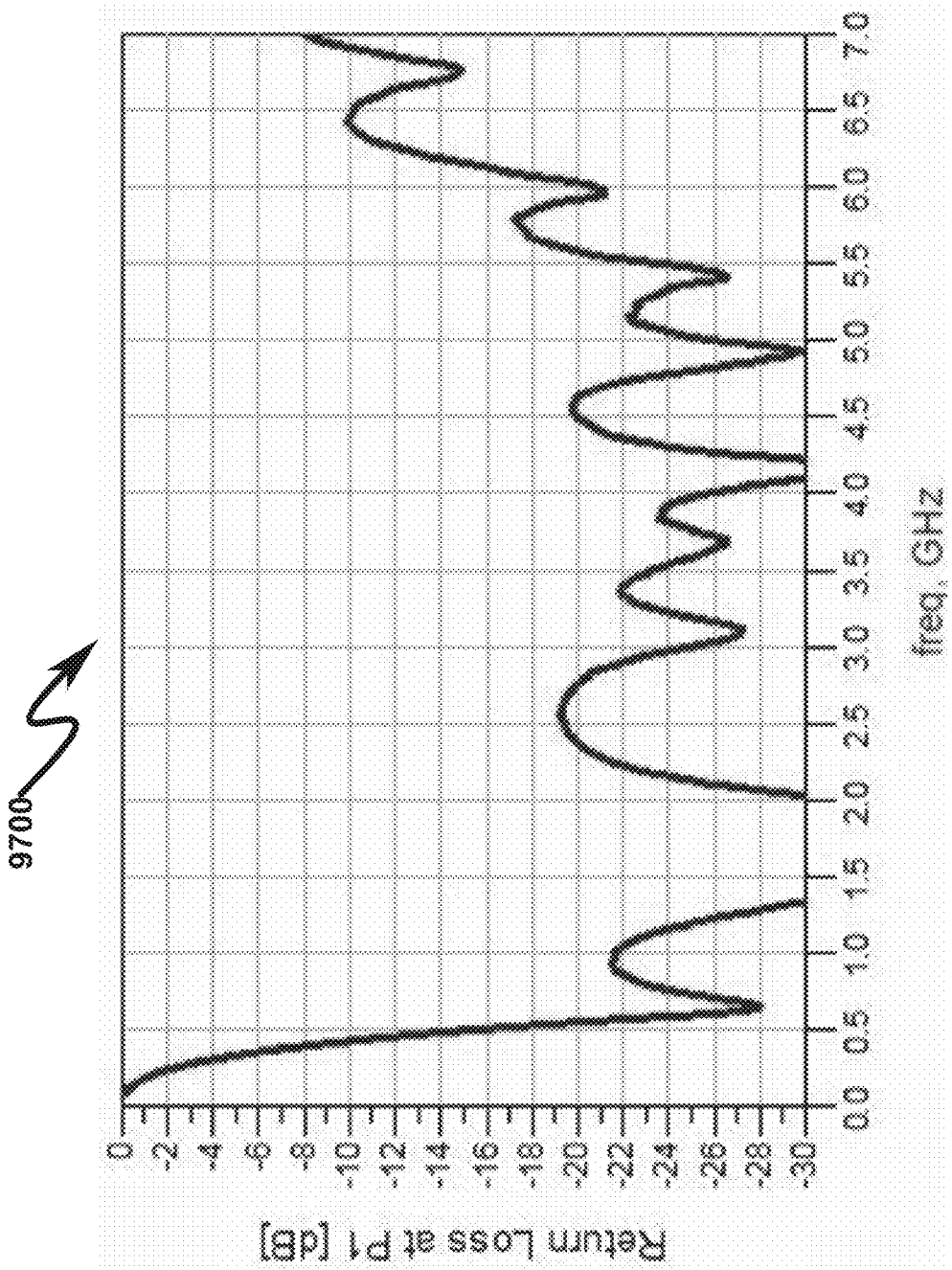
FIG. 97 illustrates a graph of measured return loss at P1 for the constructed 4-way splitter/combiner of FIG. 92-FIG. 95.
Figure 98:
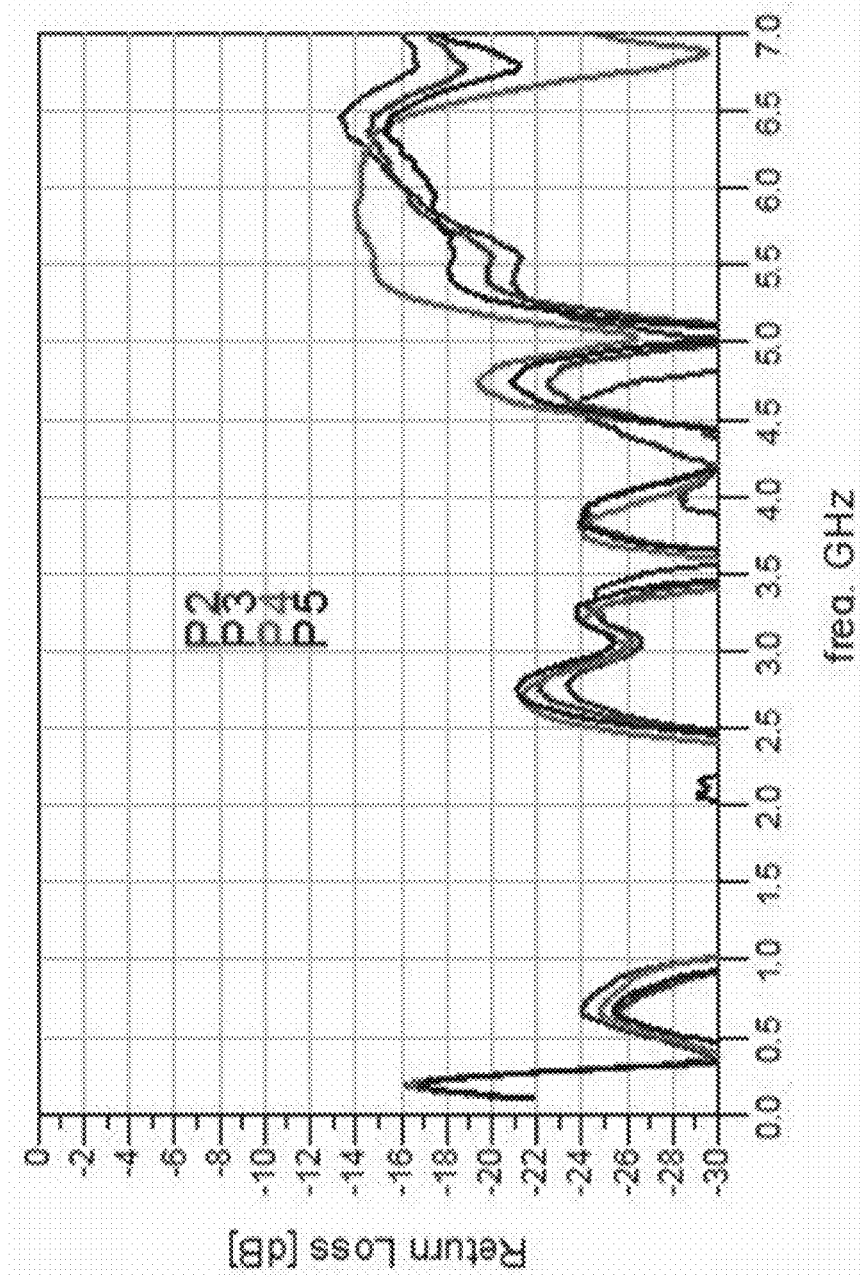
FIG. 98 illustrates a graph of measured output return loss at P2/P3/P4/P5 for the constructed 4-way splitter/combiner of FIG. 92-FIG. 95.
Figure 99:
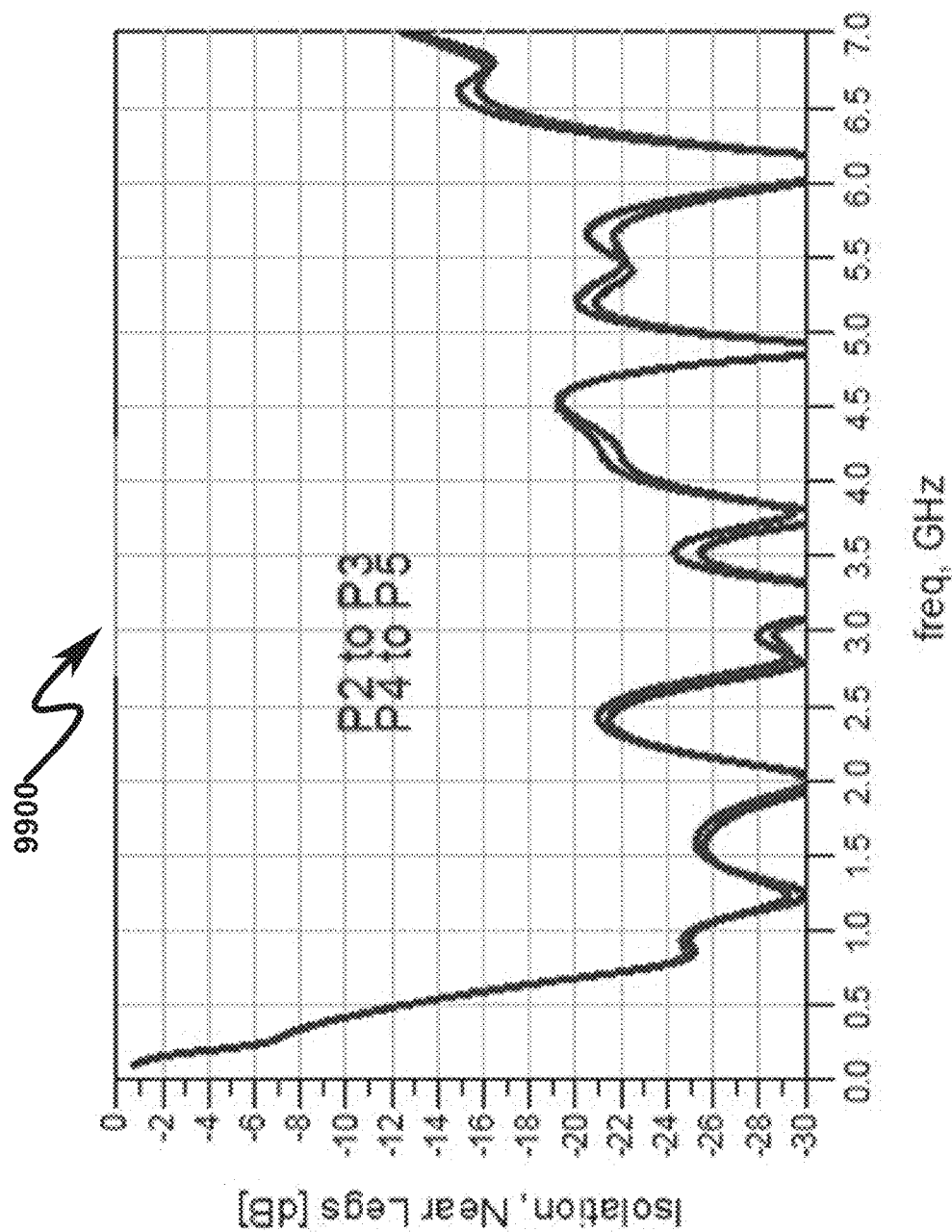
FIG. 99 illustrates a graph of measured isolation for near legs for the constructed 4-way splitter/combiner of FIG. 92-FIG. 95.
Figure 100:
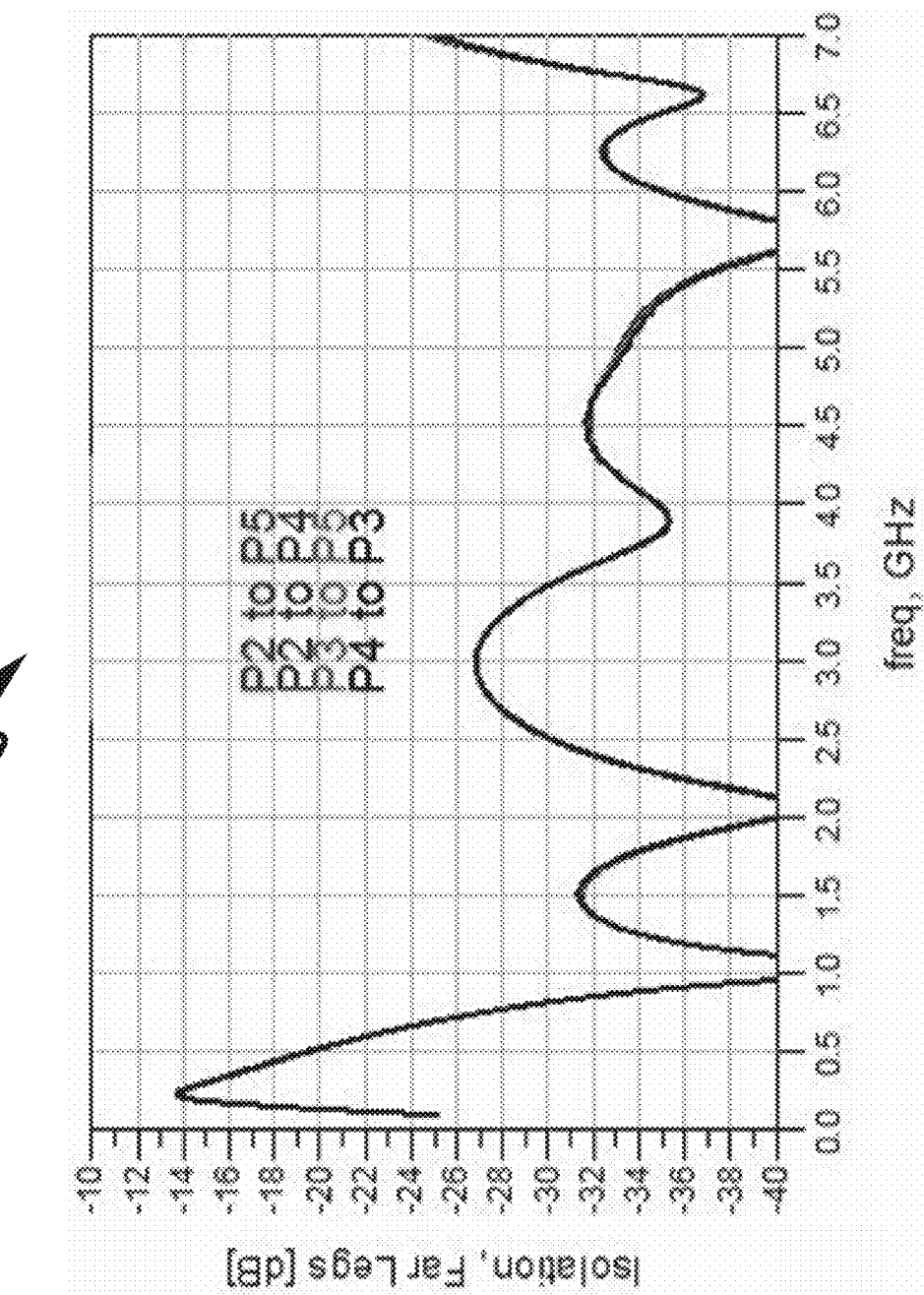
FIG. 100 illustrates a graph of measured isolation for far legs for the constructed 4-way splitter/combiner of FIG. 92-FIG. 95.
Figure 101:
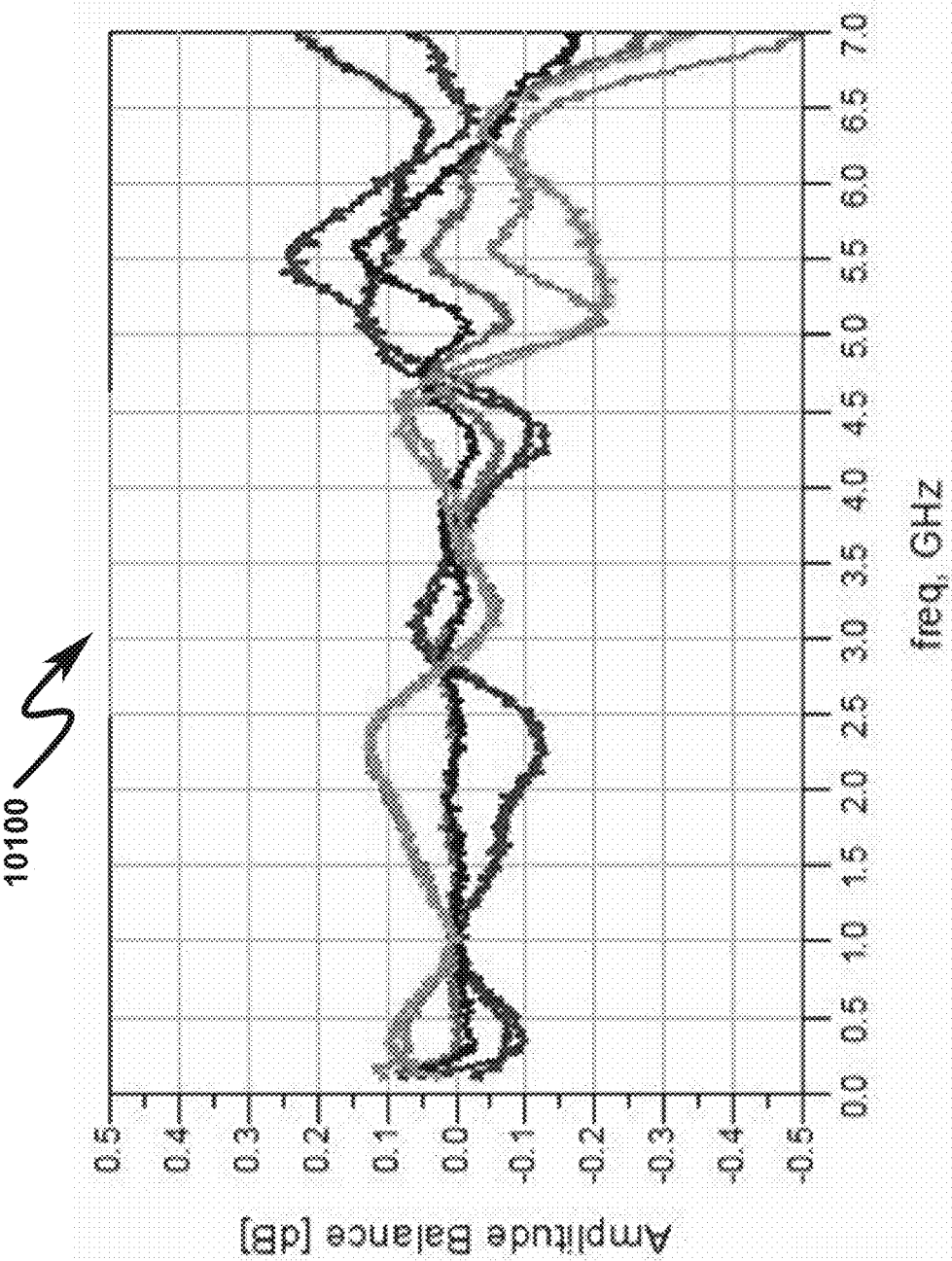
FIG. 101 illustrates a graph of measured amplitude balance for the constructed 4-way splitter/combiner of FIG. 92-FIG. 95.
Figure 102:
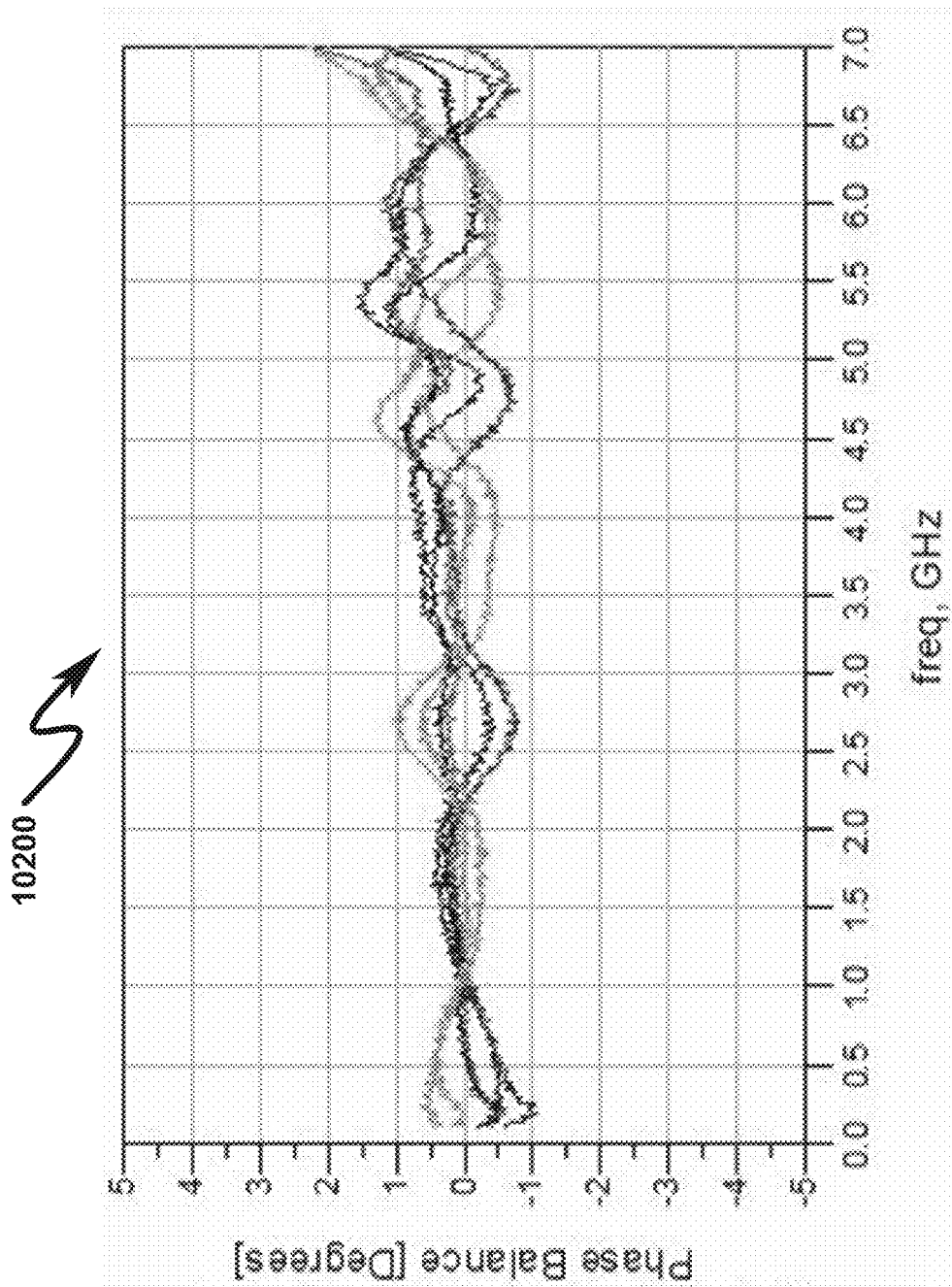
FIG. 102 illustrates a graph of measured phase balance for the constructed 4-way splitter/combiner of FIG. 92-FIG. 95.

Experimental lab results for a 4-way splitter/combiner embodiment with common and split ports on different sides as actually constructed are generally illustrated in FIG. 92 (9200)-FIG. 102 (10200). FIG. 92 (9200) provides a schematic block diagram of the 4-way splitter/combiner with common and split ports on different sides, depicting the port structures and constructed dimensions. FIG. 93 (9300) depicts the actual 4-way splitter/combiner construction in comparison to a reference object of known size. FIG. 94 (9400) depicts the actual 4-way splitter/combiner construction with improved detail. FIG. 95 (9500) depicts the actual 4-way splitter/combiner substrate trace construction in detail. FIG. 96 (9600)-FIG. 102 (10200) depict performance data from the constructed 4-way splitter/combiner of FIG. 93 (9300)-FIG. 102 (10200). This performance data collected from actually fabricated devices compares favorably with simulations of the 4-way splitter/combiner design as taught by the present invention.

Cascaded 2x4 8-Way Splitter/Combiner (10300)

Figure 103:
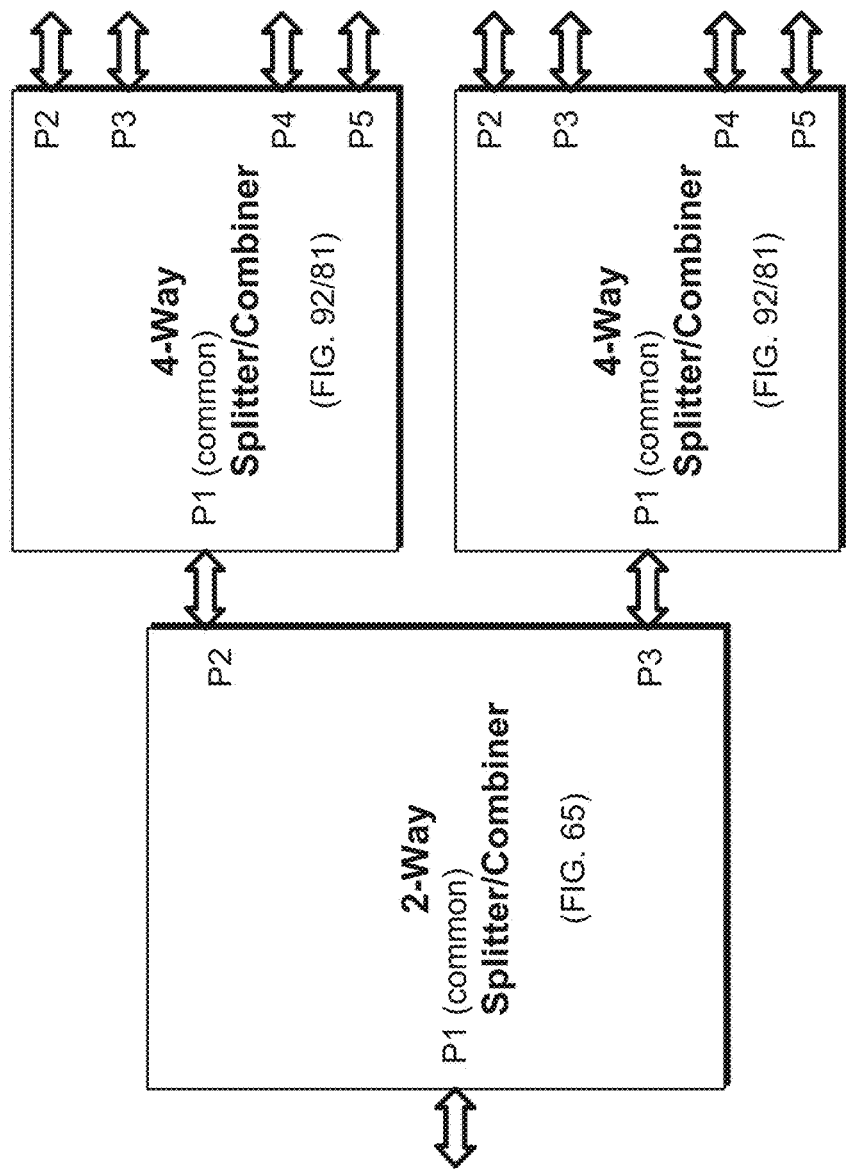
FIG. 103 illustrates a cascaded 2×4 8-way splitter/combiner schematic combining the structures of FIG. 65 and FIG. 92.

As generally depicted in FIG. 103 (10300), the present invention may utilize cascaded variants of the embodiments illustrated herein. As depicted in FIG. 103 (10300), the 2-way splitter/combiner of FIG. 65 (6500) is cascaded with two 4-way splitter/combiners of FIG. 92 (9200) (or equivalently of FIG. 81 (8100)). These systems as depicted may be incorporated on a single substrate in some application contexts.

Cascaded 4x2 8-Way Splitter/Combiner (10400)

Figure 104:
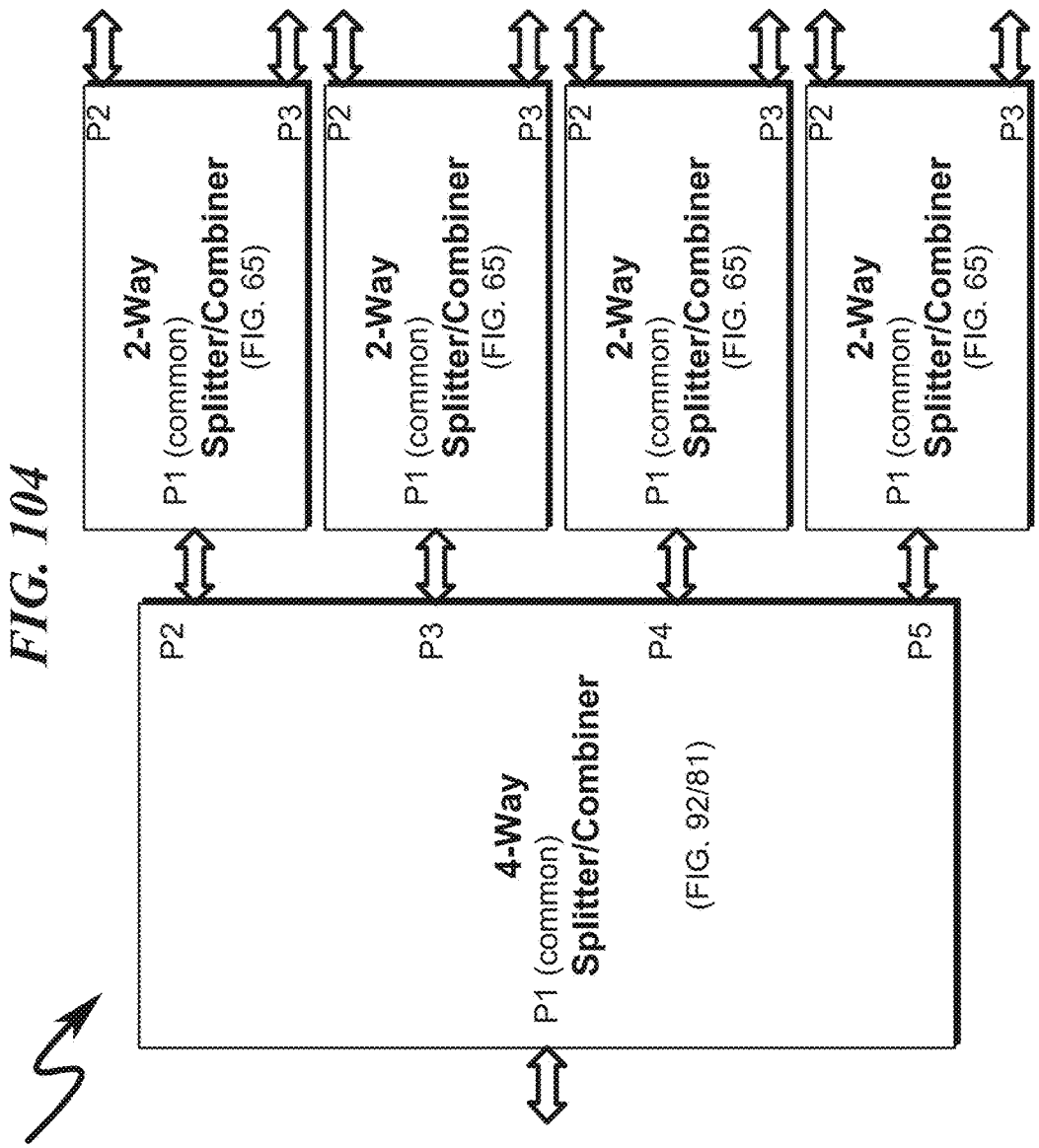
FIG. 104 illustrates a cascaded 4×2 8-way splitter/combiner schematic combining the structures of FIG. 92 and FIG. 65.

As generally depicted in FIG. 104 (10400), the present invention may utilize cascaded variants of the embodiments illustrated herein. As depicted in FIG. 104 (10400), a 4-way splitter/combiner of FIG. 92 (9200) (or equivalently of FIG. 81 (8100)) may be cascaded with four 2-way splitter/combiner of FIG. 65 (6500). These systems as depicted may be incorporated on a single substrate in some application contexts.

Other Cascading Options

One skilled in the art will recognize that the present invention may be embodied in other cascading variants to achieve arbitrary splitter/combiner power partitioning.

System Summary

The present invention system may be broadly generalized as a system for RF power splitting/combining comprising:
(a) signal routing substrate (SRS);
(b) RF input port (RIP);
(c) RF output port (ROP); and
(d) serpentine impedance network (SIN);
wherein
the SRS comprises a dielectric plate having a conducting bottom reference plane (BRP) and conducting signal traces comprising a top signal plane (TSP);
the TSP electrically couples the RIP, the SIN, and the ROP;
the RIP is configured to accept a RF signal input (RSI);
the RIP is configured to electrically couple the RSI to the SIN using an input passive electrical component (IPC);
the ROP comprises a first output port (FOP) and a second output port (SOP) each configured to emit a matched respective RF signal output (RSO) derived from the RSI;
the ROP is configured to electrically couple the SIN to the FOP and the SOP with a pair of output passive electrical components (OPC);
the SIN comprises a first serpentine impedance trace (FST) on the TSP and a second serpentine impedance traces (SST) on the TSP;
the FST and the SST are configured as mirrored structures about a common reference plane between the FST and the SST;
the FST and the SST each comprise a series of positive serpentine node (PSN) traces and negative serpentine node (NSN) traces;
the series of the PSN and the NSN comprise individually selected trace widths (ITW);
the FST and the SST incorporate a series of paired coupling traces (PCT) positioned between the PSN and the NSN on the FST and the SST respectively;
the NSN of the FST is electrically coupled to a corresponding mirrored NSN of the SST with a bridge passive electrical component (BPC);
the NSN of each FST is electrically coupled to the BRP with a first passive electrical component (FPC);
the NSN of each SST is electrically coupled to the BRP with a second passive electrical component (SPC); and
the IPC, the OPC, the BPC, the FPC, the SPC, the PCT, and the ITW are selected to impedance match the RIP to the FOP and the SOP.

This general system summary may be augmented by the various elements described herein to produce a wide variety of invention embodiments consistent with this overall design description.

Method Summary

The present invention method may be broadly generalized as a method for RF power splitting/combining comprising:
(1) forming a signal routing substrate (SRS) comprising a dielectric plate having a conducting bottom reference plane (BRP) and conducting signal traces comprising a top signal plane (TSP);

(2) forming a RF input port (RIP) on the TSP;
(3) forming a RF output port (ROP) on the TSP;
(4) forming a serpentine impedance network (SIN) on the TSP; and
(5) with the TSP, electrically coupling the RIP, the SIN, and the ROP;

wherein:

the RIP is configured to accept a RF signal input (RSI);

the RIP is configured to electrically couple the RSI to the SIN using an input passive electrical component (IPC);

the ROP comprises a first output port (FOP) and a second output port (SOP) each configured to emit a matched respective RF signal output (RSO) derived from the RSI;

the ROP is configured to electrically couple the SIN to the FOP and the SOP with a pair of output passive electrical components (OPC);

the SIN comprises a first serpentine impedance trace (FST) on the TSP and a second serpentine impedance traces (SST) on the TSP;

the FST and the SST are configured as mirrored structures about a common reference plane between the FST and the SST;

the FST and the SST each comprise a series of positive serpentine node (PSN) traces and negative serpentine node (NSN) traces;

the series of the PSN and the NSN comprise individually selected trace widths (ITW);

the FST and the SST incorporate a series of paired coupling traces (PCT) positioned between the PSN and the NSN on the FST and the SST respectively;

the NSN of the FST is electrically coupled to a corresponding mirrored NSN of the SST with a bridge passive electrical component (BPC);

the NSN of each FST is electrically coupled to the BRP with a first passive electrical component (FPC);

the NSN of each SST is electrically coupled to the BRP with a second passive electrical component (SPC); and the IPC, the OPC, the BPC, the FPC, the SPC, the PCT, and the ITW are selected to impedance match the RIP to the FOP and the SOP.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

System/Method Variations

The present invention anticipates a wide variety of variations in the basic theme of construction. The examples presented previously do not represent the entire scope of possible usages. They are meant to cite a few of the almost limitless possibilities.

This basic system, method, and product-by-process may be augmented with a variety of ancillary embodiments, including but not limited to:

An embodiment wherein the SRS comprises a material selected from a group consisting of: FR-4 fiberglass resin (glass-reinforced epoxy laminate printed circuit board (PCB)); ROGERS CORPORATION model RT/DUROID® 5870 brand glass microfiber reinforced PTFE composite laminate; ROGERS CORPORATION model RT/DUROID® 5880 brand glass microfiber reinforced PTFE composite laminate; ROGERS CORPORATION model RT/DUROID® 6002 brand glass microfiber reinforced PTFE composite laminate; ROGERS CORPORATION model RT/DUROID® 6006 brand glass microfiber reinforced PTFE composite laminate; ROGERS CORPORATION model RT/DUROID® 6010 brand glass microfiber reinforced PTFE composite laminate; ROGERS CORPORATION series RO3000® model RO3003 brand PTFE/ceramic laminate; ROGERS CORPORATION series RO3000® model RO3006 brand PTFE/ceramic laminate; ROGERS CORPORATION series RO3000® model RO3010 brand PTFE/ceramic laminate; ROGERS CORPORATION model RO3203 brand woven glass laminate; ROGERS CORPORATION series RO3000® model RO3210 brand woven glass laminate; and polytetrafluoroethylene (PTFE).

An embodiment wherein the IPC comprises a circuit component selected from a group consisting of: a capacitor; and an inductor.

An embodiment wherein the OPC comprises a circuit component selected from a group consisting of: a capacitor; and an inductor.

An embodiment wherein the BPC comprises a resistor.

An embodiment wherein the FPC comprises a circuit component selected from a group consisting of: a capacitor; and an inductor.

An embodiment wherein the SPC comprises a circuit component selected from a group consisting of: a capacitor; and an inductor.

An embodiment wherein the IPC, the OPC, the BPC, the FPC, the SPC, the PCT, and the ITW are selected to impedance match the RIP, the FOP, and the SOP at 50 ohms.

An embodiment wherein the IPC, the OPC, the BPC, the FPC, the SPC, the PCT, and the ITW are selected to impedance match the RIP, the FOP, and the SOP at 75 ohms.

An embodiment consisting of a 4-way RF splitter/combiner system comprising:

(a) first two-way RF splitter/combiner (FSC) having RIP, FOP, and SOP ports;

(b) second two-way RF splitter/combiner (SSC) having RIP, FOP, and SOP ports;

(c) third two-way RF splitter/combiner (TSC) having RIP, FOP, and SOP ports;

wherein:

the FOP port of the FSC is electrically coupled to the RIP port of the SSC;

the SOP port of the FSC is electrically coupled to the RIP port of the TSC; and the FSC, the SSC, and the TSC are formed on a common substrate.

An embodiment wherein the RIP is connectorized.

An embodiment wherein the ROP is connectorized.

An embodiment wherein the signal routing substrate (SRS) is configured for surface mount assembly.

An embodiment comprising a combination of any of the above described embodiments.

One skilled in the art will recognize that other embodiments are possible based on combinations of elements taught within the above invention description.

Generalized Computer Usable Medium

In various alternate embodiments, the present invention may be implemented as a computer program product for use with a computerized computing system. Those skilled in the art will readily appreciate that programs defining the functions defined by the present invention can be written in any appropriate programming language and delivered to a computer in many forms, including but not limited to: (a) information permanently stored on non-writeable storage media (e.g., read-only memory devices such as ROMs or CD-ROM disks); (b) information alterably stored on writeable storage media (e.g., floppy disks and hard drives); and/or (c) information conveyed to a computer through communication media, such as a local area network, a telephone network, or a public network such as the Internet. When carrying computer readable instructions that implement the present invention methods, such computer readable media represent alternate embodiments of the present invention.

As generally illustrated herein, the present invention system embodiments can incorporate a variety of computer readable media that comprise computer usable medium having computer readable code means embodied therein. One skilled in the art will recognize that the software associated with the various processes described herein can be embodied in a wide variety of computer accessible media from which the software is loaded and activated. Pursuant to In re Beauregard, 35 USPQ2d 1383 (U.S. Pat. No. 5,710,578), the present invention anticipates and includes this type of computer readable media within the scope of the invention. Pursuant to In re Nuijten, 500 F.3d 1346 (Fed. Cir. 2007) (U.S. patent application Ser. No. 09/211,928), the present invention scope is limited to computer readable media wherein the media is both tangible and non-transitory.

CONCLUSION

A system/method describing a physically compact broadband radio frequency (RF) splitter/combiner has been disclosed. The system and method provide an alternative to traditional broadband Wilkinson-style RF power splitter/combiners while reducing the overall size of the power divider/combiner to a significantly smaller form factor. The system and method utilize a serpentine impedance network (SIN) that incorporates a mirrored series of positive serpentine node (PSN) traces and negative serpentine node (NSN) traces. The PSN and NSN are coupled together within each isolated and mirrored SIN section with paired coupling traces (PCTs) located between the PSN and NSN traces that serve as both power transformers for the system and as an aid to impedance matching between the RF input port (RIP) and RF output ports (ROPs). The system is electrically symmetric and provides for power splitting and/or combining functionality between the RIP and ROPs.

CLAIMS INTERPRETATION

The following rules apply when interpreting the CLAIMS of the present invention:

The CLAIM PREAMBLE should be considered as limiting the scope of the claimed invention.

"WHEREIN" clauses should be considered as limiting the scope of the claimed invention.

"WHEREBY" clauses should be considered as limiting the scope of the claimed invention.

"ADAPTED TO" clauses should be considered as limiting the scope of the claimed invention.

"ADAPTED FOR" clauses should be considered as limiting the scope of the claimed invention.

The term "MEANS" specifically invokes the means-plus-function claims limitation recited in 35 U.S.C. §112(f) and such claim shall be construed to cover the corresponding structure, material, or acts described in the specification and equivalents thereof.

The phrase "MEANS FOR" specifically invokes the means-plus-function claims limitation recited in 35 U.S.C. §112(f) and such claim shall be construed to cover the corresponding structure, material, or acts described in the specification and equivalents thereof.

The phrase "STEP FOR" specifically invokes the step-plus-function claims limitation recited in 35 U.S.C. §112(f) and such claim shall be construed to cover the corresponding structure, material, or acts described in the specification and equivalents thereof.

The step-plus-function claims limitation recited in 35 U.S.C. §112(f) shall be construed to cover the corresponding structure, material, or acts described in the specification and equivalents thereof ONLY for such claims including the phrases "MEANS FOR", "MEANS", or "STEP FOR".

The phrase "AND/OR" in the context of an expression "X and/or Y" should be interpreted to define the set of "(X and Y)" in union with the set "(X or Y)" as interpreted by Ex Parte Gross (USPTO Patent Trial and Appeal Board, Appeal 2011-004811, Ser. No. 11/565,411, ("'and/or' covers embodiments having element A alone, B alone, or elements A and B taken together").

The claims presented herein are to be interpreted in light of the specification and drawings presented herein with sufficiently narrow scope such as to not preempt any abstract idea.

The claims presented herein are to be interpreted in light of the specification and drawings presented herein with sufficiently narrow scope such as to not preclude every application of any idea.

The claims presented herein are to be interpreted in light of the specification and drawings presented herein with sufficiently narrow scope such as to preclude any basic mental process that could be performed entirely in the human mind.

The claims presented herein are to be interpreted in light of the specification and drawings presented herein with sufficiently narrow scope such as to preclude any process that could be performed entirely by human manual effort.

What is claimed is:

1. A RF splitter/combiner system comprising:
(1) signal routing substrate (SRS);
(2) RF input port (RIP);
(3) RF output port (ROP); and
(4) serpentine impedance network (SIN);
wherein:
said SRS comprises a dielectric plate having a conducting bottom reference plane (BRP) and conducting signal traces comprising a top signal plane (TSP);
said TSP electrically couples said RIP, said SIN, and said ROP;
said RIP is configured to accept a RF signal input (RSI);
said RIP is configured to electrically couple said RSI to said SIN using an input passive electrical component (IPC);
said ROP comprises a first output port (FOP) and a second output port (SOP) each configured to emit a matched respective RF signal output (RSO) derived from said RSI;
said ROP is configured to electrically couple said SIN to said FOP and said SOP with a pair of output passive electrical components (OPC);

said SIN comprises a first serpentine impedance trace (FST) on said TSP and a second serpentine impedance traces (SST) on said TSP;

said FST and said SST are configured as mirrored structures about a common reference plane between said FST and said SST;

said FST and said SST each comprise a series of positive serpentine node (PSN) traces and negative serpentine node (NSN) traces;

said series of said PSN and said NSN comprise individually selected trace widths (ITW);

said FST and said SST incorporate a series of paired coupling traces (PCT) positioned between said PSN and said NSN on said FST and said SST respectively;

said NSN of said FST is electrically coupled to a corresponding mirrored NSN of said SST with a bridge passive electrical component (BPC);

said NSN of each FST is electrically coupled to said BRP with a first passive electrical component (FPC);

said NSN of each SST is electrically coupled to said BRP with a second passive electrical component (SPC); and said IPC, said OPC, said BPC, said FPC, said SPC, said PCT, and said ITW are selected to impedance match said RIP to said FOP and said SOP.

2. The RF splitter/combiner system of claim 1 wherein said SRS comprises a material selected from a group consisting of: FR-4 fiberglass resin (glass-reinforced epoxy laminate printed circuit board (PCB)); ROGERS CORPORATION model RT/DUROID® 5870 brand glass microfiber reinforced PTFE composite laminate; ROGERS CORPORATION model RT/DUROID® 5880 brand glass microfiber reinforced PTFE composite laminate; ROGERS CORPORATION model RT/DUROID® 6002 brand glass microfiber reinforced PTFE composite laminate; ROGERS CORPORATION model RT/DUROID® 6006 brand glass microfiber reinforced PTFE composite laminate; ROGERS CORPORATION model RT/DUROID® 6010 brand glass microfiber reinforced PTFE composite laminate; ROGERS CORPORATION series RO3000® model RO3003 brand PTFE/ceramic laminate; ROGERS CORPORATION series RO3000® model RO3006 brand PTFE/ceramic laminate; ROGERS CORPORATION series RO3000® model RO3010 brand PTFE/ceramic laminate; ROGERS CORPORATION model RO3203 brand woven glass laminate; ROGERS CORPORATION series RO3000® model RO3210 brand woven glass laminate; and polytetrafluoroethylene (PTFE).

3. The RF splitter/combiner system of claim 1 wherein said IPC comprises a circuit component selected from a group consisting of: a capacitor; and an inductor.

4. The RF splitter/combiner system of claim 1 wherein said OPC comprises a circuit component selected from a group consisting of: a capacitor; and an inductor.

5. The RF splitter/combiner system of claim 1 wherein said BPC comprises a resistor.

6. The RF splitter/combiner system of claim 1 wherein said FPC comprises a circuit component selected from a group consisting of: a capacitor; and an inductor.

7. The RF splitter/combiner system of claim 1 wherein said SPC comprises a circuit component selected from a group consisting of: a capacitor; and an inductor.

8. The RF splitter/combiner system of claim 1 wherein said IPC, said OPC, said BPC, said FPC, said SPC, said PCT, and said ITW are selected to impedance match said RIP, said FOP, and said SOP at 50 ohms.

9. The RF splitter/combiner system of claim 1 wherein said IPC, said OPC, said BPC, said FPC, said SPC, said PCT, and said ITW are selected to impedance match said RIP, said FOP, and said SOP at 75 ohms.

10. A 4-way RF splitter/combiner system comprising:
(a) first two-way RF splitter/combiner (FSC) as described in claim 1 having RIP, FOP, and SOP ports;
(b) second two-way RF splitter/combiner (SSC) as described in claim 1 having RIP, FOP, and SOP ports;
(c) third two-way RF splitter/combiner (TSC) as described in claim 1 having RIP, FOP, and SOP ports;
wherein:
said FOP port of said FSC is electrically coupled to said RIP port of said SSC;
said SOP port of said FSC is electrically coupled to said RIP port of said TSC; and
said FSC, said SSC, and said TSC are formed on a common substrate.

11. A RF splitter/combiner method comprising:
(1) forming a signal routing substrate (SRS) comprising a dielectric plate having a conducting bottom reference plane (BRP) and conducting signal traces comprising a top signal plane (TSP);
(2) forming a RF input port (RIP) on said TSP;
(3) forming a RF output port (ROP) on said TSP;
(4) forming a serpentine impedance network (SIN) on said TSP; and
(5) with said TSP, electrically coupling said RIP, said SIN, and said ROP;
wherein:
said RIP is configured to accept a RF signal input (RSI);
said RIP is configured to electrically couple said RSI to said SIN using an input passive electrical component (IPC);
said ROP comprises a first output port (FOP) and a second output port (SOP) each configured to emit a matched respective RF signal output (RSO) derived from said RSI;
said ROP is configured to electrically couple said SIN to said FOP and said SOP with a pair of output passive electrical components (OPC);
said SIN comprises a first serpentine impedance trace (FST) on said TSP and a second serpentine impedance traces (SST) on said TSP;
said FST and said SST are configured as mirrored structures about a common reference plane between said FST and said SST;
said FST and said SST each comprise a series of positive serpentine node (PSN) traces and negative serpentine node (NSN) traces;
said series of said PSN and said NSN comprise individually selected trace widths (ITW);
said FST and said SST incorporate a series of paired coupling traces (PCT) positioned between said PSN and said NSN on said FST and said SST respectively;
said NSN of said FST is electrically coupled to a corresponding mirrored NSN of said SST with a bridge passive electrical component (BPC);
said NSN of each FST is electrically coupled to said BRP with a first passive electrical component (FPC);
said NSN of each SST is electrically coupled to said BRP with a second passive electrical component (SPC); and
said IPC, said OPC, said BPC, said FPC, said SPC, said PCT, and said ITW are selected to impedance match said RIP to said FOP and said SOP.

12. The RF splitter/combiner method of claim 11 wherein said SRS comprises a material selected from a group consisting of: FR-4 fiberglass resin (glass-reinforced epoxy laminate printed circuit board (PCB)); ROGERS CORPO- RATION model RT/DUROID® 5870 brand glass microfiber reinforced PTFE composite laminate; ROGERS CORPORATION model RT/DUROID® 5880 brand glass microfiber reinforced PTFE composite laminate; ROGERS CORPORATION model RT/DUROID® 6002 brand glass microfiber reinforced PTFE composite laminate; ROGERS CORPORATION model RT/DUROID® 6006 brand glass microfiber reinforced PTFE composite laminate; ROGERS CORPORATION model RT/DUROID® 6010 brand glass microfiber reinforced PTFE composite laminate; ROGERS CORPORATION series RO3000® model RO3003 brand PTFE/ceramic laminate; ROGERS CORPORATION series RO3000® model RO3006 brand PTFE/ceramic laminate; ROGERS CORPORATION series RO3000® model RO3010 brand PTFE/ceramic laminate; ROGERS CORPORATION model RO3203 brand woven glass laminate; ROGERS CORPORATION series RO3000® model RO3210 brand woven glass laminate; and polytetrafluoroethylene (PTFE).

13. The RF splitter/combiner method of claim 11 wherein said IPC comprises a circuit component selected from a group consisting of: a capacitor; and an inductor.

14. The RF splitter/combiner method of claim 11 wherein said OPC comprises a circuit component selected from a group consisting of: a capacitor; and an inductor.

15. The RF splitter/combiner method of claim 11 wherein said BPC comprises a resistor.

16. The RF splitter/combiner method of claim 11 wherein said FPC comprises a circuit component selected from a group consisting of: a capacitor; and an inductor.

17. The RF splitter/combiner method of claim 11 wherein said SPC comprises a circuit component selected from a group consisting of: a capacitor; and an inductor.

18. The RF splitter/combiner method of claim 11 wherein said IPC, said OPC, said BPC, said FPC, said SPC, said PCT, and said ITW are selected to impedance match said RIP, said FOP, and said SOP at 50 ohms.

19. The RF splitter/combiner method of claim 11 wherein said IPC, said OPC, said BPC, said FPC, said SPC, said PCT, and said ITW are selected to impedance match said RIP, said FOP, and said SOP at 75 ohms.

20. A 4-way RF splitter/combiner method comprising:
(a) forming a first two-way RF splitter/combiner (FSC) as described in claim 11 having RIP, FOP, and SOP ports;
(b) forming a second two-way RF splitter/combiner (SSC) as described in claim 11 having RIP, FOP, and SOP ports;
(c) forming a third two-way RF splitter/combiner (TSC) as described in claim 11 having RIP, FOP, and SOP ports;
wherein:
said FOP port of said FSC is electrically coupled to said RIP port of said SSC;
said SOP port of said FSC is electrically coupled to said RIP port of said TSC; and
said FSC, said SSC, and said TSC are formed on a common substrate.

\* \* \* \* \*